(12) United States Patent
Rabkin et al.

(10) Patent No.: US 9,240,420 B2
(45) Date of Patent: Jan. 19, 2016

(54) 3D NON-VOLATILE STORAGE WITH WIDE BAND GAP TRANSISTOR DECODER

(71) Applicant: SanDisk Technologies Inc., Plano, TX (US)

(72) Inventors: Peter Rabkin, Cupertino, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 86 days.

(21) Appl. No.: 14/020,621

(22) Filed: Sep. 6, 2013

(65) Prior Publication Data

US 2015/0069377 A1 Mar. 12, 2015

(51) Int. Cl.
| | |
|---|---|
| *H01L 27/12* | (2006.01) |
| *H01L 27/115* | (2006.01) |
| *H01L 29/423* | (2006.01) |
| *H01L 29/786* | (2006.01) |

(52) U.S. Cl.
CPC ........ *H01L 27/1225* (2013.01); *H01L 27/1157* (2013.01); *H01L 27/11524* (2013.01); *H01L 27/11529* (2013.01); *H01L 27/11556* (2013.01); *H01L 27/11582* (2013.01); *H01L 27/1222* (2013.01); *H01L 27/1259* (2013.01); *H01L 29/42384* (2013.01); *H01L 29/7869* (2013.01); *H01L 29/78696* (2013.01)

(58) Field of Classification Search
CPC ............ H01L 27/1225; H01L 27/1259; H01L 27/11524; H01L 27/11529; H01L 27/11556; H01L 29/78696; H01L 29/7869; H01L 29/42384; H01L 27/1157; G11C 6/0483; G11C 6/06; G11C 6/08

USPC ............ 257/43, 314, 315, 316, 324, E21.014, 257/E21.68; 438/104, 211, 257; 365/185.01, 185.05, 185.17
See application file for complete search history.

(56) References Cited

U.S. PATENT DOCUMENTS

| | | | |
|---|---|---|---|
| 5,315,143 | A | 5/1994 | Tsuji |
| 5,442,215 | A | 8/1995 | Chae |

(Continued)

FOREIGN PATENT DOCUMENTS

| | | |
|---|---|---|
| EP | 0553774 A1 | 8/1993 |
| JP | 61-125174 A | 6/1986 |

(Continued)

OTHER PUBLICATIONS

Objections to International Preliminary Report on Patentability dated Dec. 18, 2014, European Patent Application No. 13717697.0.

(Continued)

*Primary Examiner* — Thinh T Nguyen
(74) *Attorney, Agent, or Firm* — Vierra Magen Marcus LLP

(57) ABSTRACT

Disclosed herein are 3D stacked memory devices having WL select gates that comprises TFTs having bodies formed from a wide band gap semiconductor. The wide energy band gap semiconductor may be an oxide semiconductor, such as a metal oxide semiconductor. As examples, this could be an InGaZnO, InZnO, HfInZnO, or ZnInSnO body. The word lines may be formed from metal, such as tungsten. The 3D stacked memory device could have NAND strings. The TFTs may be formed in the word line layer. The TFT has a high drive current, a high breakdown voltage and low leakage current.

21 Claims, 57 Drawing Sheets

(56) References Cited

U.S. PATENT DOCUMENTS

| | | | |
|---|---|---|---|
| 6,667,511 | B1 | 12/2003 | Fang |
| 6,917,532 | B2* | 7/2005 | Van Brocklin et al. ......... 365/51 |
| 7,061,014 | B2 | 6/2006 | Hosono et al. |
| 7,098,478 | B2 | 8/2006 | Takaura et al. |
| 7,132,685 | B2 | 11/2006 | Chen |
| 7,558,141 | B2 | 7/2009 | Katsumata et al. |
| 7,588,971 | B2 | 9/2009 | Wang et al. |
| 7,768,013 | B2 | 8/2010 | Kim et al. |
| 8,188,517 | B2 | 5/2012 | Choi |
| 8,363,452 | B2* | 1/2013 | Yamazaki et al. ............ 365/149 |
| 8,379,458 | B1 | 2/2013 | Or-Bach et al. |
| 8,385,105 | B2* | 2/2013 | Saito ............................ 365/149 |
| 8,395,942 | B2 | 3/2013 | Samachisa et al. |
| 8,486,791 | B2 | 7/2013 | Lue |
| 8,599,616 | B2 | 12/2013 | Roizin et al. |
| 8,649,219 | B2 | 2/2014 | Li et al. |
| 8,724,391 | B2 | 5/2014 | Nakamura et al. |
| 8,724,393 | B2 | 5/2014 | Lue et al. |
| 8,923,048 | B2* | 12/2014 | Rabkin et al. ............ 365/185.05 |
| 2003/0141505 | A1 | 7/2003 | Isobe et al. |
| 2004/0159868 | A1* | 8/2004 | Rinerson et al. ............. 257/295 |
| 2004/0178446 | A1 | 9/2004 | Sundaresan |
| 2005/0158970 | A1 | 7/2005 | Chau et al. |
| 2006/0145144 | A1 | 7/2006 | Lee et al. |
| 2007/0146008 | A1 | 6/2007 | Tak et al. |
| 2007/0278572 | A1 | 12/2007 | Ban et al. |
| 2008/0061370 | A1 | 3/2008 | Matsuo |
| 2008/0093595 | A1* | 4/2008 | Song et al. ...................... 257/43 |
| 2008/0212366 | A1 | 9/2008 | Ohsawa |
| 2008/0217678 | A1 | 9/2008 | Tan et al. |
| 2009/0268522 | A1 | 10/2009 | Maejima |
| 2009/0294751 | A1* | 12/2009 | Kiyotoshi ......................... 257/4 |
| 2009/0310415 | A1 | 12/2009 | Jin et al. |
| 2009/0310425 | A1 | 12/2009 | Sim et al. |
| 2009/0316492 | A1 | 12/2009 | Widjaja |
| 2010/0006922 | A1 | 1/2010 | Matsuoka et al. |
| 2011/0101356 | A1* | 5/2011 | Yamazaki ....................... 257/59 |
| 2011/0194332 | A1* | 8/2011 | Saito ............................ 365/149 |
| 2011/0233681 | A1 | 9/2011 | Matsuo |
| 2011/0291172 | A1 | 12/2011 | Hwang et al. |
| 2012/0147644 | A1* | 6/2012 | Scheuerlein ..................... 365/51 |
| 2012/0175581 | A1 | 7/2012 | Hwang |
| 2012/0181534 | A1 | 7/2012 | Hatano |
| 2013/0228839 | A1 | 9/2013 | Arai |

FOREIGN PATENT DOCUMENTS

| | | |
|---|---|---|
| JP | 2-206173 A | 8/1990 |
| JP | 2002009289 A | 1/2002 |
| WO | 03040441 A1 | 5/2003 |
| WO | 2005088727 A1 | 9/2005 |

OTHER PUBLICATIONS

Non-final Office Action dated Jan. 22, 2015, U.S. Appl. No. 14/543,342, filed Nov. 17, 2014.
Response to Office Action dated Feb. 6, 2015, U.S. Appl. No. 13/733,046, filed Jan. 2, 2013.
Response to Office Action dated Feb. 6, 2015, U.S. Appl. No. 14/020,647, filed Sep. 6, 2013.
Office Action dated Mar. 10, 2014, U.S. Appl. No. 13/733,039, filed Jan. 2, 2013, 20 pages.
Notice of Allowance dated Apr. 7, 2015, U.S. Appl. No. 14/020,647, filed Sep. 6, 2013.
Response to Office Action dated Apr. 13, 2015, U.S. Appl. No. 14/543,342, filed Nov. 17, 2014.
International Search Report & The Written Opinion of the International Searching Authority dated Apr. 14, 2015, International Application No. PCT/US2014/054076.
Supplemental Amendment dated Apr. 27, 2015, U.S. Appl. No. 13/733,046, filed Jan. 2, 2013.
Notice of Allowance dated May 1, 2015, U.S. Appl. No. 14/543,342, filed Nov. 17, 2014.
Notice of Allowance dated May 8, 2015, U.S. Appl. No. 13/733,046, filed Jan. 2, 2013.
Restriction Requirement for U.S. Appl. No. 13/733,046, filed Jan. 2, 2013, mailed Apr. 21, 2014.
Response to Office Action mailed Mar. 10, 2014 for U.S. Appl. No. 13/733,039, filed Jan. 2, 2013, filed Jun. 9, 2014.
Response to Restriction Requirement mailed Apr. 21, 2014, for U.S. Appl. No. 13/733,046, filed Jan. 2, 2013, filed Jun. 20, 2014.
Notice of Allowance for U.S. Appl. No. 13/733,039, filed Jan. 2, 2013, mailed Jun. 25, 2014.
Ex Parte Quayle Action for U.S. Appl. No. 13/733,030, filed Jan. 2, 2013, mailed May 30, 2014.
Restriction Requirement for U.S. Appl. No. 14/020,647, filed Sep. 6, 2013, mailed Jul. 17, 2014.
Hung et al., "A Highly Scalable Vertical Gate (VG) 3D NAND Flash with Robust Program Disturb Immunity Using a Novel PN Diode Decoding Structure," 2011 Symposium on VLSI Technology Digest of Technical Papers, Jun. 2011, pp. 68-69, 2 pages.
Kalkofen et al., "A simple two-step phosphorus doping process for shallow junctions by applying a controlled adsorption and diffusion in an oxidising ambient," Materials Science and Engineering, Symposium B, Dec. 2004, pp. 362-366, vols. 114-115, Elsevier B.V., 5 pages.
Mazzocchi et al., "Boron and Phosphorus dopant activation in germanium using Laser annealing with and without preamorphization implant," 17th IEEE International Conference on Advanced Thermal Processing of Semiconductors, RTP 2009, Sep. 29-Oct. 2, 2009, 5 pages.
Paviet-Salomon et al., "Experimental and analytical study of saturation current density of laser-doped phosphorus emitters for silicon solar cells," Solar Energy Materials & Solar Cells, Aug. 2011, pp. 2536-2539, vol. 95, Issue 8, Elsevier B.V., 4 pages.
International Search Report and Written Opinion of the International Searching Authority dated Jun. 28, 2013, PCT Application No. PCT/US2013/036213, filed Apr. 11, 2013, 10 pages.
Lee et al., "Low-temperature polysilicon TFT with counter-doped lateral body terminal", Electronics Letter, IEE Stevenage, GB, vol. 38, No. 5, Feb. 28, 2002, pp. 255-256, 2 pages.
Kaneko et al., "Highly Reliable BEOL-Transistor with Oxygen-controlled InGaZnO and Gate/Drain Offset Design for High/Low Voltage Bridging I/O Operations", Electron Devices Meeting (IEDM), 2011 IEEE International, Dec. 2011, pp. 7.4.1-7.4.4, 4 pages.
Park et al., "High performance amorphous oxide thin film transistors with self-aligned top-gate structure", Electron Devices Meeting (IEDM), 2009 IEEE International, Dec. 2009, pp. 8.4.1-8.4.4, 4 pages.
Hosono, Hideo, "High Performance Thin-film Transistor (TFT) with Amorphous InGaZnO4 Semiconductor", published date unknown, 1 page.
Kaneko, et al., "A Novel BEOL Transistor (BETr) with InGaZnO Embedded in Cu-Interconnects for On-chip High Voltage I/Os in Standard CMOS LSTs", 2011 Symposium on VLSI Technology (VLSIT), Jun. 2011, pp. 120-121, 2 pages.
Noh, et al., "A New Metal Control Gate Last Process (MCGL process) for High Performance DC-SF (Dual Control gate with Surrounding Floating gate) 3D NAND Flash Memory", 2012 Symposium on VLSI Technology Digest of Technical Papers, Jun. 2012, pp. 19-20, 2 pages.
Jang, et al., "Vertical Cell Array using TCAT(Terabit Cell Array Transistor) Technology for Ultra High Density NAND Flash Memory", 2009 Symposium on VLSI Technology Digest of Technical Papers, Jun. 2009, pp. 192-193, 2 pages.
Kaneko, et al., "Operation of Functional Circuit Elements using BEOL-Transistor with InGaZnO Channel for On-chip High/Low Voltage Bridging I/Os and High-Current Switches", 2012 Symposium on VLSI Technology Digest of Technical Papers, Jun. 2012, pp. 123-124, 2 pages.
Fobelets et al., "A novel 3D embedded gate filed effect transistor—Screen-grid FET-Device concept and modelling", Solid State Electronics, Elsevier Science Publishers, Barking, GB, May 2007, vol. 51, No. 5, 8 pages.
Wu et al., "Stacked 3-D Fin-CMOS Technology", IEEE Electron Device Leters, IEEE Service, Jun. 1, 2005, vol. 26, No. 6, 3 pages.

(56) References Cited

OTHER PUBLICATIONS

International Search Report and Written Opinion of the International Searching Authority dated Jun. 28, 2013, PCT Application No. PCT/US2013/036208, filed Apr. 11, 2013, 9 pages.
International Search Report and Written Opinion of the International Searching Authority dated Jun. 21, 2013, PCT Application No. PCT/US2013/036217, filed Apr. 11, 2013, 12 pages.
English Abstract of Foreign Patent Reference JP 2-206173, Published Aug. 15, 1990, Applicant NEC Corp, 1 page.
English Abstract of Foreign Patent Reference JP 61-125174, Published Jun. 12, 1986, Applicant Agency Ind Science Techn, 1 page.
English Abstract of Foreign Patent Reference JP 2002009289, Published Jan. 11, 2002, Applicant NEC Corp, 1 page.
Tsai et al., "Influence of positive bias stress on N2O plasma improved InGaZnO thin film transistor", Applied Physics Letters, vol. 96, Issue 242105, American Institute of Physics, Mar. 2010, 3 pages.
Chen, et al. "Bias-induced oxygen adsorption in zinc tin oxide thin film transistors under dynamic stress", Applied Physics Letters, vol. 96, Issue 262104, American Institute of Physics, May 2010, 3 pages.
Chen et al., "Light-induced instability of an InGaZnO thin film transistor with and without SiOx passivation layer formed by plasma-enhanced-chemical-vapor-deposition", Applied Physics Letters, vol. 97, Issue 192103, American Institute of Physics, Sep. 2010, 3 pages.
U.S. Appl. No. 13/733,030, filed Jan. 2, 2013.
U.S. Appl. No. 13/733,039, filed Jan. 2, 2013.
U.S. Appl. No. 13/733,046, filed Jan. 2, 2013.
U.S. Appl. No. 14/020,647, filed Sep. 6, 2013.
Response to Ex parte Quayle mailed May 30, 2014 for U.S. Appl. No. 13/733,030, filed Jul. 29, 2014.
Notice of Allowance mailed Aug. 7, 2014 for U.S. Appl. No. 13/733,030.
Office Action mailed Aug. 18, 2014 for U.S. Appl. No. 13/733,046.
Response to Restriction Requirement for U.S. Appl. No. 14/020,647, filed Sep. 10, 2014.
International Preliminary Report on Patentability dated Oct. 14, 2014, International Application No. PCT/US2013/036208.
International Preliminary Report on Patentability dated Oct. 14, 2014, International Application No. PCT/US2013/036213.
International Preliminary Report on Patentability dated Oct. 14, 2014, International Application No. PCT/US2013/036217.
Response to Office Action dated Nov. 3, 2014, U.S. Appl. No. 13/733,046, filed Jan. 2, 2013.
U.S. Appl. No. 14/543,342, filed Nov. 17, 2014.
Invitation to Pay Additional Fees dated Nov. 28, 2014, International Application No. PCT/US2014/054076.
Final Office Action dated Dec. 3, 2014, U.S. Appl. No. 13/733,046, filed Jan. 2, 2013.
Non-final Office Action dated Nov. 28, 2014, U.S. Appl. No. 14/020,647, filed Sep. 6, 2013.
Objections to International Preliminary Report on Patentability dated Nov. 28, 2014, European Patent Application No. 13717152.6.
U.S. Appl. No. 14/799,876, filed Jul. 15, 2015.
Response to Office Action dated Jun. 8, 2015, European Patent Application No. 13717152.6.
U.S. Appl. No. 14/793,167, filed Jul. 7, 2015.

* cited by examiner

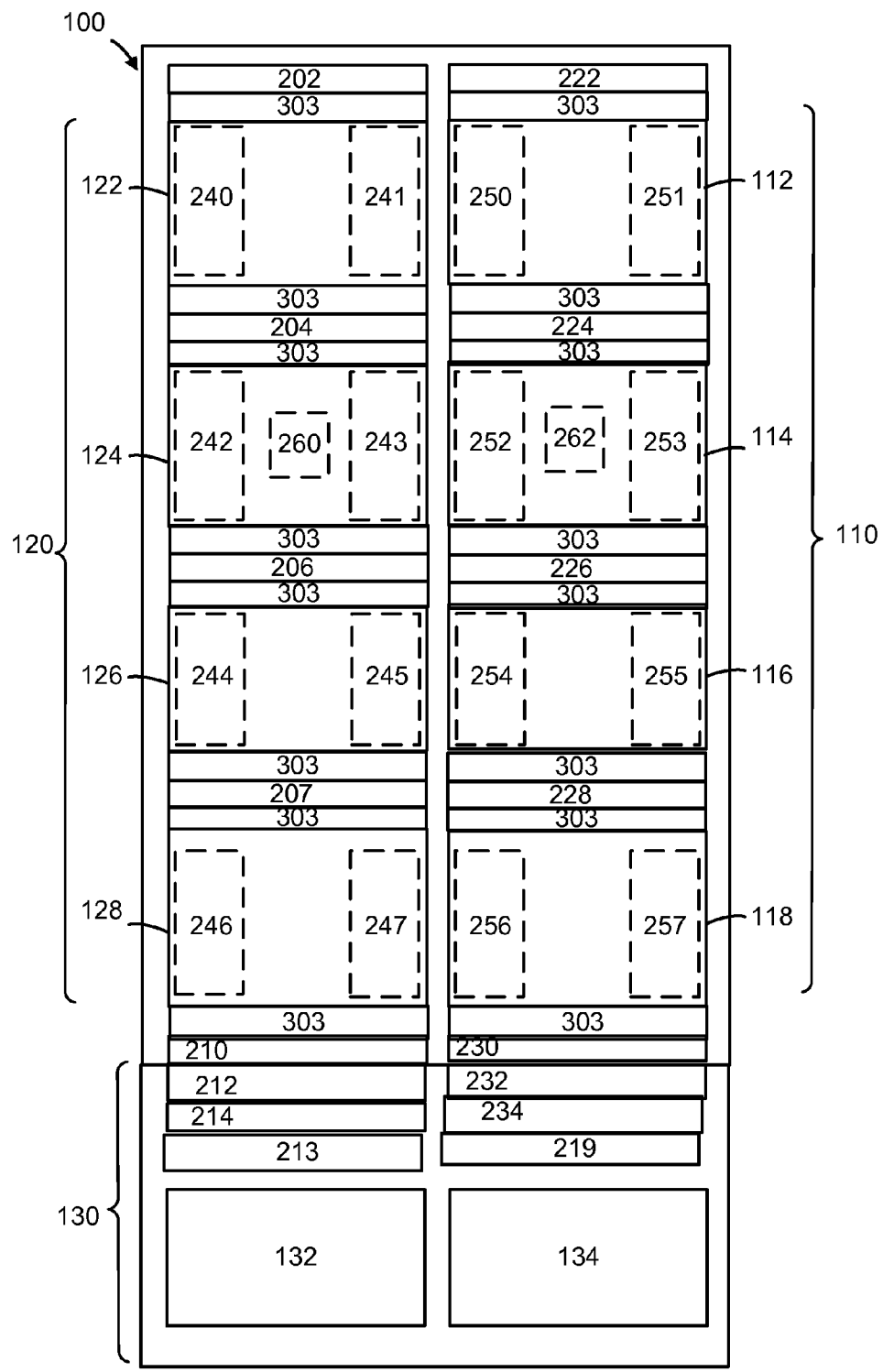

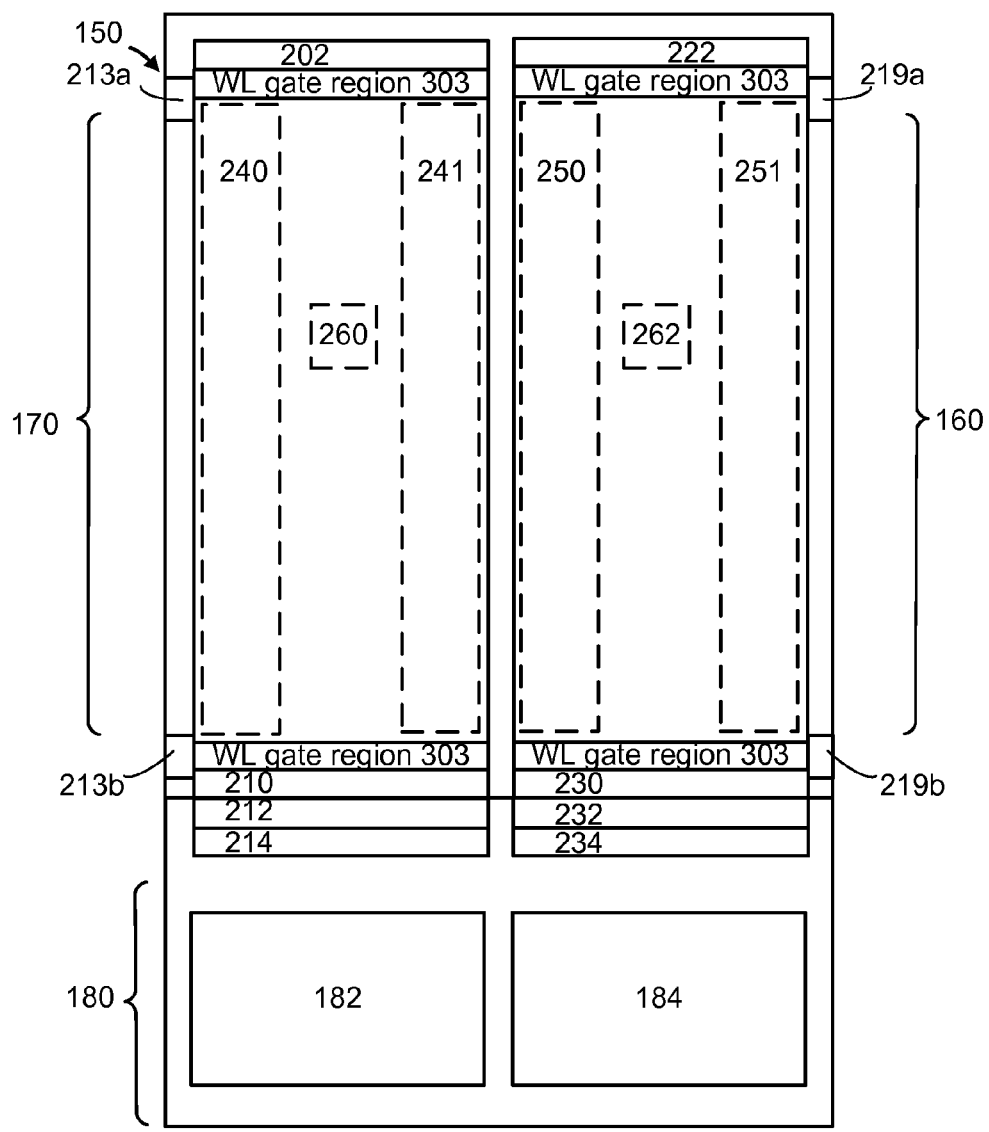

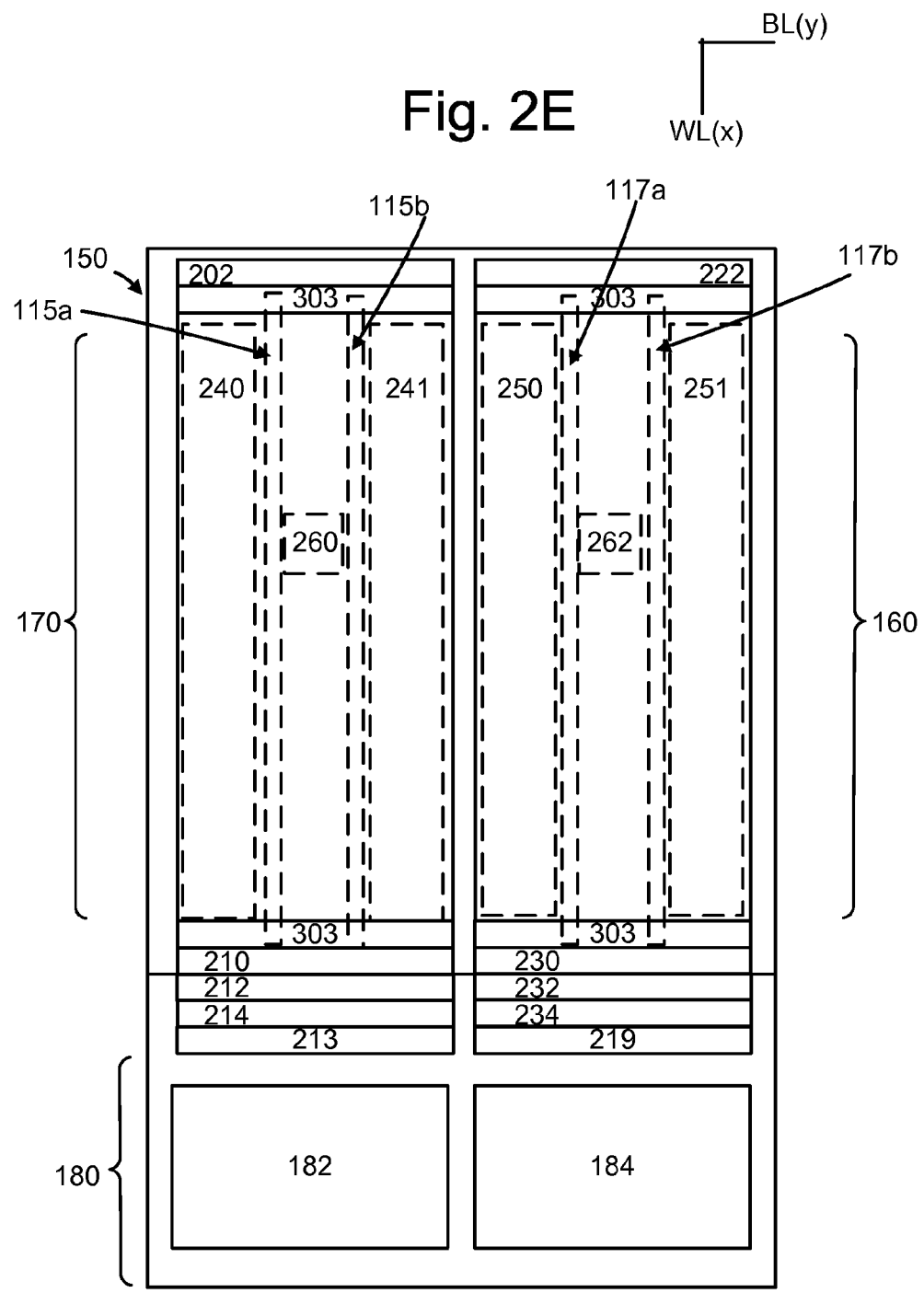

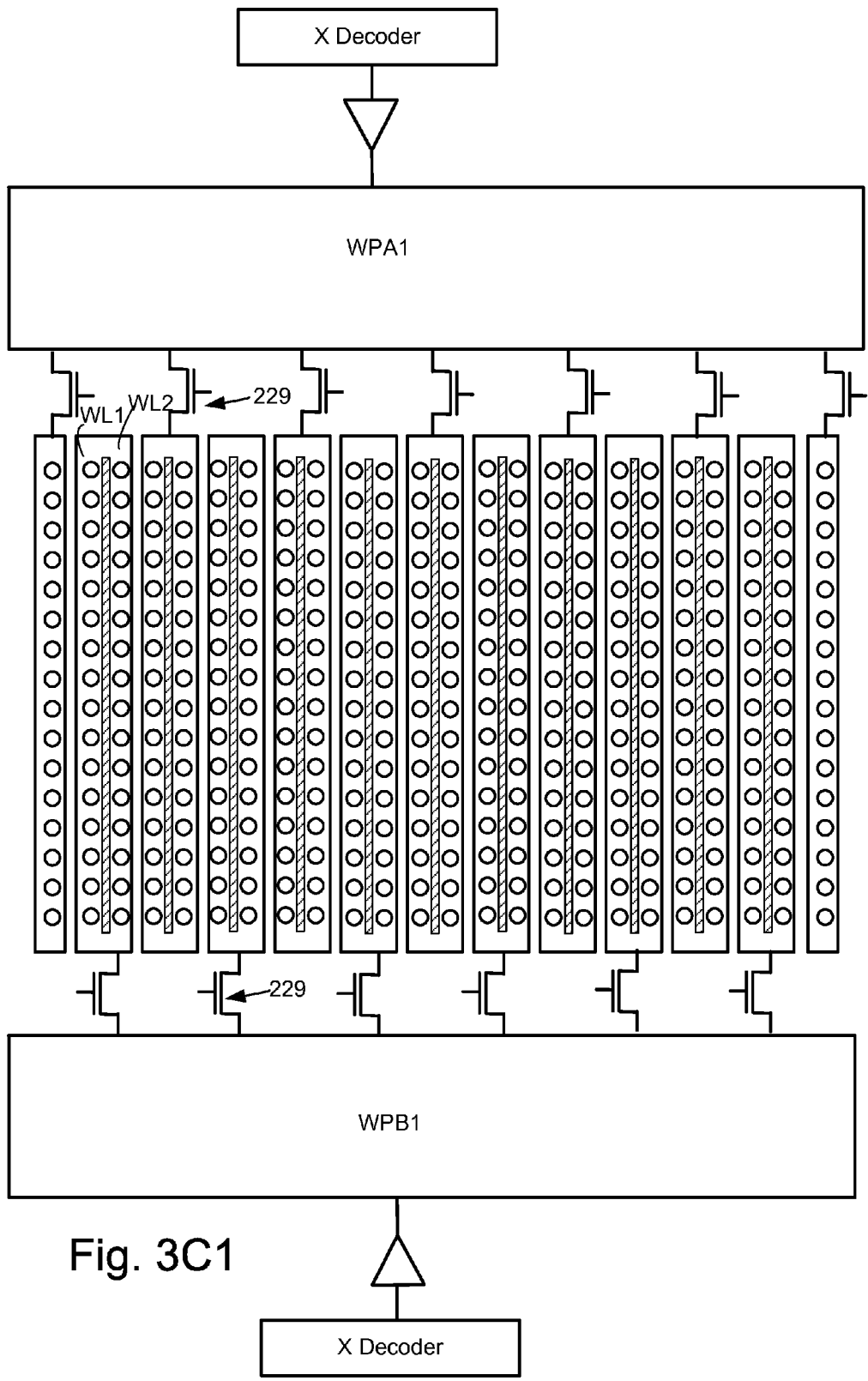
Fig. 3C1

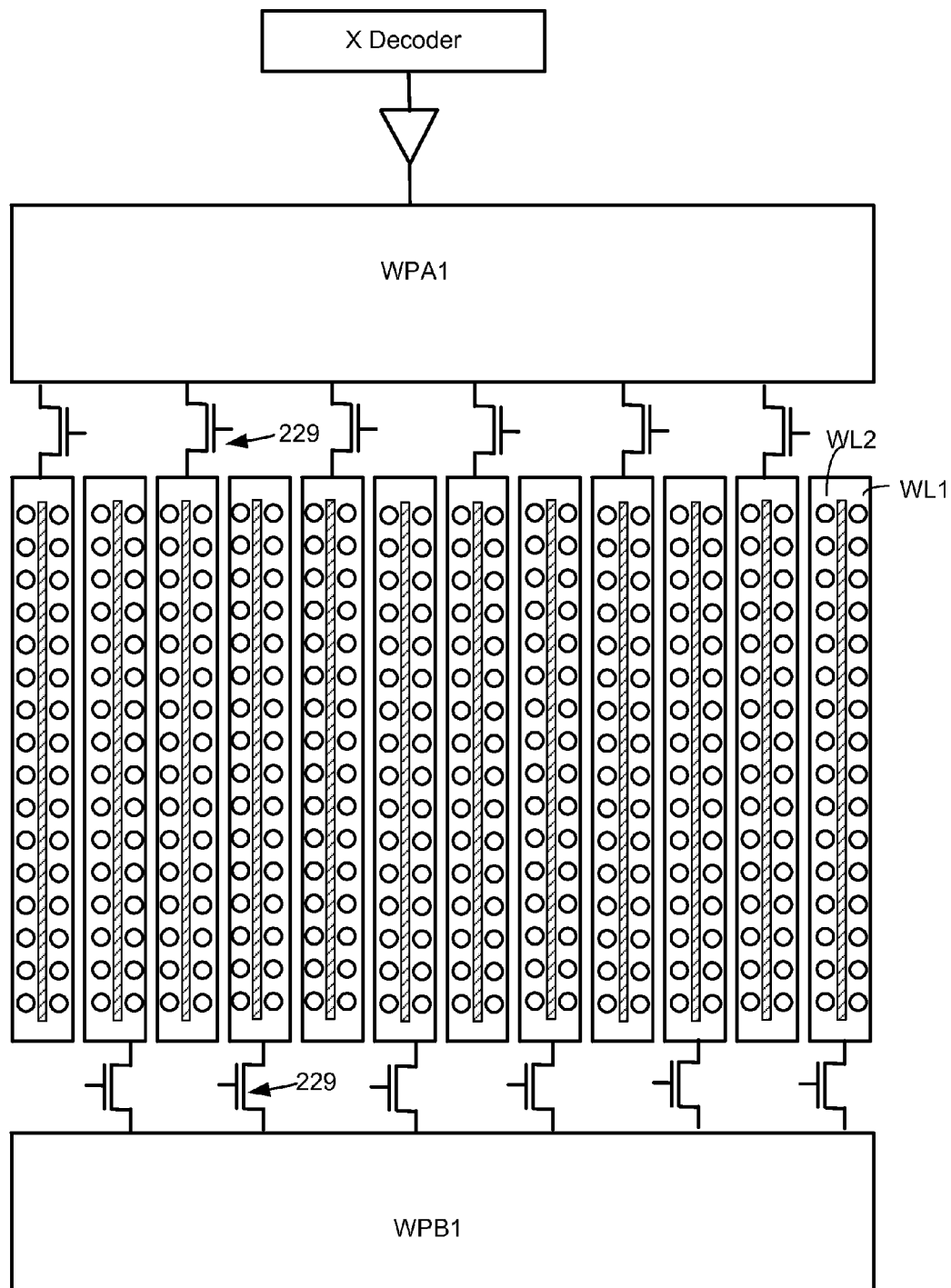
Fig. 3C2

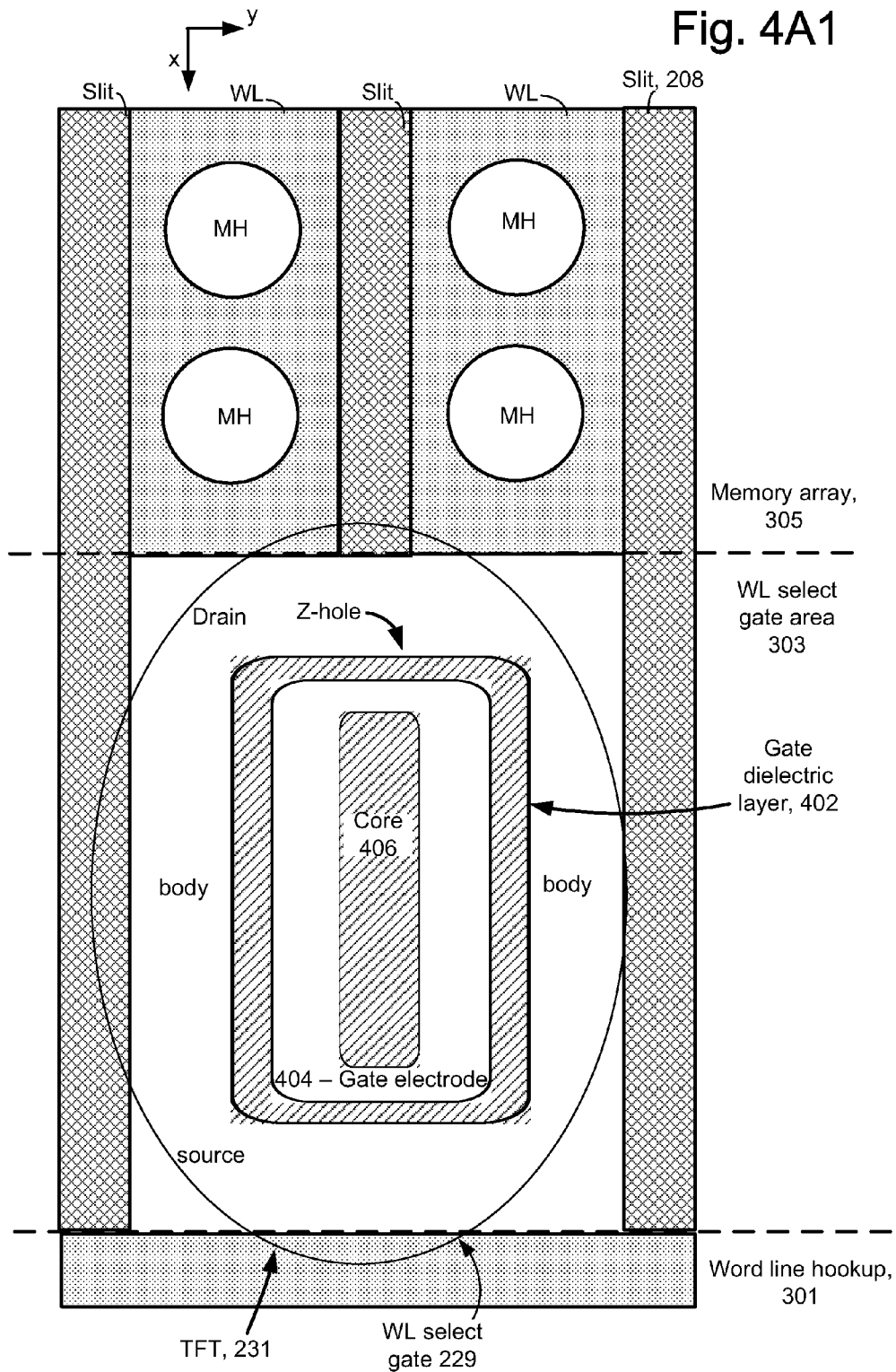

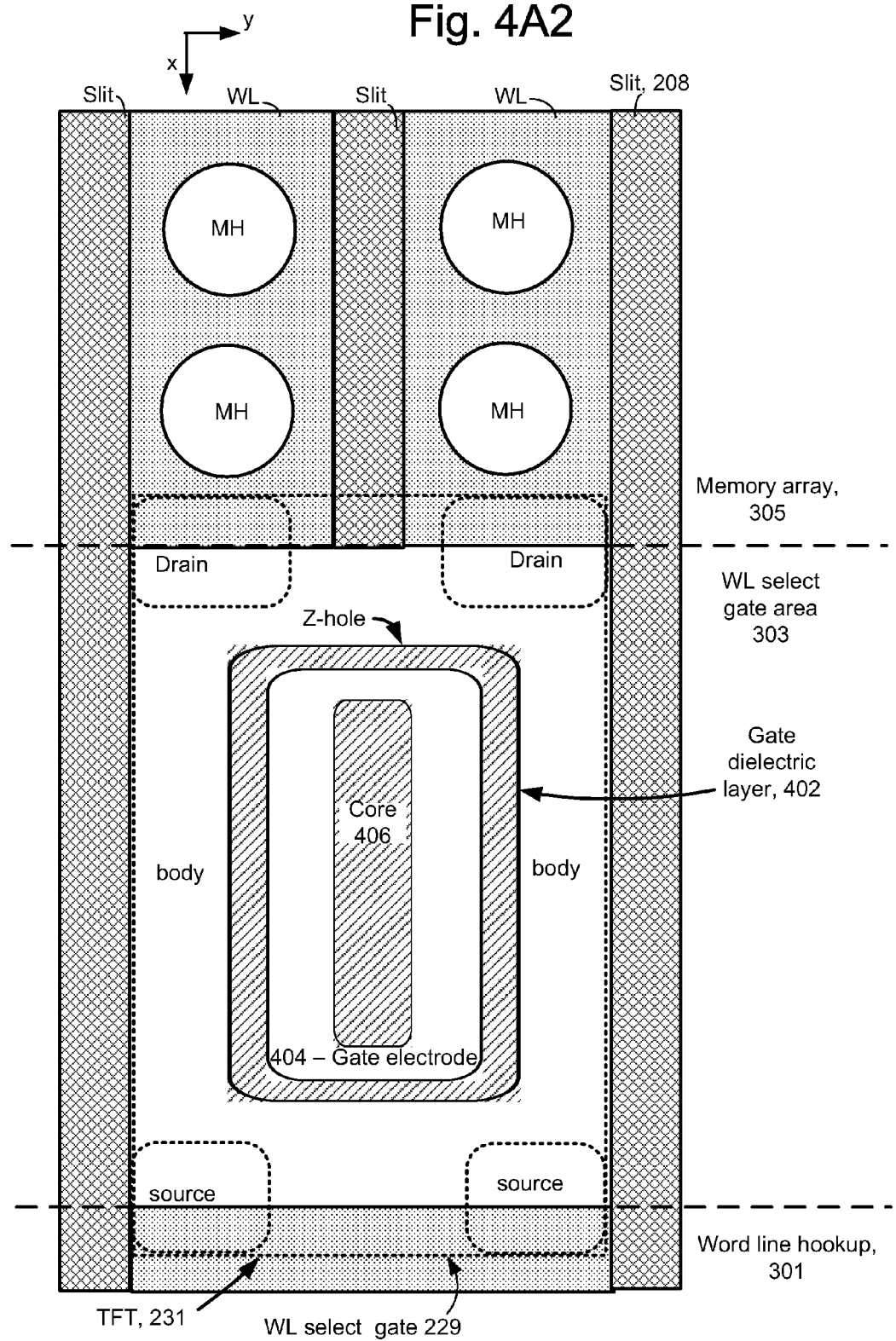
Fig. 4A2

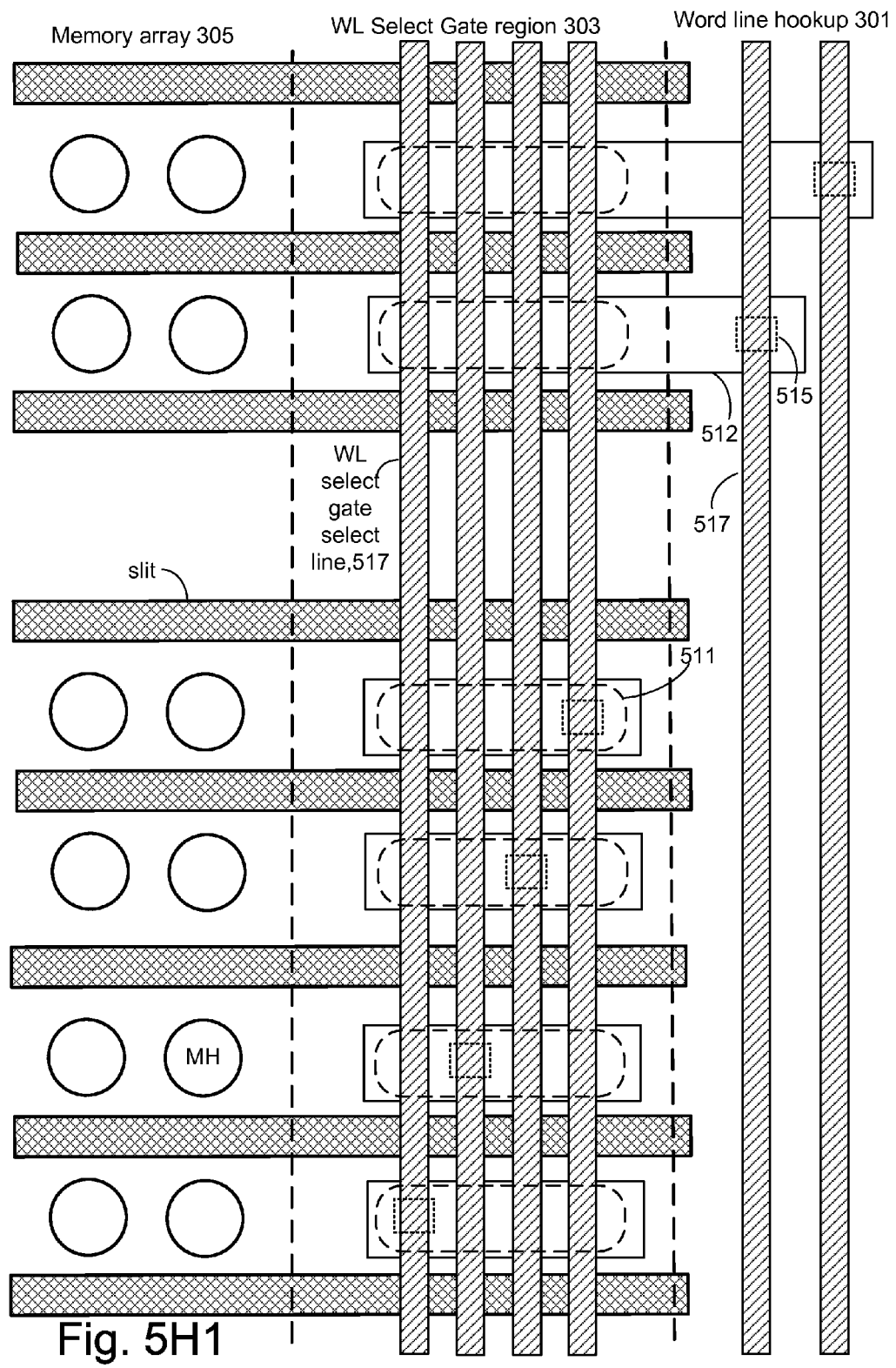
Fig. 5H1

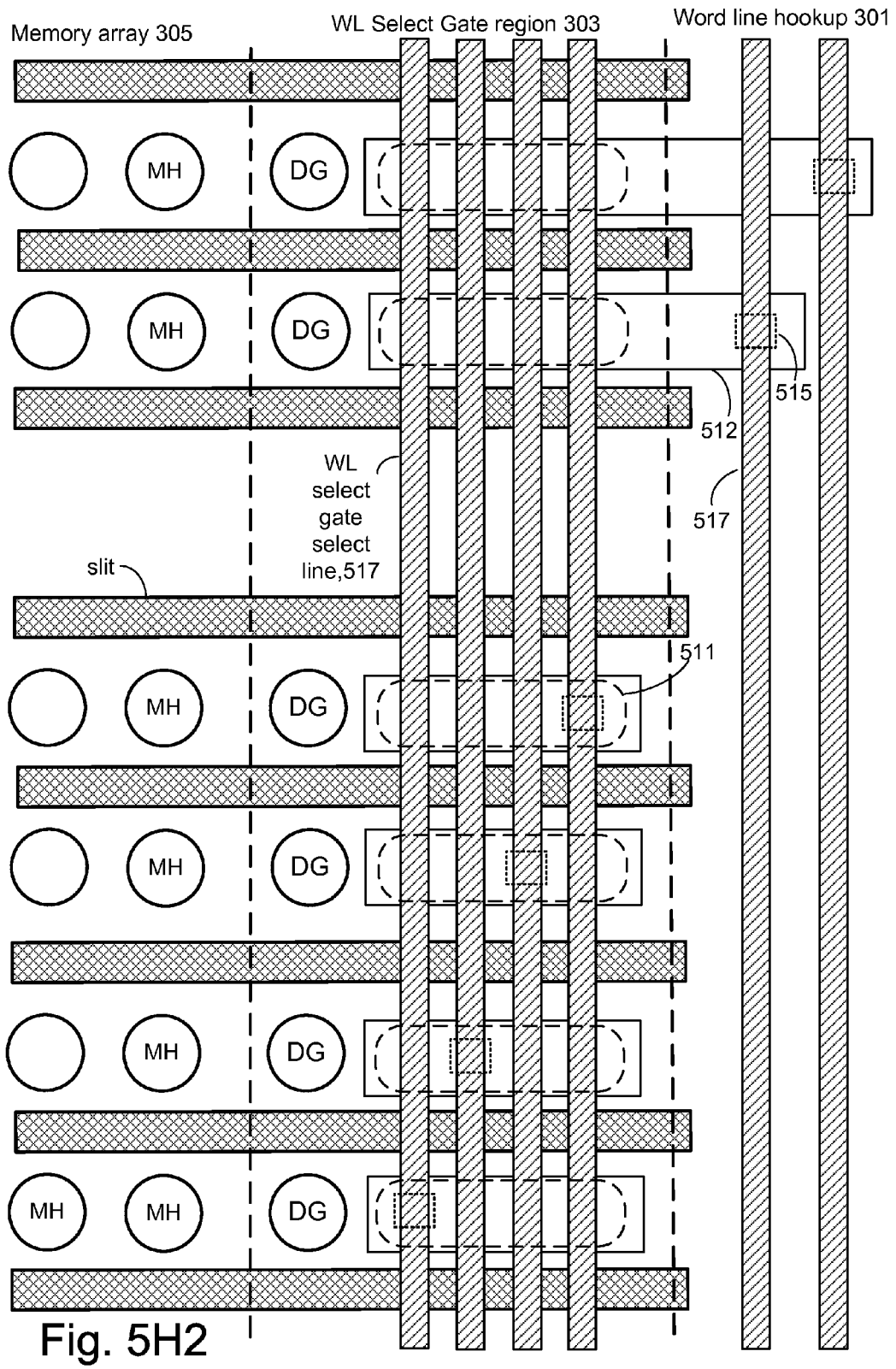
Fig. 5H2

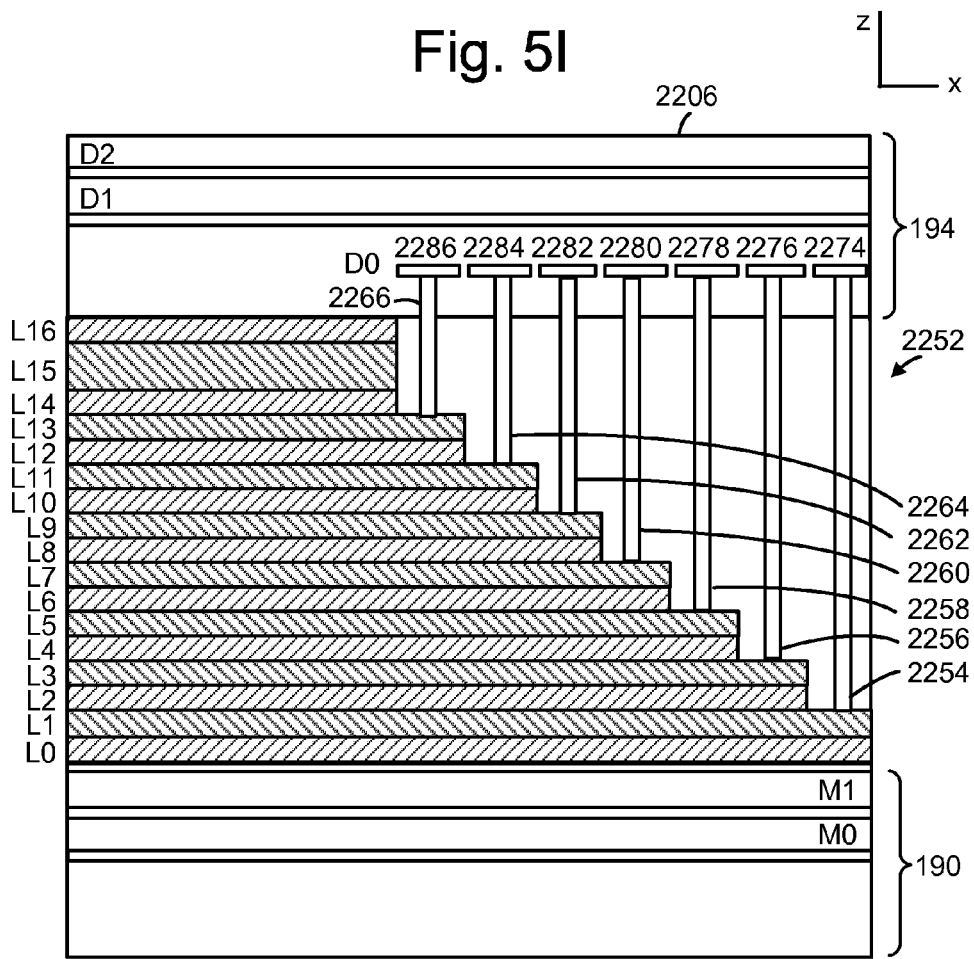

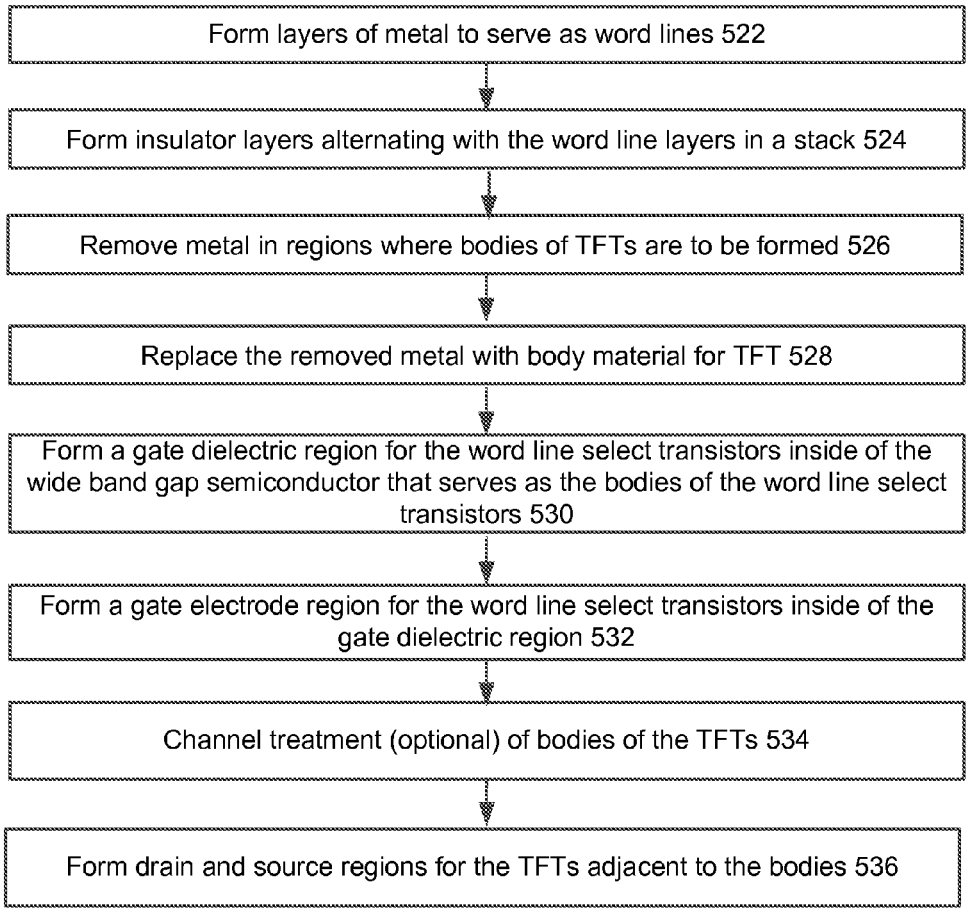
Fig. 5L1
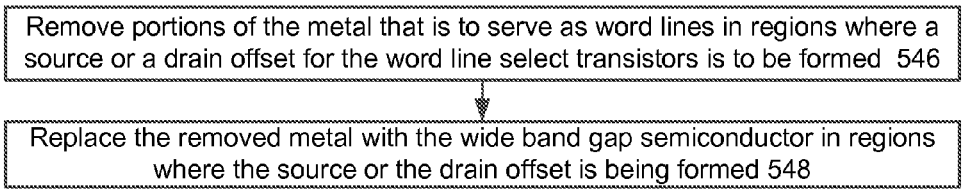
Fig. 5L2

Fig. 8A
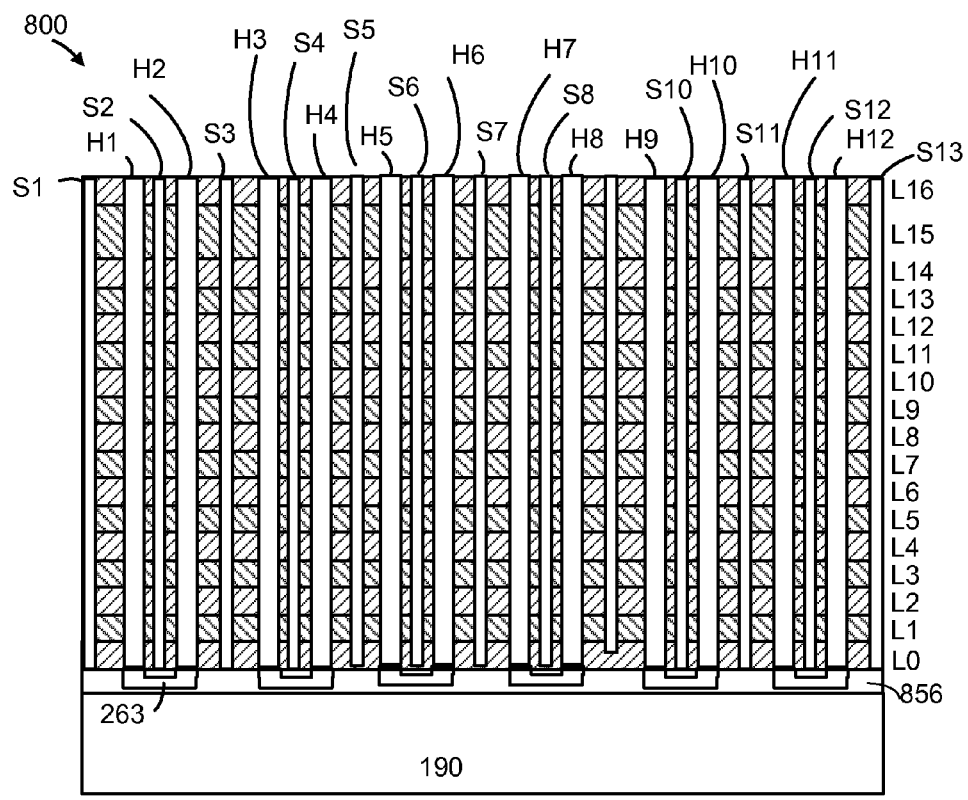
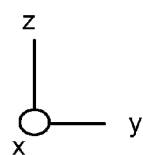

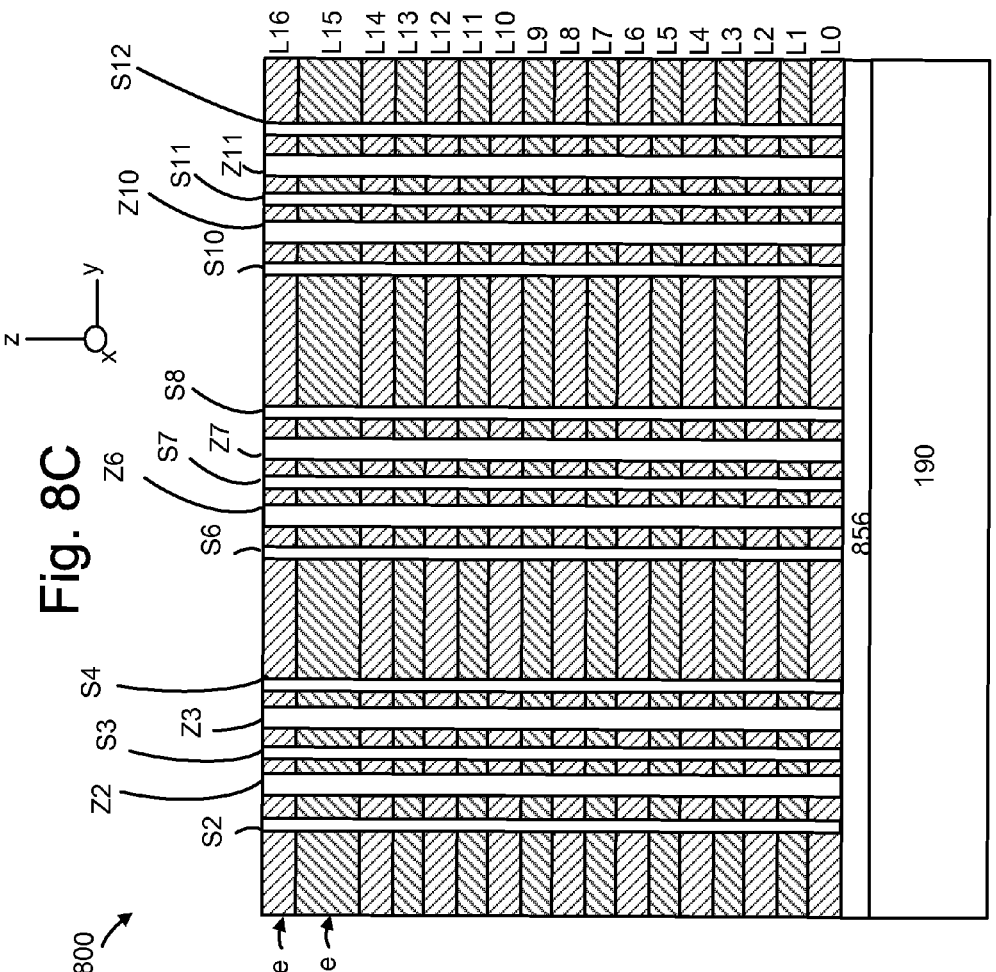
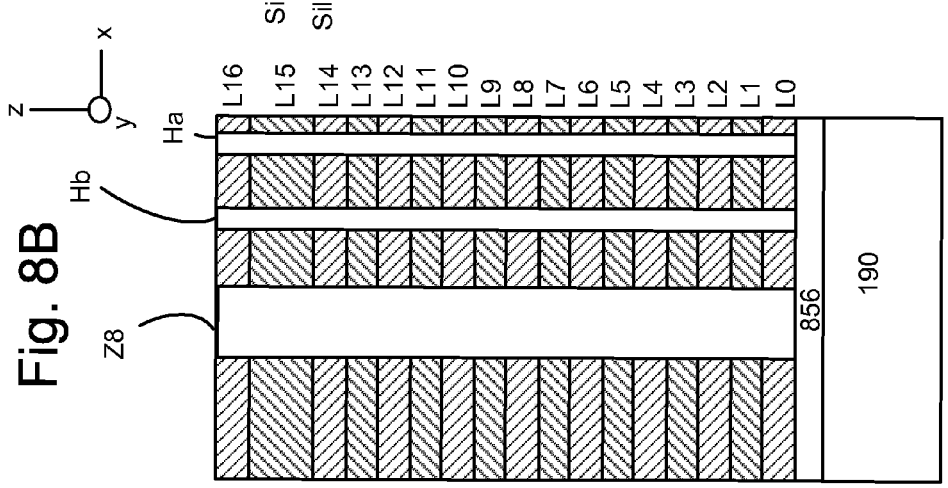

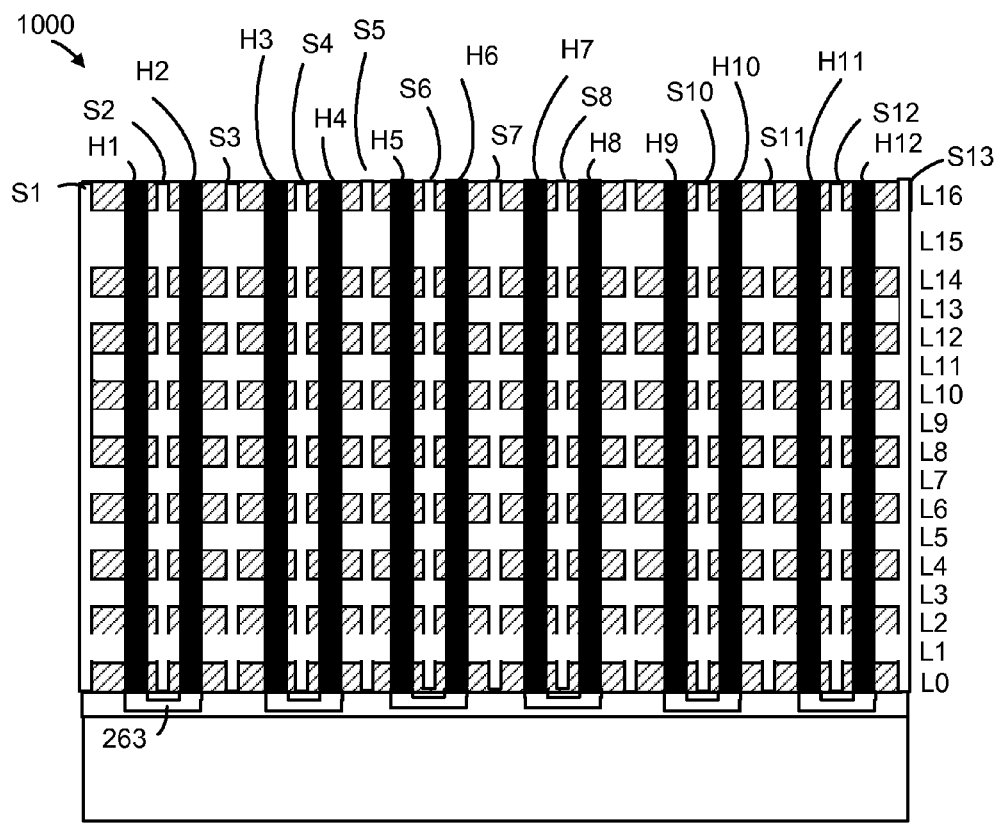
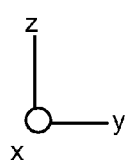
Fig. 10A

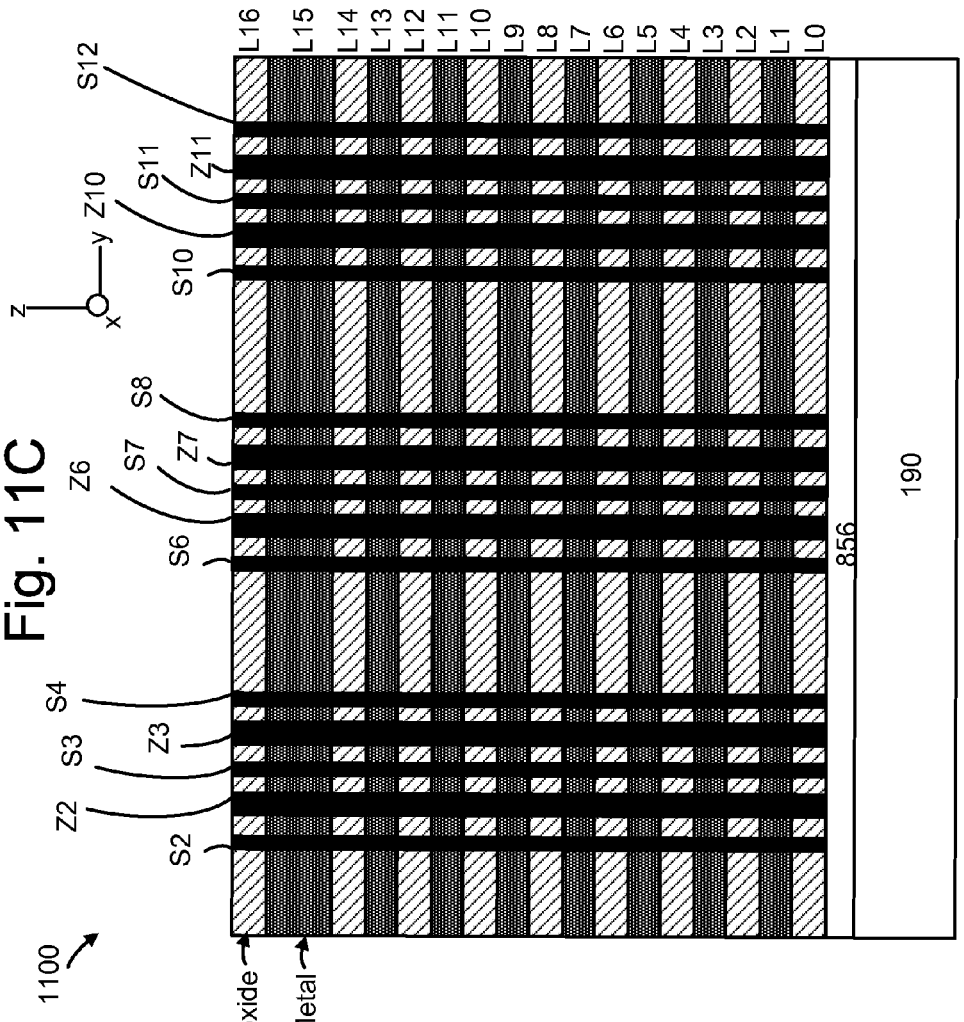
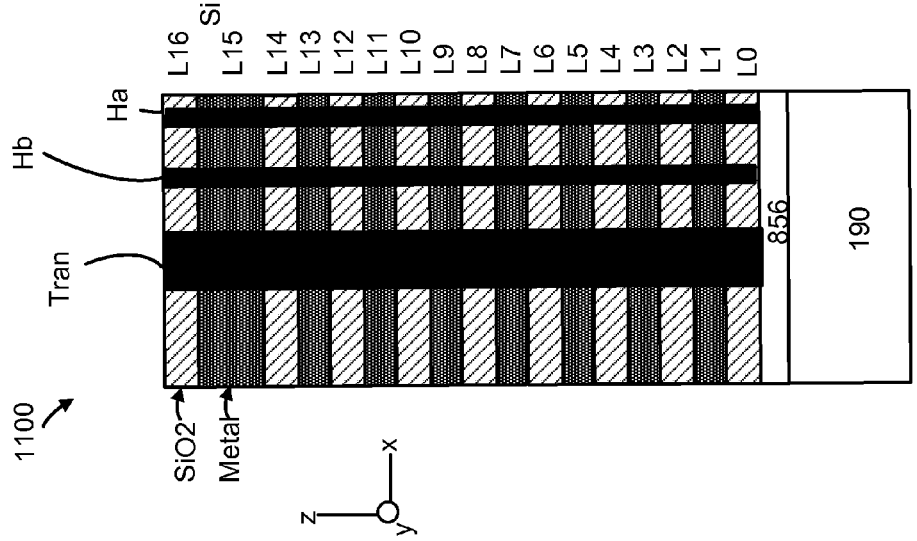

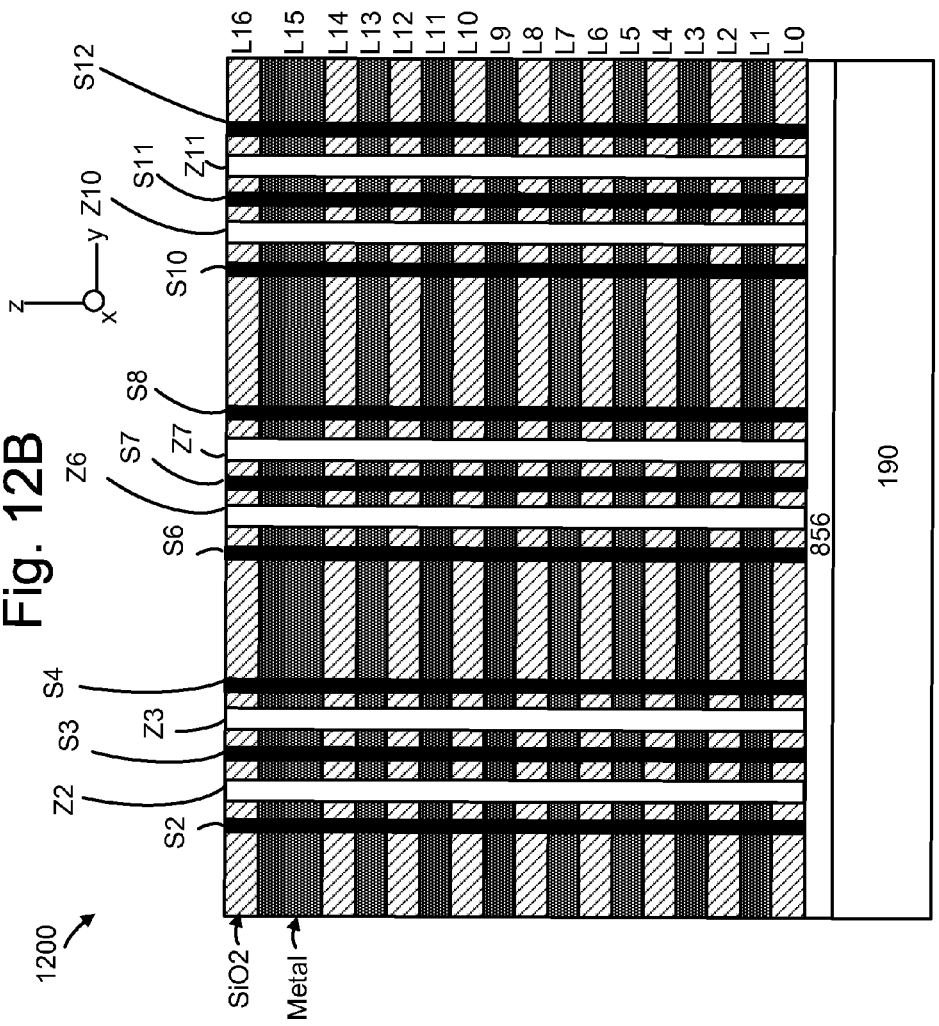
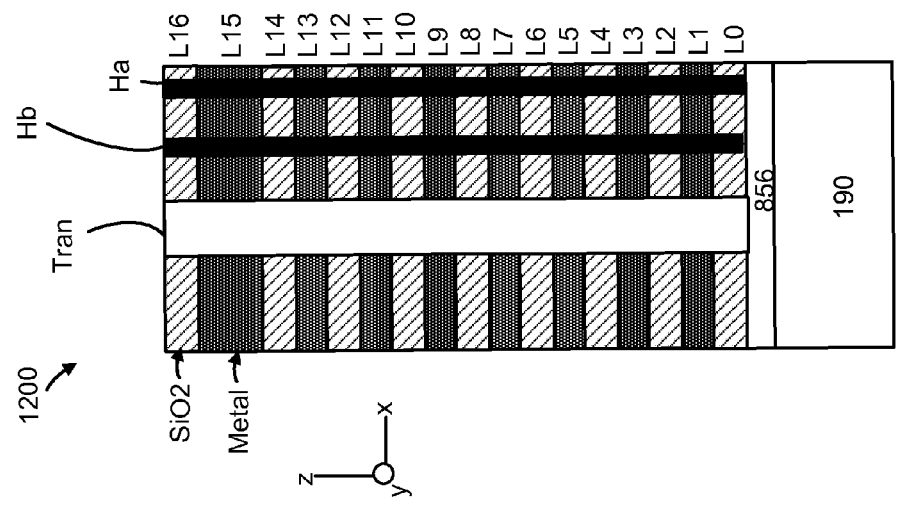

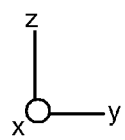
Fig. 16A
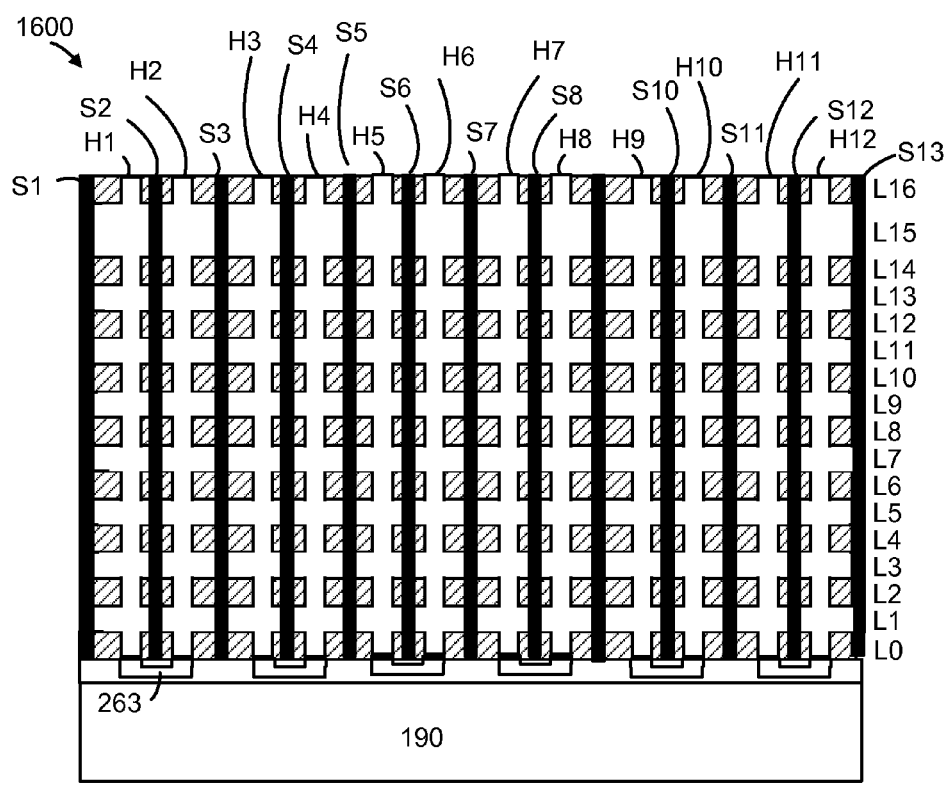

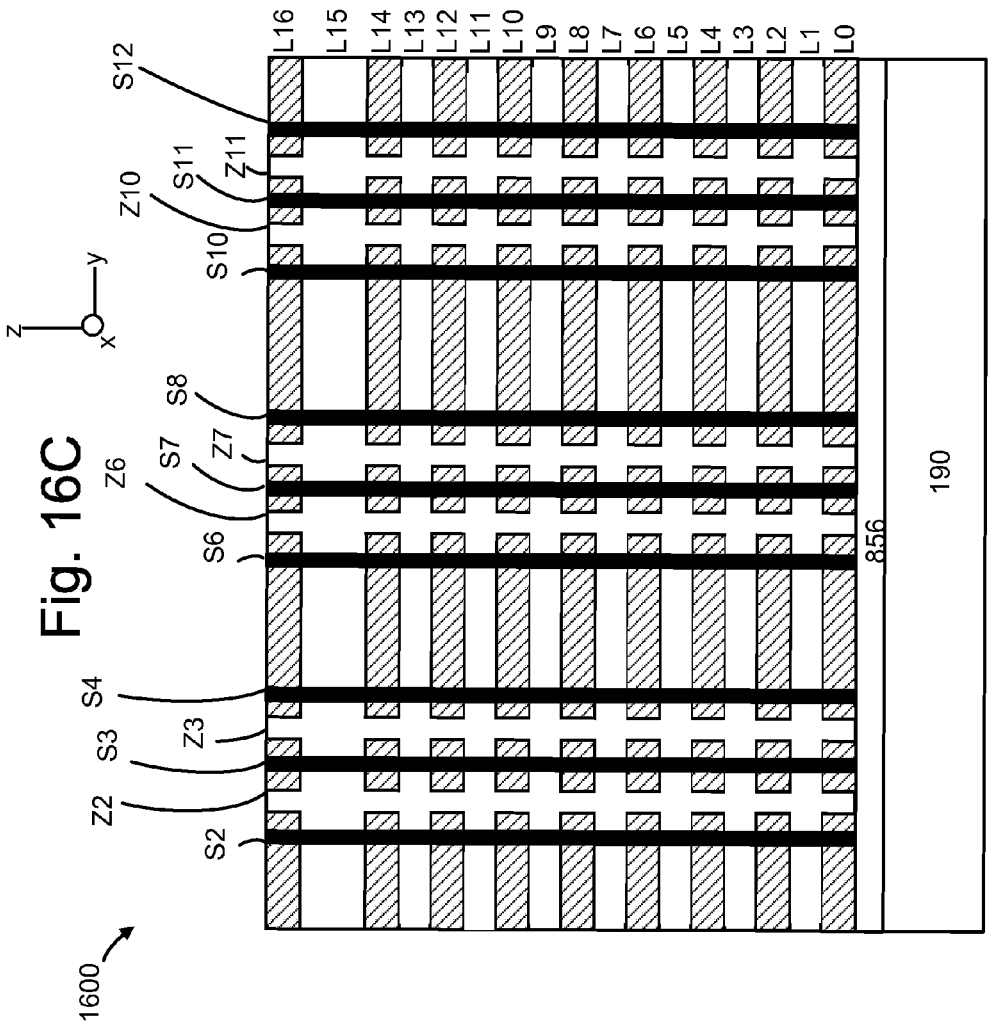
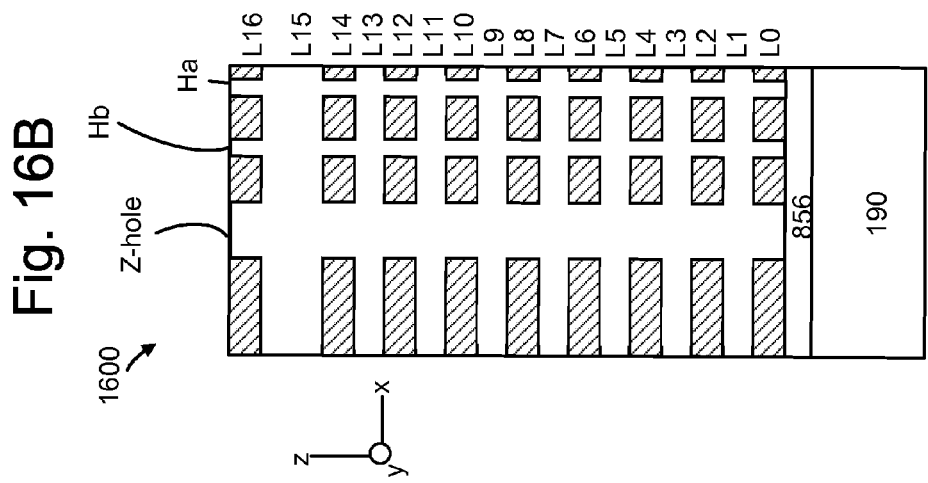

3D NON-VOLATILE STORAGE WITH WIDE BAND GAP TRANSISTOR DECODER

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

BRIEF DESCRIPTION OF THE DRAWINGS

Like-numbered elements refer to common components in the different figures.

FIG. 2A depicts a top view of the 3D stacked non-volatile memory device 100 of FIG. 1A.

FIG. 2D is an example in which the plane is not divided into sub-arrays similar to FIG. 2C.

FIG. 2E depicts a top view of the 3D stacked non-volatile memory device 150 of FIG. 1B.

FIG. 3C1 is a schematic illustration of the block of FIG. 3A.

FIG. 3C2 depicts a configuration in which all of the word line select gates couple to and select a pair of word lines.

FIG. 4A1 is a diagram of one embodiment of WL select gates in a WL select gate region between a memory array and a word line hookup area.

FIG. 4A2 is a diagram of one embodiment of WL select gates in a WL select gate region between a memory array and a word line hookup area.

FIG. 5H1 shows further details of one embodiment of forming contacts from select lines to WL select gates.

FIG. 5H2 shows further details of one embodiment of forming contacts from select lines to WL select gates having asymmetrical TFTs.

FIG. 5I depicts contact structures of the terraced portion.

FIG. 5L1 is a flowchart of one embodiment of a method of forming a set of thin film transistors (TFT).

FIG. 5L2 shows further details of one embodiment of contacts from select lines to WL select gates.

FIG. 8A depicts a layered semiconductor material 800 which is consistent with a cross-sectional view of the memory area region 305 of the 3D stacked non-volatile memory device of FIG. 8 along the line A-A'.

FIG. 8B shows a cross section view along the word line (x) direction and is a cross section along the circled portion of line B-B' from FIG. 8 for one embodiment.

FIG. 8C depicts a layered material 800 which is consistent with a cross-sectional view of the WL select gate region 303b of the 3D stacked non-volatile memory device of FIG. 8 along a portion of line C-C' from FIG. 8.

FIGS. 10A-10C depict a layered material 1000 which is obtained from the layered material 900 after performing a wet etch via the slits in the cell and WL select gate regions.

FIG. 11A-11C depicts a layered metal/oxide stack 1100 which is obtained from the layered material 1000 after filling in voids with metal via the slits in the cell and WL select gate regions.

FIGS. 12A-12B depict a layered material 1200 which is obtained from the layered material 1300 after cleaning out the transistor holes.

FIGS. 16A-16C depict a layered material which is obtained from the layered material 1500 after performing a wet etch via the memory holes and z-holes.

DETAILED DESCRIPTION

Figure 1A:
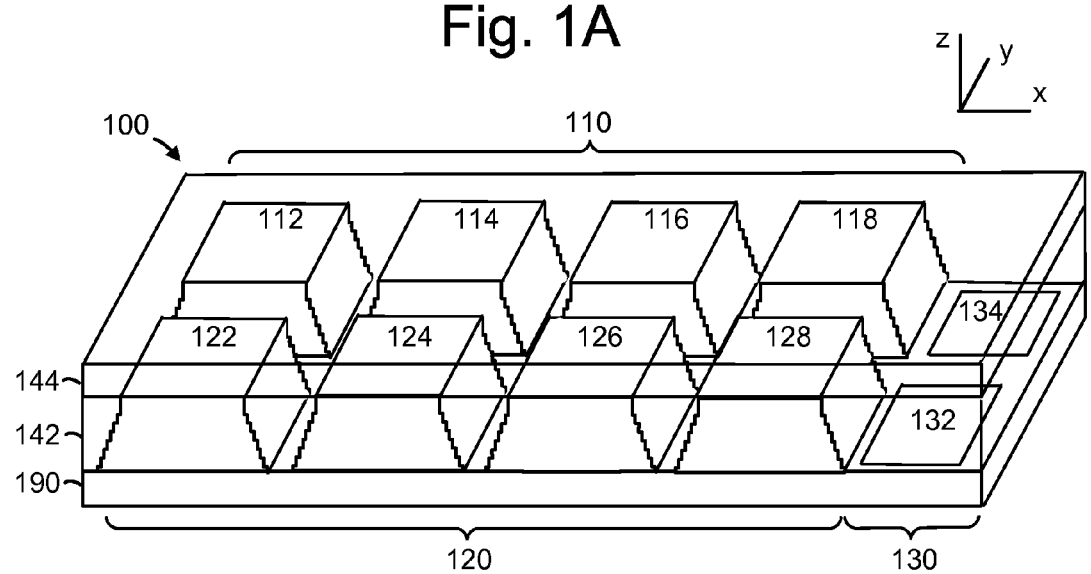
FIG. 1A is a perspective view of a 3D stacked non-volatile memory device 100 in which a plane of memory cells is arranged in separate subarrays.

One problem with many 3D stacked non-volatile memory devices (such as 3D NAND) is that it can be difficult to provide a decoder (or word line select) transistor that meets desired criteria. Those criteria can include high voltage operation with relatively low leakage, sufficient drive current, low variability between decoders, etc. Such requirements are challenging to meet with polysilicon transistors due to significant effects of poly-crystal grains and grain boundaries, which may increase leakage, reduce breakdown voltage, reduce mobility and drive current, and may introduce high variability of device parameters.

In some embodiments disclosed herein, a word line (WL) select transistor is formed within the same layer as the word lines of a 3D NAND memory array. If 3D NAND is implemented with metal word lines, realization of polysilicon WL select transistors in the same layer as the word line material can be difficult. In one embodiment, a horizontal TFT is used as a WL select device. The horizontal TFT is formed in the same layer of the 3D memory array that is used to form metal word lines.

Disclosed herein is a novel TFT device based on a wide energy band gap semiconductor. Herein, a "wide band gap semiconductor" is defined as any semiconductor that has an energy band gap that is wider than silicon. Silicon may have an energy band gap of about 1.1 eV. Some wide band gap semiconductors may have an energy band gap of about 3 eV or greater. However, the wide band gap semiconductor could have an energy band gap that is less than 3 eV. The wider the energy band gap, the higher the critical field. This means that breakdown voltage may be larger for the same size device, relative to silicon.

The wide band gap semiconductor is used to form the body of the TFT, in accordance with embodiments. The wide band gap semiconductor could be an oxide semiconductor, such as a metal oxide semiconductor. Examples of metal oxide semiconductors include, but are not limited to, InGaZnO, InZnO, HfInZnO, ZrInZnO, and ZnInSnO.

Embodiments of a TFT select device having a wide band gap semiconductor body are compatible with 3D memory arrays (including NAND) having metal word lines. This may be a horizontal TFT that is formed in the same layer used to form the metal word lines. An example metal for the word line is tungsten, but other metals could be used. Embodiments of a TFT select transistor have a high breakdown voltage. Embodiments of a TFT select transistor have a high drive current. Embodiments of a TFT select transistor have a low leakage current. Embodiments of a TFT select transistor operate as an NFET device, which can simplify decoding operation and circuit design relative to PFET. However, PFET TFT select transistors can also be realized. Embodiments of a TFT select transistor have high uniformity between devices (i.e., low variability).

Also disclosed herein are techniques which reduce capacitance when selecting memory cells in a 3D stacked memory device. The 3D stacked memory device could have NAND strings. Word line (WL) select gates are provided, in one embodiment. A WL select gate includes one or more thin film transistors (TFT), in one embodiment. These TFTs have a body formed from a wide band gap semiconductor, which may be an oxide semiconductor, in one embodiment. The WL select gates may be located adjacent to a word line plate hookup region of a word line plate. The word line plate may be driven by a word line plate driver that connects to the word line plate hookup region. A given WL select gate may be located between the word line plate hookup region and a word line in order to select that word line. Thus, by driving a given word line plate and selecting a given WL select gate a particular word line associated with the given word line plate may be selected. In one embodiment, a single WL select gate selects more than one word line. In one embodiment, a word line is associated with a set of non-volatile storage elements on different NAND strings that form a single line.

Because word lines may be selected individually (or in small groups), the capacitive loading is substantially less than if selecting all word lines of an entire word line plate. Therefore, requirements on charge pumps are less. This saves space in the peripheral region of the memory array. Also, the word lines themselves can be longer since there is less capacitive loading. For example, word lines do not need to be segmented. Segmenting of word lines may take extra space. Thus, the 3D stacked memory array may be formed without segmenting word lines, thereby saving space.

Also disclosed herein are decoding techniques in a 3D stacked memory device. In one embodiment, WL select gates allow small sub-blocks in a 3D stacked memory device to be selected. The decoding may lead to better performance, reduced power consumption, and better reliability. As one example, a small fraction of a block may be selected for erase. In one embodiment, one-half of each NAND string in a 3D stacked memory device may be selected for erase. In one embodiment, single NAND strings in a 3D stacked memory device may be selected for erase.

Note that 3D decoding is provided for, in one embodiment. In one embodiment, the WL select gates allow word lines to be selected using "z-decoding," bit lines may be selected using "y-decoding," and word line plates may be selected using "x-decoding." Note that the z-decoding may be also referred to as sub-block decoding.

In one embodiment, a 3D memory device has horizontal layers comprising a material that is a conductor alternating with horizontal insulator layers in a stack. The conductor is a metal (at least where word lines are located), in one embodiment. There are a set of thin film transistors (TFT) that serve as WL select devices in different ones of the horizontal layers of conductor material. The TFTs each have a gate electrode. Moreover, the gate electrodes of the set of TFTs may be coupled together by conductor material. There may be a decoder coupled to the gate electrodes. Thus, this set of TFTs can be selected together.

A 3D decoding system may allow many improvements including (but not limited to) possible re-definition of block and sub-block, various new modes of operation, disturb and inhibit control, and architectural changes to optimize design to take advantage of the 3D decoding.

A major plane of the gate electrode of the TFTs may be vertically oriented with respect to a horizontal layer of conductor material in which it resides. For example, the TFTs may have a gate dielectric adjacent to the gate electrode, wherein a plane at an interface between the gate electrode and gate dielectric intersect runs vertically with respect to the horizontal layer. Also, the TFTs may have a body adjacent to the gate dielectric, wherein a plane at an interface between the gate dielectric and body meet runs vertically with respect to the horizontal layer. In one embodiment, the TFT is referred to as a vertical gate/width TFT. A TFT may have a channel width that is defined by a thickness of the horizontal layer of conductor material in which it resides. The horizontal layer may include the TFT body and source and drain regions. The conductive channel of the TFT may be formed in the TFT body region adjacent to the gate dielectric by applying appropriate bias to the gate. The channel current may run in the horizontal direction, between source and drain.

In one embodiment, each conductor layer comprises at least one word line plate and word lines, with each of the word line plates associated with multiple ones of the word lines. A TFT may have a channel that runs in the direction of the word lines.

In one embodiment, TFTs are formed by forming a first hole in a layer of material (e.g., wide band gap semiconductor). Then, a gate dielectric layer is formed on the sidewalls of the first hole leaving a second hole inside the gate dielectric layer. Next, a gate electrode layer is formed in the second hole on the sidewalls of the gate dielectric layer. A body is formed in the layer of wide band gap semiconductor material adjacent to the gate dielectric layer. Drain and source regions are formed in the layer of wide band gap semiconductor and/or word line layer adjacent to the body. The foregoing may form a structure that includes two TFTs (in a single layer of e.g., polysilicon) in parallel. Alternatively, the structure may be considered to be a single transistor having dual gates and dual bodies. The width of the TFT channel may be defined by the thickness of the wide band gap semiconductor layer. The wide band gap semiconductor may have about the same thickness of the word line layer.

In one embodiment, a TFT WL select device is symmetrical. For example, the drain and source may both be located at about the same distance from the gate. In one embodiment, a TFT WL select device is asymmetrical. For example, the drain may be located further from the gate than the source. An asymmetrical TFT WL select device may have a gate/drain offset. Stated another way, an asymmetrical TFT WL select device may have a body/channel extension.

FIG. 1A is a perspective view of a 3D stacked non-volatile memory device 100 in which a plane of memory cells is arranged in separate subarrays. In the memory device 100, a substrate 190 carries an example plane 110 of memory cells in subarrays 112, 114, 116 and 118, an example plane 120 of memory cells in subarrays 122, 124, 126 and 128, and a peripheral area 130 with peripheral regions 132 and 134 which include circuitry for use by the subarrays. The substrate 190 can also carry circuitry under the subarrays, along with one or more lower metal layers which are patterned in conductive paths to carry signals of the circuitry. A plane could be associated with a common substrate region, which may contain one or more wells.

If there is no peripheral circuitry under array, there is no need to form wells in the substrate. On the other hand, if some peripheral circuits are placed under the array, the configuration of wells should correspond to transistors and other elements in those circuits. For instance, NMOS transistors are typically placed in a p-well, and PMOS transistors are placed in an n-well. Some NMOS transistors can be placed directly in the silicon substrate, which is typically p-type. A triple-well could also be used, e.g., a p-well placed inside an n-well, in a p-substrate. An NMOS transistor can be placed in such triple-well. An advantage of a triple-well is that the bias can be easily supplied to the transistor body, if necessary, e.g., a p-well can be biased for an NMOS that is placed in the triple-well.

The subarrays are formed in an intermediate region 142 of the memory device. In an upper region 144 of the memory device, one or more upper metal layers are patterned in conductive paths to carry signals of the circuitry. Each subarray comprises a stacked area of memory cells, where alternating levels of the stack represent word lines. In one possible approach, each subarray has opposing tiered sides from which vertical contacts extend upward to an upper metal layer. Additionally, a gap between each subarray is a hook up area which allows vertical contacts to extend upward from the substrate to an upper metal layer. The gap is also a word line transfer area which allows word line segments in different subarrays to be connected. The space in the word line hookup and transfer area can also be used to carry signals from under to over array, by high aspect ratio vias, connecting metal wiring under array to metal wiring over array. For instance, if sense amplifier is placed under array, the space can be used to carry power signals, such as VDDSA, SRCGND (source ground), VSS and so forth.

The one or more lower metal layers extend at a height which is below a height of a bottom layer of each subarray, and the one or more upper metal layers extend at a height which is above a height of a top layer of each subarray.

In one possible approach, the length of the plane, in the x-direction, represents a direction in which signal paths to word lines extend in the one or more upper metal layers, and the width of the plane, in the y-direction, represents a direction in which bit lines extend in the one or more upper metal layers. Source lines may also extend in the x-direction. The z-direction represents a height of the memory device 100.

Figure 1B:
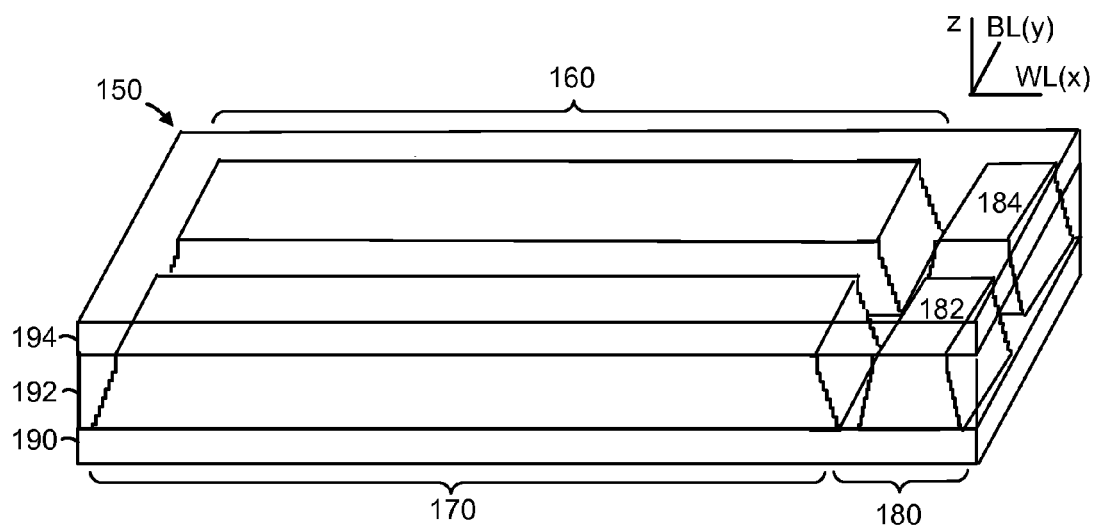
FIG. 1B is a perspective view of a 3D stacked non-volatile memory device 150 in which a plane of memory cells may be considered to have one contiguous sub-array.

FIG. 1B is a perspective view of a 3D stacked non-volatile memory device 150 in which a plane of memory cells may be considered to have one contiguous sub-array. A substrate 190 carries example planes, 160, 170 of memory cells. The cells may use common circuitry and/or control or power signals. A peripheral area 180 includes peripheral regions 182 and 184. In practice, peripheral regions can extend on one or more sides of a 3D stacked memory array which comprises one or more planes such as planes 160 and 170. For simplicity, the peripheral area 180 is depicted on one side of the 3D stacked memory array.

As an alternative, the plane 170 can include undivided subarrays, where space is saved due to the lack of gaps between subarrays. A subarray can be a portion of a memory array which uses common circuitry and/or control or power signals. In one approach, multiple subarrays in a plane have common word line signals, but have different sets of bit line and sense amplifier signals.

The planes are formed in an intermediate region 192 of the memory device. In an upper region 194 of the memory device, one or more upper metal layers are patterned in conductive paths to carry signals of the circuitry. The upper and lower metal layers may be considered to be wiring layers. In one possible approach, each plane, rather than each subarray, has opposing tiered sides from which vertical contacts extend upward to an upper metal layer.

Each array can further include one or more blocks. The blocks are insulated from one another by insulation-filled dividers/slits, which run in the x-direction. As one example, a width of a block may include 12 U-shaped NAND strings. An example of a physical width of a block (in the y-direction) is approximately $3 \times 10^{-6}$ to $4 \times 10^{-6}$ meters.

FIG. 2A depicts a top view of the 3D stacked non-volatile memory device 100 of FIG. 1A. Like-numbered elements correspond to one another in the different figures. Each subarray can include sense amplifier circuitry, for instance, which is used for read and verify operations of the memory cells in the subarray. The sense amplifier circuitry can include, e.g., latches, processing circuitry and bit line hook-ups. The sense amplifier circuitry can provide signals such as Vdd, source ground and Vss. In one approach, the sense amplifier circuitry is provided on opposing sides of each subarray, in a double-sided configuration. For example, in the plane 120, subarrays 122, 124, 126 and 128 include sense amplifier circuitry 240 and 241; 242 and 243; 244 and 245; and 246 and 247, respectively.

The plane 120 can include column circuitry 260 as well, which is under the subarray 124 in this example. Regions 202, 204, 206, 207 and 210 are hook up areas where contacts can be fabricated to extend upward to the one or more metal layers, for instance. For example, a lower metal layer such as M0 can be connected to an upper metal layer such as D2. In one approach, of the lower metal layers, M0 is below M1, and of the upper metal layers, D0 is below D1 and D1 is below D2. Regions 204, 206 and 207 are also word line transfer areas in which signal paths for word lines can be joined among the different subarrays. In this approach, a set of word lines extends in segments across the subarrays, with word line hook-up and transfer areas between the subarrays.

WL select gates are formed in regions 303 adjacent to the WL hookup regions 202, 204, 206, 207 and 210 in one embodiment. Also, WL select gates are formed in regions 303 adjacent to the WL hookup regions 222, 224, 226, 228, and 230, in one embodiment. WL select gates may be used to select word lines. WL select gates will be discussed below.

One advantage of separating the plane into subarrays is to provide greater flexibility to configure power busses/connections for sense amplifiers.

These regions are also gaps between the subarrays. In the peripheral area 130, a region 212 may be used for providing vertical contact structures between a source line driver in the substrate and corresponding signals paths in the one or more upper metal layers. A region 214 may be used for providing vertical contact structures between row and column core drivers and corresponding signals paths in the one or more upper metal layers. A row decoder (x) provides signals for word line plates. Note that there may be additional column (e.g., y) decoding circuits at the peripheral of the memory array long the vertical sides (not depicted in FIG. 2A). Column (e.g., y) decoders may provide signals for bit lines. The region 132 may include other circuitry, e.g., for use by the plane 120.

Embodiments of the memory array 150 also have "z-decoding." Z-decoders may provide signals for WL select gates. Selecting WL select gates may be referred to herein as "z-decoding." Region 213 may provide vertical contact structures that are used in selection of WL select gates. The z-decoding allows for selecting of sub-blocks, in one embodiment. Region 213 may provide vertical contact structures between WL select gate select drivers and corresponding signals paths in the one or more upper metal layers. Many techniques may be used to form connections between decoders and the WL select gates.

In one embodiment, regions 213 and 214 may be physically combined. For example, circuitry that provides for row (e.g., x) decoding may alternate with circuitry that provides for sub-block (e.g., z) decoding.

Similarly, in the plane 110, subarrays 112, 114, 116 and 118 include sense amplifier circuitry 250 and 251; 252 and 253; 254 and 255; and 256 and 257, respectively. The plane 110 can include column circuitry 262 as well, which is under the subarray 114 in this example. Regions 222, 224, 226, 228 and 230 are hook up areas where contacts can be fabricated to extend upward to the one or more metal layers, for instance. Regions 224, 226 and 228 are also word line transfer areas in which signal paths for word lines can be joined between the different subarrays. These regions are also gaps between the subarrays.

In the peripheral area 130, a region 232 may be used for providing vertical contact structures between a source line driver in the substrate and corresponding signals paths in the one or more upper metal layers. A region 234 may be used for providing vertical contact structures between row and column core drivers and corresponding signals paths in the one or more upper metal layers. Region 219 may provide vertical contact structures that are used in selection of WL select gates. The z-decoding allows for selecting of sub-blocks, in one embodiment. Region 219 may provide vertical contact structures between WL select gate select drivers and corresponding signals paths in the one or more upper metal layers. The region 134 may include other circuitry, e.g., for use by the plane 110. The regions 204, 206 and 207, and 224, 226 and 228 may consume about 10% of the area of the overall memory array area, in one embodiment. The memory array may include, e.g., the set of one or more arrays on the memory device chip.

In the example of FIG. 2A, the word lines runs from top to bottom. In this example, the word lines are segmented into four sections, one section per subarray. However, segmenting the word lines is not required.

Figure 2B:
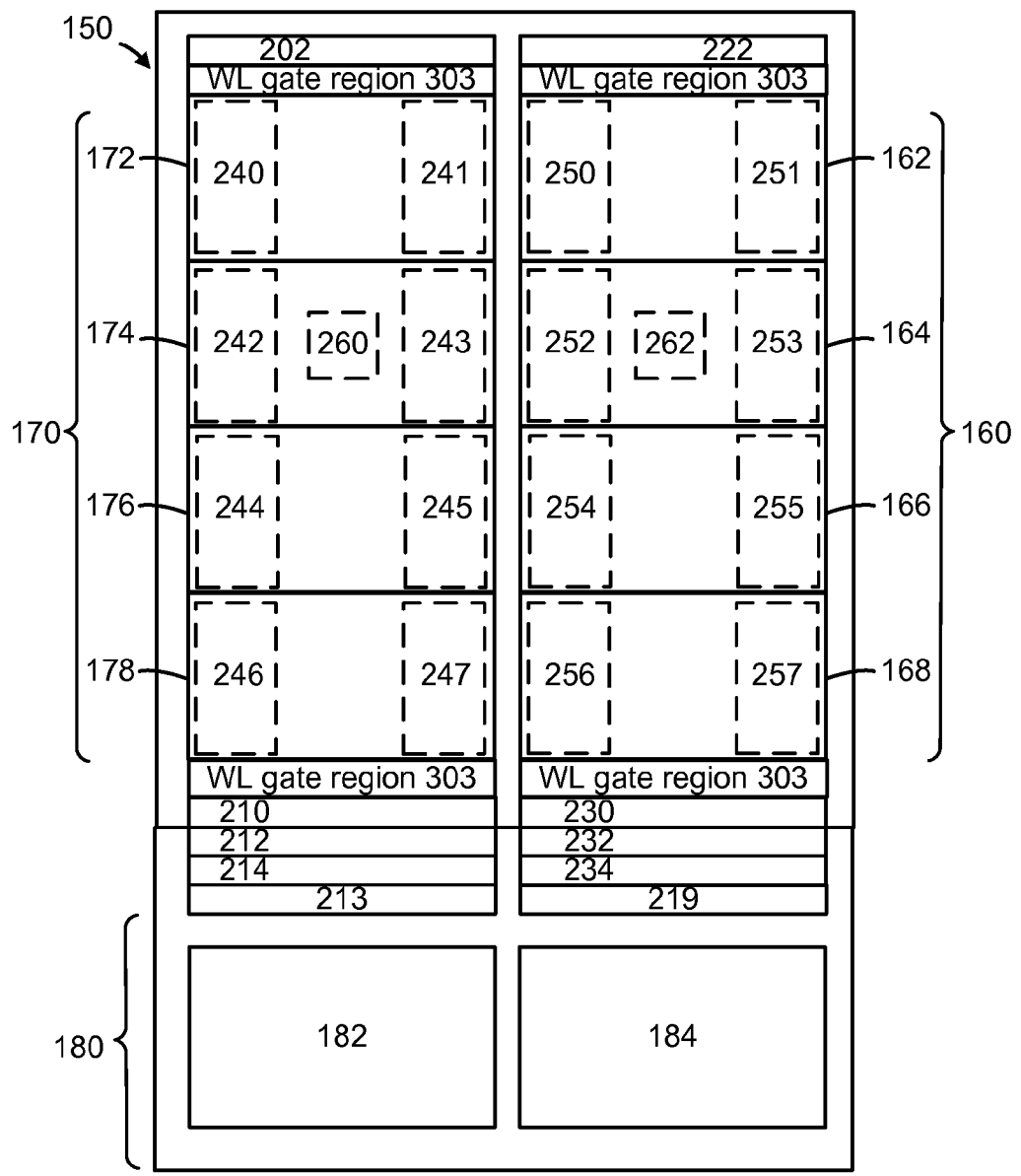
FIG. 2B depicts a top view of the 3D stacked non-volatile memory device 150 of FIG. 1B.

FIG. 2B depicts a top view of the 3D stacked non-volatile memory device 150 of FIG. 1B. In this example, the word lines are not segmented. The memory device 150 differs from the memory device 100 in that the regions 204, 206 and 207, and 224, 226 and 228 are not present, so that the area consumed by the memory device is reduced. The regions 204, 206 and 207, and 224, 226 and 228 are not needed since the word lines are not segmented. Therefore, some of the word line plate hookup regions can be avoided. However, word line plate hookup regions 202, 210, 222, and 230 are still present. In FIG. 2B, WL select gate regions 303 are depicted between the WL hookup regions and the memory array. The WL select gate regions 303 may contain WL select gates that include TFTs.

Embodiments of the memory array 150 also have "z-decoding." Selecting WL select gates may be referred to herein as "z-decoding." Region 213 may provide vertical contact structures that are used in selection of WL select gates. The z-decoding allows for selecting of sub-blocks, in one embodiment. Regions 213 and 219 may provide vertical contact structures between WL plate select drivers and corresponding signals paths in the one or more upper metal layers.

In one embodiment, regions 213 and 214 may be physically combined. For example, circuitry that provides for row (e.g., x) decoding may alternate with circuitry that provides for sub-block (e.g., z) decoding.

In FIG. 2B, each plane is divided into four sub-arrays. This allows various circuitry such as sense amplifier circuitry 240 and 241; 242 and 243; 244 and 245; and 246 and 247, to serve smaller regions of the memory array 150. However, the plane does not need to be divided into sub-arrays.

Figure 2C:
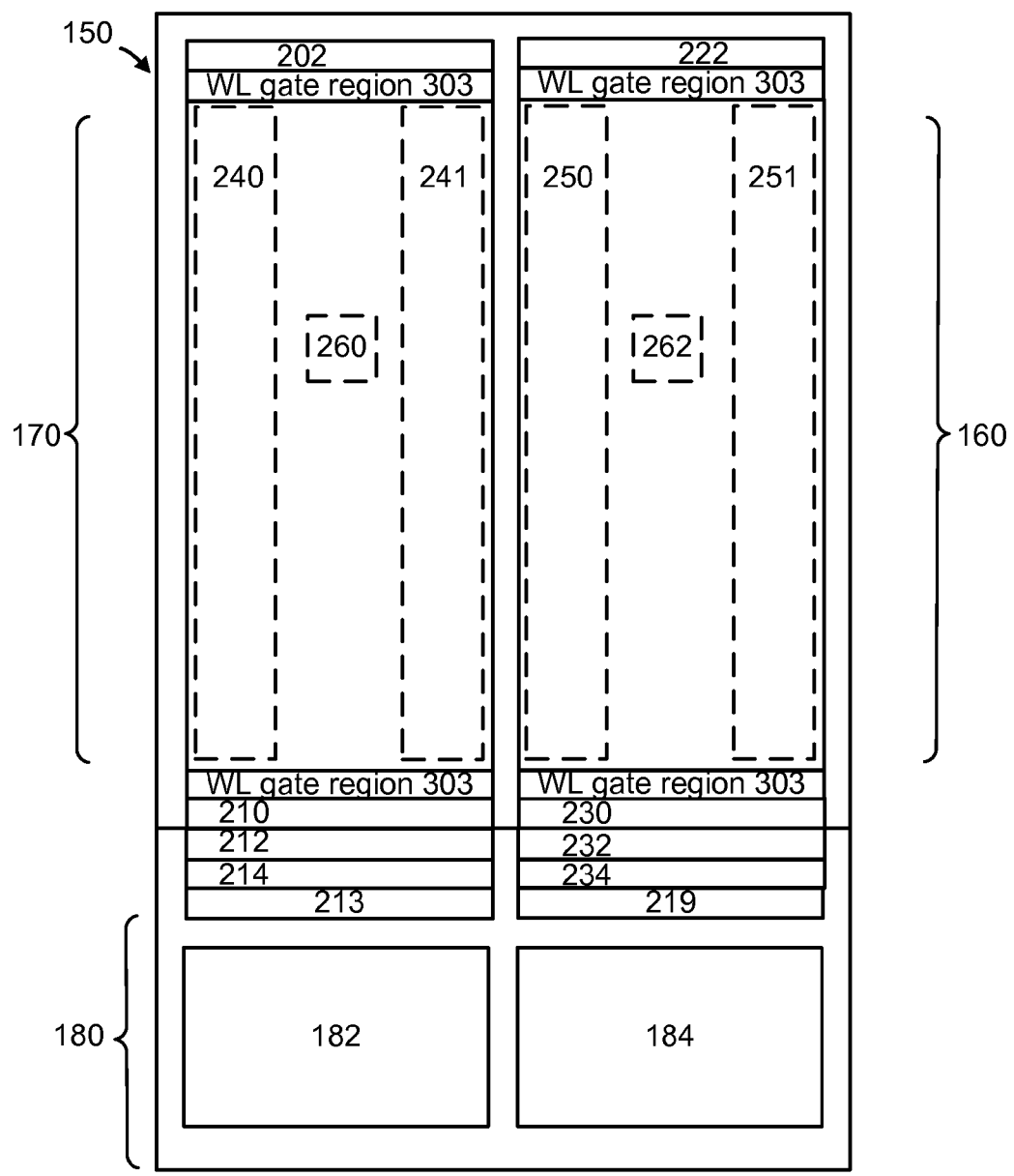
FIG. 2C is an example in which the planes are not divided into sub-arrays.

FIG. 2C is an example in which the planes are not divided into sub-arrays. FIG. 2C corresponds to one embodiment of FIG. 1B in which the word lines in a plane are not segmented. There is one WL plate hookup region 202, 210 on each end of plane 170 in this example. Likewise, there is one WL plate hookup region 222, 230 one each end of plane 160 in this example.

Embodiments of the memory array 150 also have "z-decoding." Selecting WL select gates may be referred to herein as "z-decoding." Region 213 may provide vertical contact structures that are used in selection of WL select gates. The z-decoding allows for selecting of sub-blocks, in one embodiment. Regions 213 and 219 may provide may provide vertical contact structures between WL plate select drivers and corresponding signals paths in the one or more upper metal layers.

In one embodiment, regions 213 and 214 may be physically combined. Likewise, regions 219 and 234 may be physically combined. For example, circuitry that provides for row (e.g., x) decoding may alternate with circuitry that provides for sub-block (e.g., z) decoding.

In FIG. 2C, the sense amplifier circuitry 240, 241 is used for all of plane 170. Likewise, sense amplifier circuitry 250, 251 is used for all of plane 160.

FIG. 2D is an example in which the plane is not divided into sub-arrays similar to FIG. 2C. In FIG. 2D, z-decoding circuitry has an alternative location relative to FIG. 2C. Z-decoding circuitry 213a, 213b for plane 170 may reside under the array. Z-decoding circuitry 219a, 219b for plane 160 may reside under the array. Similarly, the examples of FIGS. 2A and 2B could be modified to have Z-decoding circuitry in this alternative location. Other locations for the z-decoding circuitry may be used.

FIG. 2E depicts a top view of the 3D stacked non-volatile memory device 150 of FIG. 1B. In the plane 170, in-plane interconnect areas 115a, 115b are provided which extend along a length of the plane. These interconnect areas 115a, 115b provide for connection to the sense amplifiers 240, 241 respectively. In one embodiment, there is a single interconnect area, which may be located about midway across the y-direction, or in another location. Similarly, in the plane 160, interconnect areas 117a, 117b are provided which extend along a length of the plane. Connections to the sense amplifiers 240, 241, 250, 251 may be made by high aspect ratio vias.

In one embodiment, connections to WL select gate select lines are made through a portion of the in-plane interconnect areas 115, 117. The WL select gate select lines may be connected to gates of the WL select transistors, thereby allowing selection of WL select gates. In one embodiment, connections are made through a region of the interconnect 115, 117 that extends outside the memory array. The interconnect 115, 117 does not necessarily extend to the WL hookup region 202, 210, 222, 230. In one embodiment, the connections to the WL select gate select lines may be similar to the connections to the bit lines. However, note that connections can be made in another manner. In one embodiment, the connections to the WL select gate select lines are made without using the interconnect region 115, 117. As one example, the connections to the WL select gate select lines can be made in the WL hookup region 202, 210, 222, 230.

In one embodiment, memory array includes one or more blocks. As noted herein, a memory array may include one or more planes. Each plane may include one or more sub-arrays. Each sub-array may include one or more blocks. In one embodiment, a sub-array includes hundreds of blocks. A sub-array could include more or fewer than hundreds of blocks.

Figure 2F:
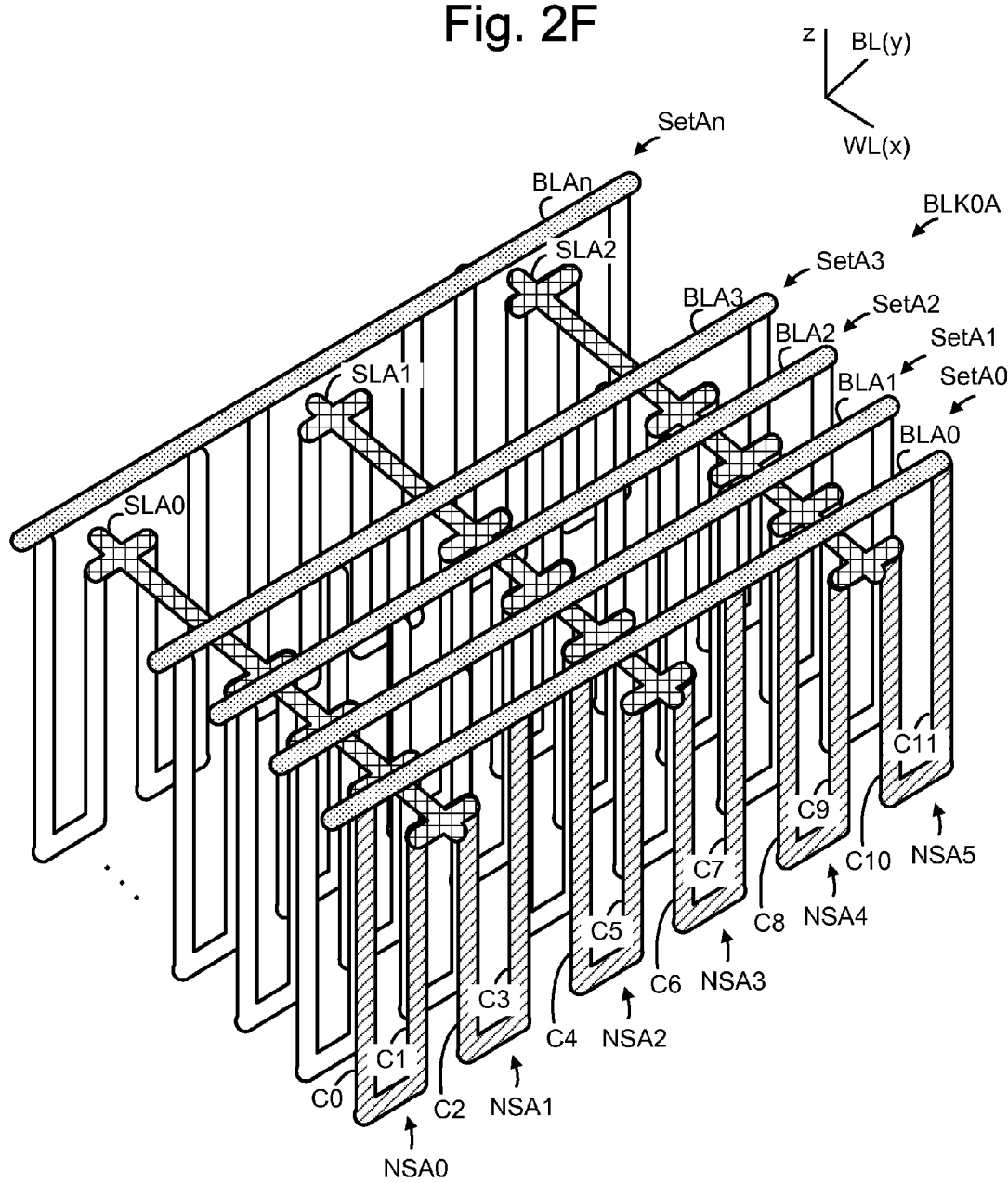
FIG. 2F depicts an embodiment of a block that includes U-shaped NAND strings.

FIG. 2F depicts an embodiment of a block that includes U-shaped NAND strings. The block includes U-shaped NAND strings arranged in sets (SetA0, SetA1, SetA2, SetA3, . . . , SetAn, where there are n−1 sets in a block). Each set of NAND strings is associated with one bit line (BLA0, BLA1, BLA2, BLA3, . . . , BLAn). In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example. In FIG. 2F there are six NAND strings; however, there could be more or fewer NAND strings in a block.

Figure 2G:
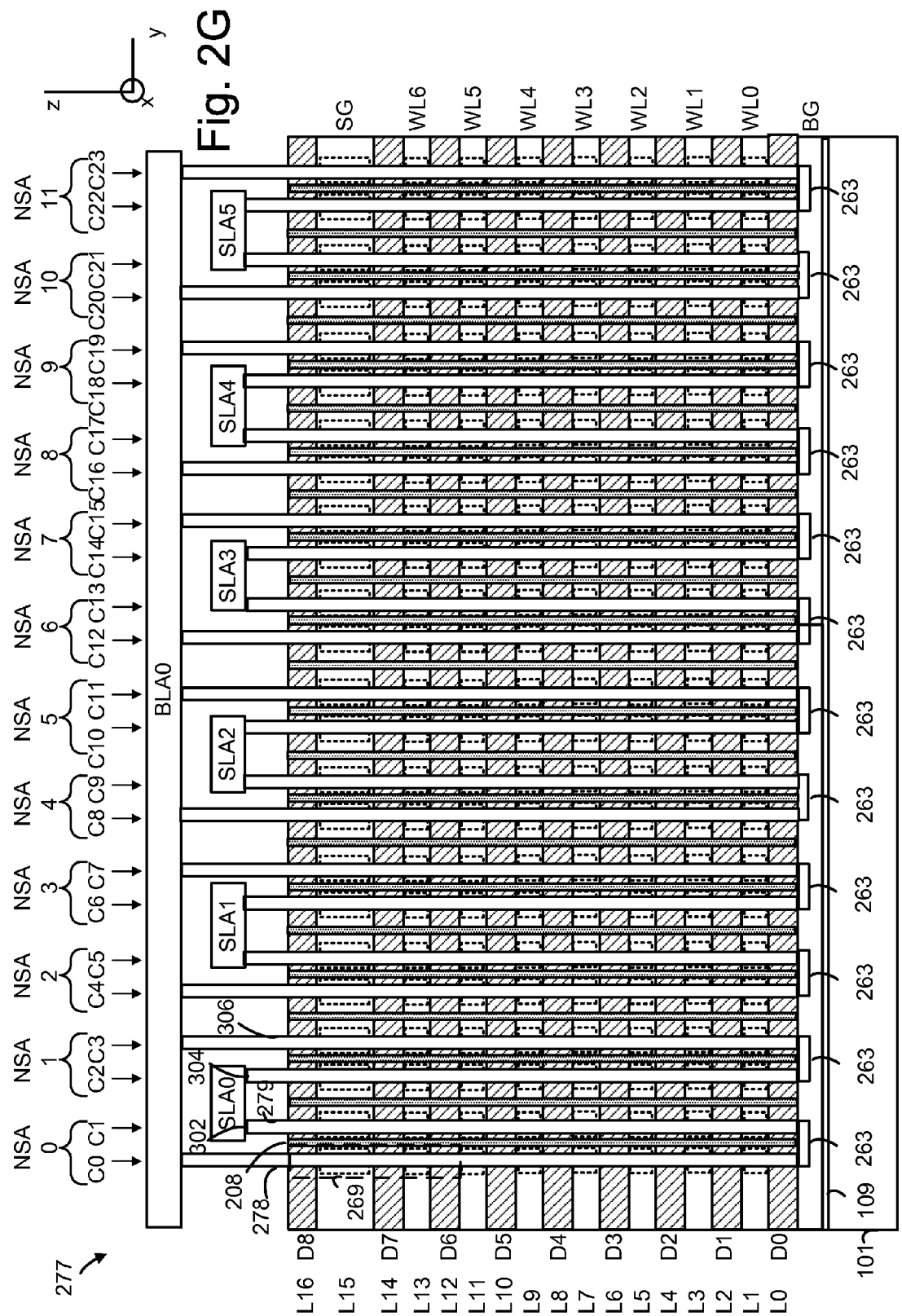
FIG. 2G depicts a cross-sectional view of a block of a 3D non-volatile memory device.

FIG. 2G depicts a cross-sectional view of a block of a 3D non-volatile memory device. FIG. 2G has 12 NAND strings (NSA 0-NSA 11). The stack includes alternating insulator (e.g., dielectric) and conductor layers (a conductor layer may be one that is formed from or more conductors). In some embodiments, the conductor layers comprise metal, such as tungsten. In one embodiment, the insulator layers are an oxide. However, a different insulator could be used. The insulator layers include D0 to D8 and may be made of $SiO_2$, for instance. The conductor layers include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. These various layers may also be referred to herein as layers L0-L16. The insulator layers D0-D8 correspond to the even layers of L0-L16, in this example. The conductor layers correspond to the odd layers L1-L15, in this example.

Columns of memory cells C0 to C23 are depicted in the multi-layer stack. The stack 277 includes the substrate 190, an insulating film 109 on the substrate, and a back gate layer BG, which is a conductor layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 which connect the columns. Each connecting portion 263 thus connects the two columns of each U-shaped NAND string. A connection portion 263 may include a pipe connection and a back gate. The pipe connection may be made of undoped polysilicon, as well as other materials. A dielectric and back gate may surround the pipe connection to form back gate transistors to control conduction of the pipe connection. The back gate may also ensure connectivity of the pipe connection. For example, NSA0 includes columns C0 and C1 and connecting portion 263. NSA0 has a drain end 278 and a source end 302. NSA1 includes columns C2 and C3 and connecting portion 263. NSA1 has a drain end 306 and a source end 304. NSA2 includes columns C4 and C5 and connecting portion 263. NSA3 includes columns C6 and C7 and connecting portion 263. NSA4 includes columns C8 and C9 and connecting portion 263. NSA5 includes columns C10 and C11 and connecting portion 263. NSA6 includes columns C12 and C13 and connecting portion 263. NSA7 includes columns C14 and C15 and connecting portion 263. NSA8 includes columns C16 and C17 and connecting portion 263. NSA9 includes columns C18 and C19 and connecting portion 263. NSA10 includes columns C20 and C21 and connecting portion 263. NS 11 includes columns C22 and C23 and connecting portion 263.

The source line SLA0 is connected to the source ends 302 and 304 of two adjacent memory strings NSA0 and NSA1, respectively. The source line SLA0 is also connected to other sets of memory strings which are behind NSA0 and NSA1 in the x direction. Recall that additional U-shaped NAND strings in the stack 277 extend behind the U-shaped NAND strings depicted in the cross-section, e.g., along the x-axis. The U-shaped NAND strings NSA0 to NSA11 are each in a different sub-block, but are in a common set of NAND strings (SetA0).

A slit portion 208 is also depicted as an example. In the cross-section, multiple slit portions are seen. Some slit portions are between the drain- and source-side columns of a U-shaped NAND string. These slits serve to separate word lines on the source and drain side of the NAND string. Other slit portions are between the source-sides of two adjacent NAND strings. Other slit portions are between the drain-sides of two adjacent NAND strings. The slits between two adjacent NAND strings are not required. Portions of the source lines SLA0-SL5 are also depicted. A portion of the bit line BLA0 is also depicted. Short dashed lines depict memory cells and select gates, as discussed further below.

Figure 3A:
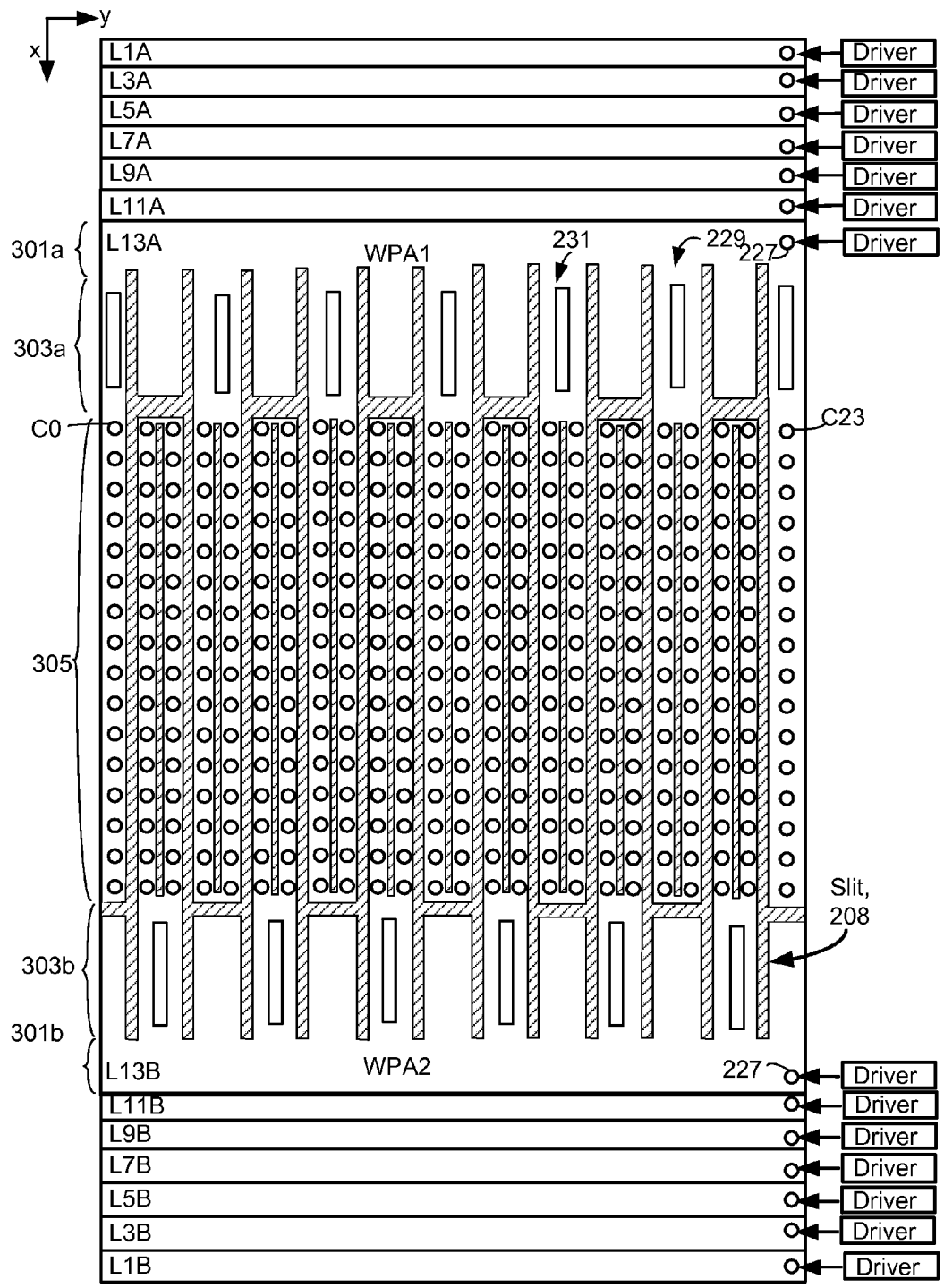
FIG. 3A depicts a top view of a block in a 3D non-volatile memory device.

FIG. 3A depicts a top view of a block in a 3D non-volatile memory device. In this example, there are 12 NAND strings across the width of the block. This view is a cross section of layer 13 (L13) of the structure of FIG. 2G, looking downward. Layer 13 is a representative layer among the multiple word line layers in a stack. Portions of layers 1, 3, 5, 7, 9 and 11 may also be seen because in this embodiment, the layers form a terrace structure with lower levels being slightly larger. This allows electrical connections to be made, as will be discussed below. The conductor layers may comprise metal, for instance. However, doped polysilicon or metal silicide are also possible for the conductor layers.

Level 13 in FIG. 3A depicts a horizontal slice of one block. Note that a block may include multiple layers. Also note that the word line layer may have any number of horizontal block slices. For purposes of discussion, the horizontal slice of the block will be discussed as having five separate regions. There is a first word line plate hookup region 301*a*, a first WL select gate region 303*a*, a memory array region 305, a second WL select gate region 303*b*, and a second word line plate hookup region 301*b*.

The first word line plate hookup region 301*a* is in communication with a first word line plate driver. The first word line plate hookup region 301*a* has a contact 227 to allow this communication. FIGS. 5I and 5J show examples of contact structures. The second word line plate hookup region 301*b* is in communication with a second word line plate driver. The second word line plate hookup region 301*a* has a contact 227 to allow this communication. Word line plate drivers are also is in communication with word line plate hookup regions at other levels. The memory array region 305 includes memory cells, each of which may be associated with a NAND string. The NAND string is not depicted in FIG. 3A, as NAND strings may run in and out of the page in this top view.

Each block includes memory holes or pillars, represented by circles. The memory holes are formed in a conductive region. In this example, there are 24 memory holes in a row (in the y-direction in FIG. 3A). These 24 memory holes correspond to columns C1-C23 in FIG. 2G. One of the memory holes is labeled C0 and another C23. Other memory holes are not labeled are not depicted, so as to not obscure the drawing. In some embodiments, there are dummy memory cells. For example, there could be one additional column of memory holes in FIG. 3A. As one example, dummy cells may be on the right edge or left edge of the block. Dummy memory cells are not depicted in FIG. 3A. In this example, 16 memory holes are shown in the x-direction. There may be many more memory holes in the x-direction. The number of memory holes in the x-direction may be referred to as a page.

The block has slits, each of may be a void or narrow trench which extends vertically in the stack, typically from just above a pipe connection at the bottom to at least a top layer of the stack. The slit can be filled with insulation. The silts 208 in FIG. 3A correspond to the slits 208 depicted in FIG. 2G. In one embodiment, slits provide electrical isolation between word lines on a source side and a drain side of NAND strings. Note that there may also be slits that separate blocks. These slits can run deeper and may cut through the back gate plate on both sides of the block. Therefore, they may provide electrical isolation between blocks. The slits between blocks are not depicted in FIG. 2G.

Each WL select gate region 303 includes a number of WL select gates 229. In one embodiment, a WL select gate 229 has one or more thin film transistors (TFTs) 231, each having a body formed from a wide band gap semiconductor. The wide band gap semiconductor may be an oxide semiconductor. Examples of oxide semiconductors that are wide band gap semiconductors include, but are not limited to, InGaZnO, InZnO, HfInZnO, ZrInZnO, and ZnInSnO. The oxide semiconductor may be a metal oxide semiconductor.

In one embodiment, a WL select gate 229 has one or more TFT structures. In the example in FIG. 3A, each WL select gate 229 has one TFT structure 231. A TFT structure may be considered to comprise two TFTs in parallel, in one embodiment. Alternatively, the TFT structure may be considered to comprise a single TFT with dual gates and bodies, in one embodiment. A WL select gate 229 may have any number of TFT structures. Note that the slits 208 may extend into the WL select gate region 303 to provide electrical isolation between WL select gates 229. In one embodiment, a given WL select gate 229 is between two slits. The slits may help the WL select gate 229 to select the appropriate memory cells. The two slits may serve to define a set of memory cells to be selected by the WL select gate 229.

Note that the location of the word line hook up regions 301a, 301b and word line select gate regions 303a, 303b are roughly depicted. They may be located in another manner.

Figure 3B:
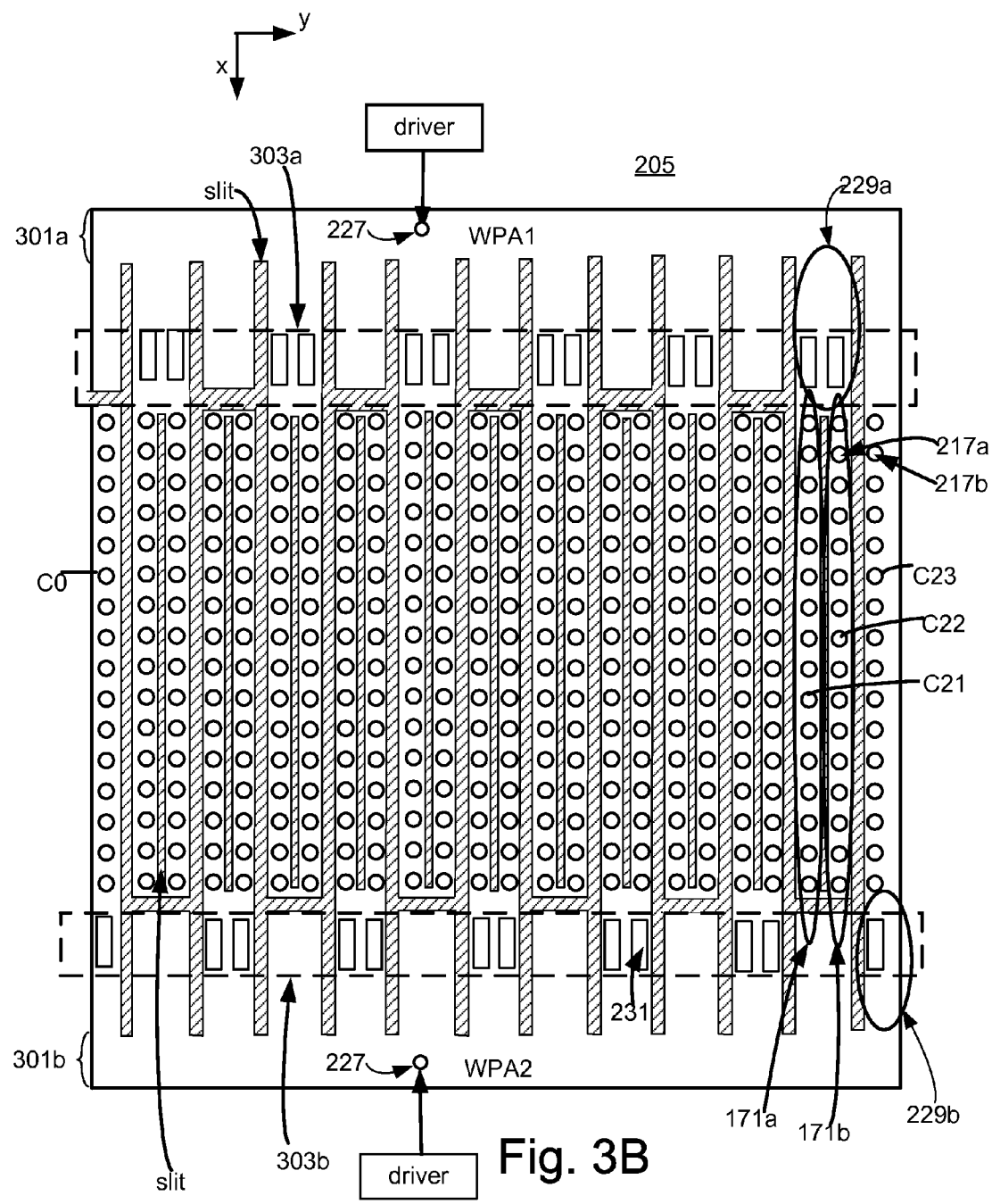
FIG. 3B shows one level of the block similar to the example from FIG. 3A.

FIG. 3B shows one level of the block 205 similar to the example from FIG. 3A. In one embodiment, two of the memory holes are associated with one U-shaped NAND string. For example, memory holes 217a and 217b may be associated with the same U-shaped NAND string (e.g., NSA11 in FIG. 2G). Each block includes a slit pattern. The slit pattern provides electrical isolation.

For purposes of discussion, the circles will be referred to as memory cells at this level of the 3D memory array. The first and second WL select gate regions 303a, 303b each include WL select gates 229, respectively and slits. In this example, there are two WL select transistor structures 231 for some WL select gates, and one for others. For example, WL select gate 229a has two TFT structures 231 and WL select gate 229b has one TFT structure 231. Each WL select gate region 303 allows individual portions of the memory array region 305 to be switchably coupled electrically to either the first or second word line plate hookup regions 301a, 301b. This may be accomplished by selecting one of the WL select gates 229. For example, WL select gate 229a will be assumed to be selected, whereas other WL select gates are not selected. This selects the two sets of circled memory cells 171a, 171b on this level. Note that when WL select gate 229a is selected, two TFT structures 231 are selected. In the configuration shown in FIG. 3B, two adjacent TFT structures 231 may drive two adjacent word lines, when select gate 229a is selected. However, other configurations are possible.

The set of the circled memory cells 171a may be considered to be associated with one word line. The set of the circled memory cells 171b may be considered to be associated with another word line. In other words, a word line may be defined as the conductive region running in the x-direction (in this example) that is associated with a single line of memory cells. Thus, memory cell 217a and others in group 171b may be selected by selecting WL select gate 229a. This also selects memory cells in group 171a, in this example. Memory cell 217b may be selected by selecting WL select gate 229b. Note that in this example, selection of WL select gate 229a may result in two word lines being selected. However, also note that in this example only one memory cell per NAND string is selected at a time. For example, memory cells in group 171a may be associated with an NSA 10, whereas memory cells in group 171b may be associated with an NSA11 (see FIG. 2G). In other words, group 171a may be associated with column C21, whereas memory cells in group 171b may be associated with column C22.

Also note that bit lines run horizontally (e.g., y-direction) across the memory cells in one embodiment such that memory cells in a row (from the perspective of FIG. 3B) may be selected. Thus, by selecting the appropriate bit line, one of the memory cells in group 171b may be selected when WL select gate 229a is selected. Also note that the driver connected to WPA1 should be selected when selecting WL select gate 229a if it is desired to select the word lines associated with WL select gate 229a. Note that WL select gates 229a allow a small portion of the block associated with WPA1 to be selected, which substantially reduces capacitive loading.

A given WL select gate 229 may be associated with a word line or a group of two or more word lines. This may allow the WL select gate 229 to select the associated word lines. A given WL select gate 229 may be coupled between the contact 227 associated with the word line plate and a given word line. Therefore, when the driver provides a voltage to the hook up region 301 via the contact 227, the WL select gate 229 is able to transfer the voltage to its associated word line. It may also be stated that a given WL select gate 229 may be coupled between the word line plate hookup region 301 and a given word line. This may allow the given WL select gate 229 to select the word line(s) associated with the WL select gate 229 (or to transfer the voltage to the word line(s)).

In FIG. 3A there is one TFT structure 231 in each WL select gate 229. In FIG. 3B there may be two TFT structures 231 in some WL select gates 229 (and one transistor structure 231 in some). However, there could be more or fewer transistor structures 231 per WL select gate 229. In FIG. 3B, TFT structures 231 are depicted in parallel. In one embodiment, there are two or more TFT structures 231 in series, but none in parallel. In one embodiment, there are two or more TFT structures 231 in parallel, but none in series (as in FIG. 3B). In one embodiment, there are two or more transistor structures 231 in series and two or more TFT structures 231 in parallel.

However, note that a word line select gate transistors comprising a thin film transistor having a body formed from a wide band gap semiconductor provides for good high voltage operation and low leakage current, as well as other advantages. This may enable a single (or fewer than otherwise) TFT structures 231 to be used in a WL select gate 229. For example, good operation can be achieved without having two TFTs 231 in series, in one embodiment of a word line select gate 229 comprising a thin film transistor having a body formed from a wide band gap semiconductor.

FIG. 3C1 is a schematic illustration of the slice of the block of FIG. 3A. This schematically illustrates one embodiment in which WL select gates 229 are coupled between word line plates (e.g., WPA1, WPB1) and word lines. In this example, most of the WL select gates 229 select two word lines (e.g., WL1 and WL2). However, the WL select gates 229 at each end select a single word line. These end word lines are each in communication with the first word line plate WPA1 via the WL select gates. Five of the word line pairs are in communication with the first word line plate WPA1 through the first set of WL select gates. The other six word line pairs are in communication with the second word line plate WPB1 through the second set of WL select gates. In this example, pairs of word lines may be joined by a conductive region near the WL select gate 229. However, each such pair may be electrically isolated from other WL pairs.

Each WL select gate 229 in the upper set may be selected independently of the others at this level. However, in some embodiments, the gate electrodes of transistors in the WL select gates from different levels are connected together. Depending on the architecture, other configurations may be possible. A z-decoder (not depicted in FIG. 3C1) may be used to select the WL select gate. An x-decoder for selecting the word line plates in depicted. FIG. 3C2 depicts a similar configuration in which all of the word line select gates 229 are connected to and select a pair of word lines.

Figure 3D:
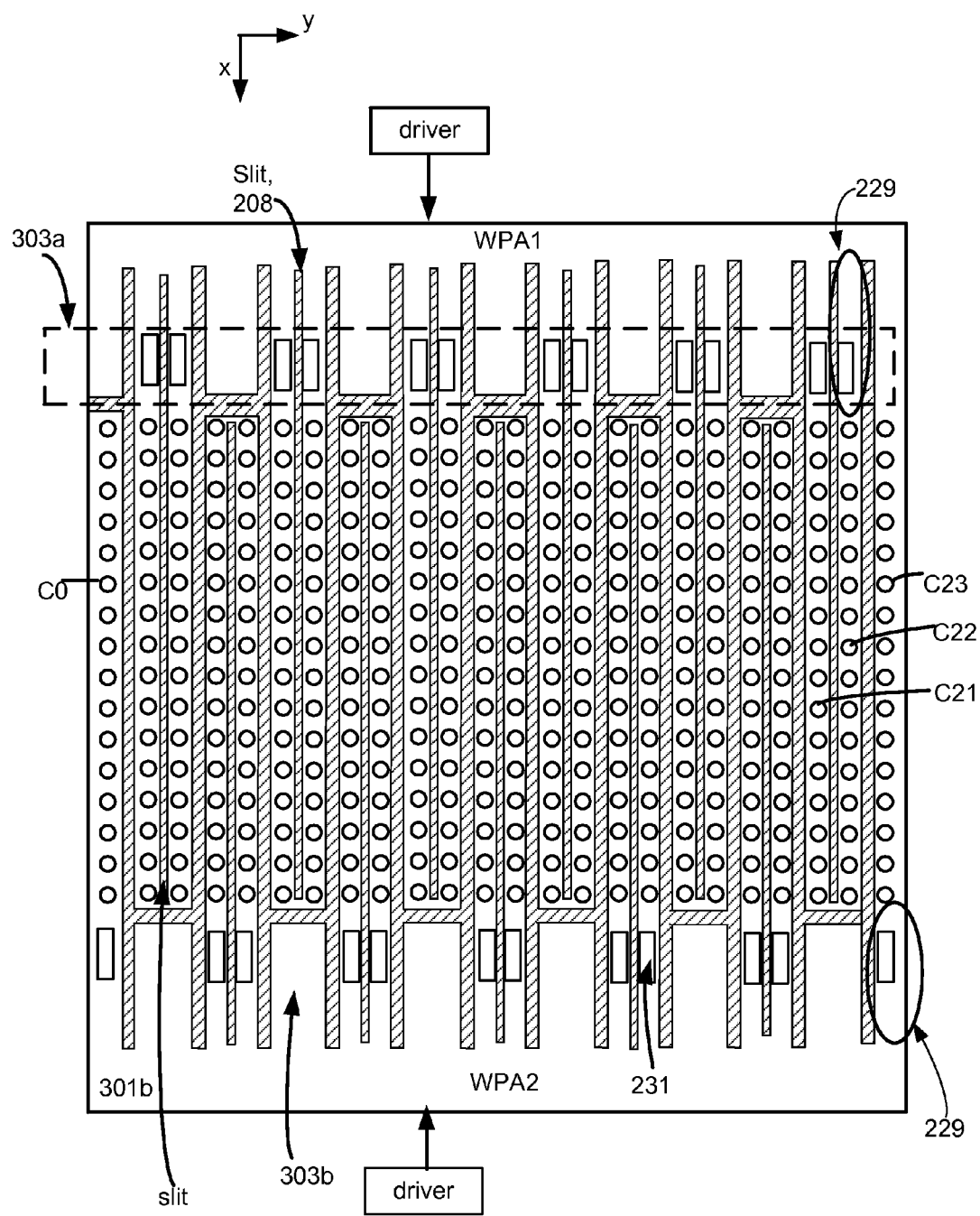
FIG. 3D is a diagram of one embodiment of a block having WL select gates that each select a single word line at this level of the memory array.

In one embodiment each WL select gate 229 selects a single word line. FIG. 3D is a diagram of one embodiment of a horizontal slice of a block having WL select gates 229 that each select a single word line at this level of the memory array. This example is similar to the embodiment of FIG. 3B, but slits 208 extend into the WL select gate region 303 to provide electrical isolation between a pair of adjacent WL select gates 229. This allows each member of the pair to select one word line.

Figure 3E:
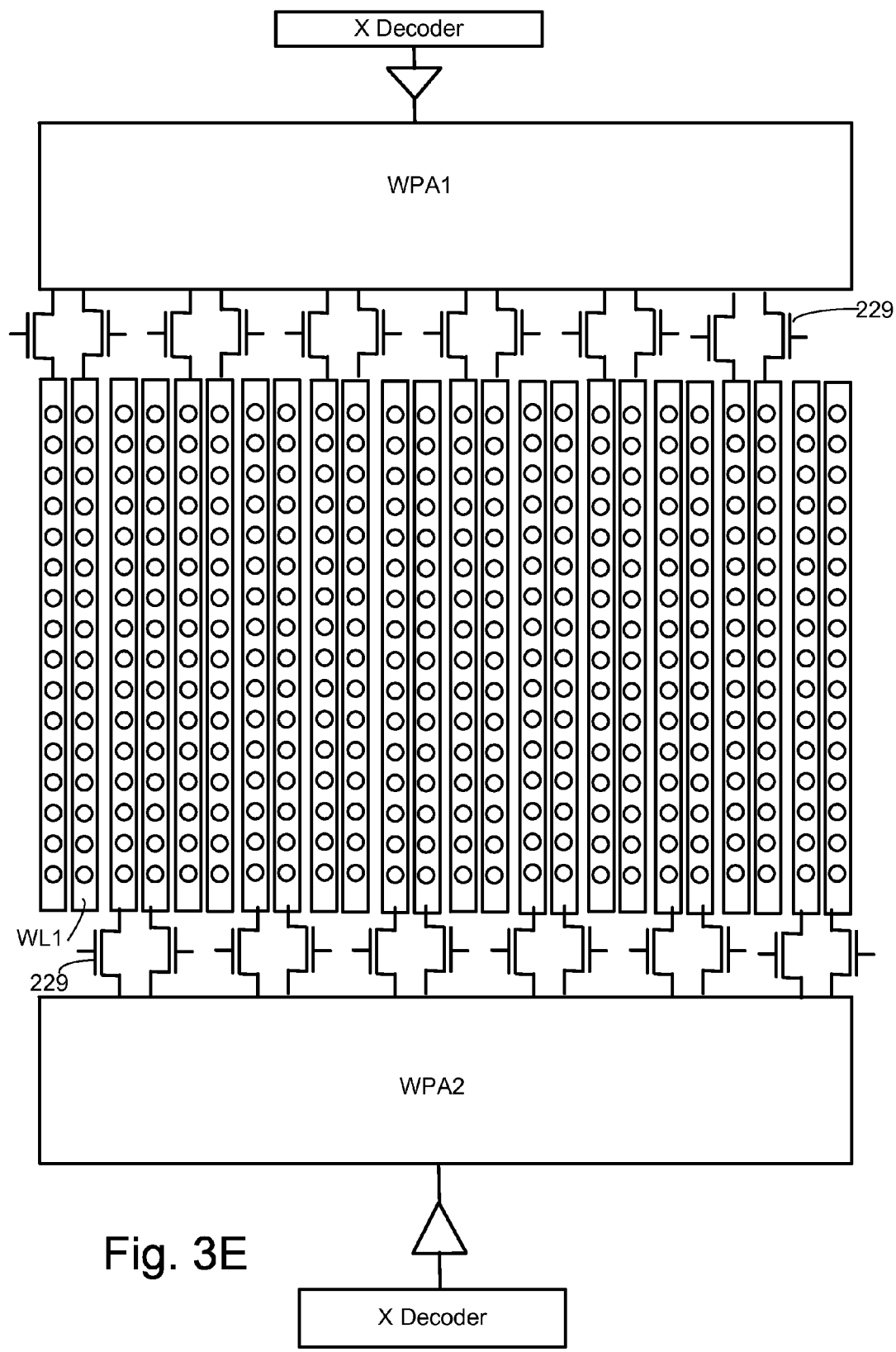
FIG. 3E is a schematic illustration of the block of FIG. 3D.
Figure 3F:
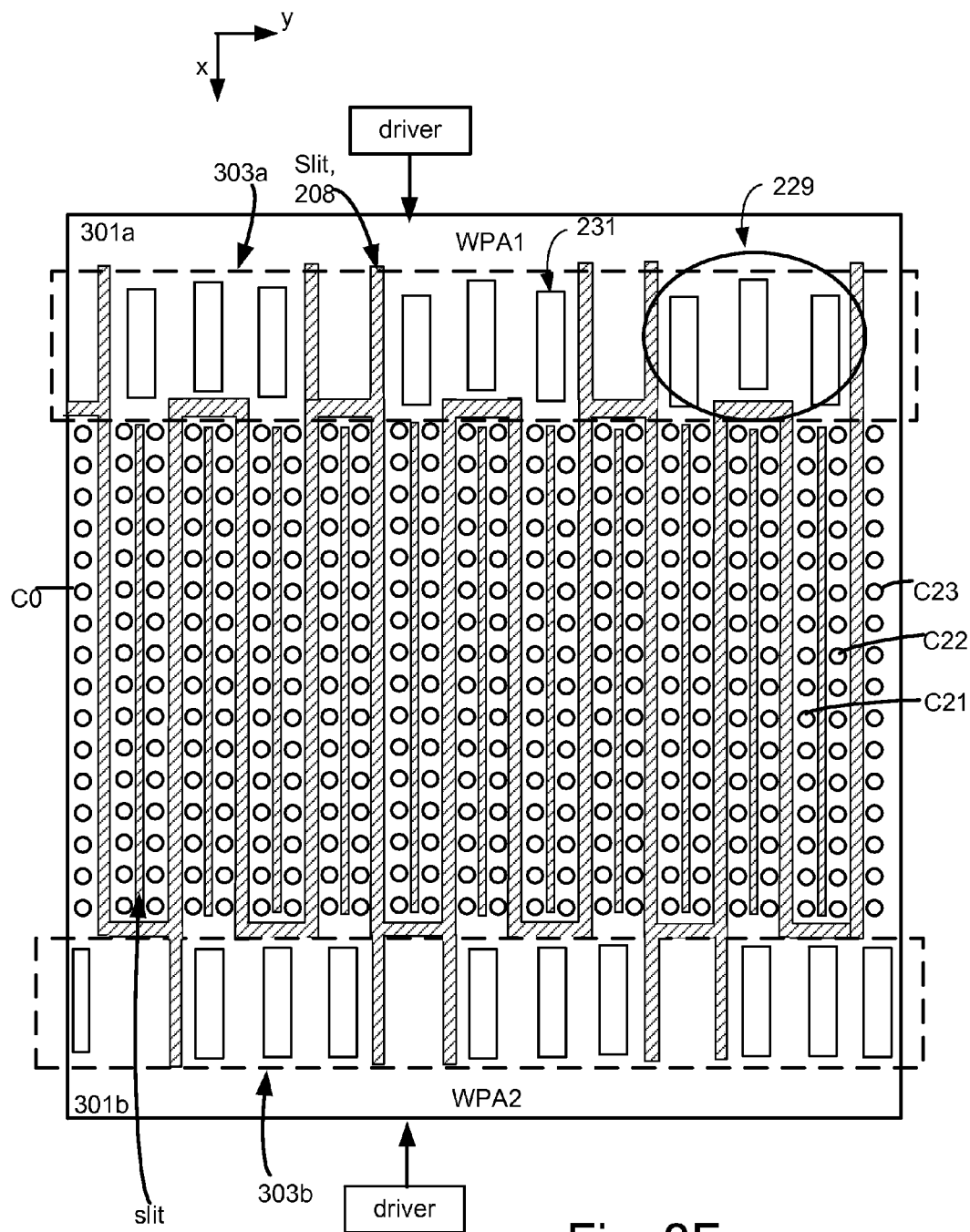
FIG. 3F shows one level of the block for one embodiment in which a WL select gate may select more than one word line.
Figure 3G:
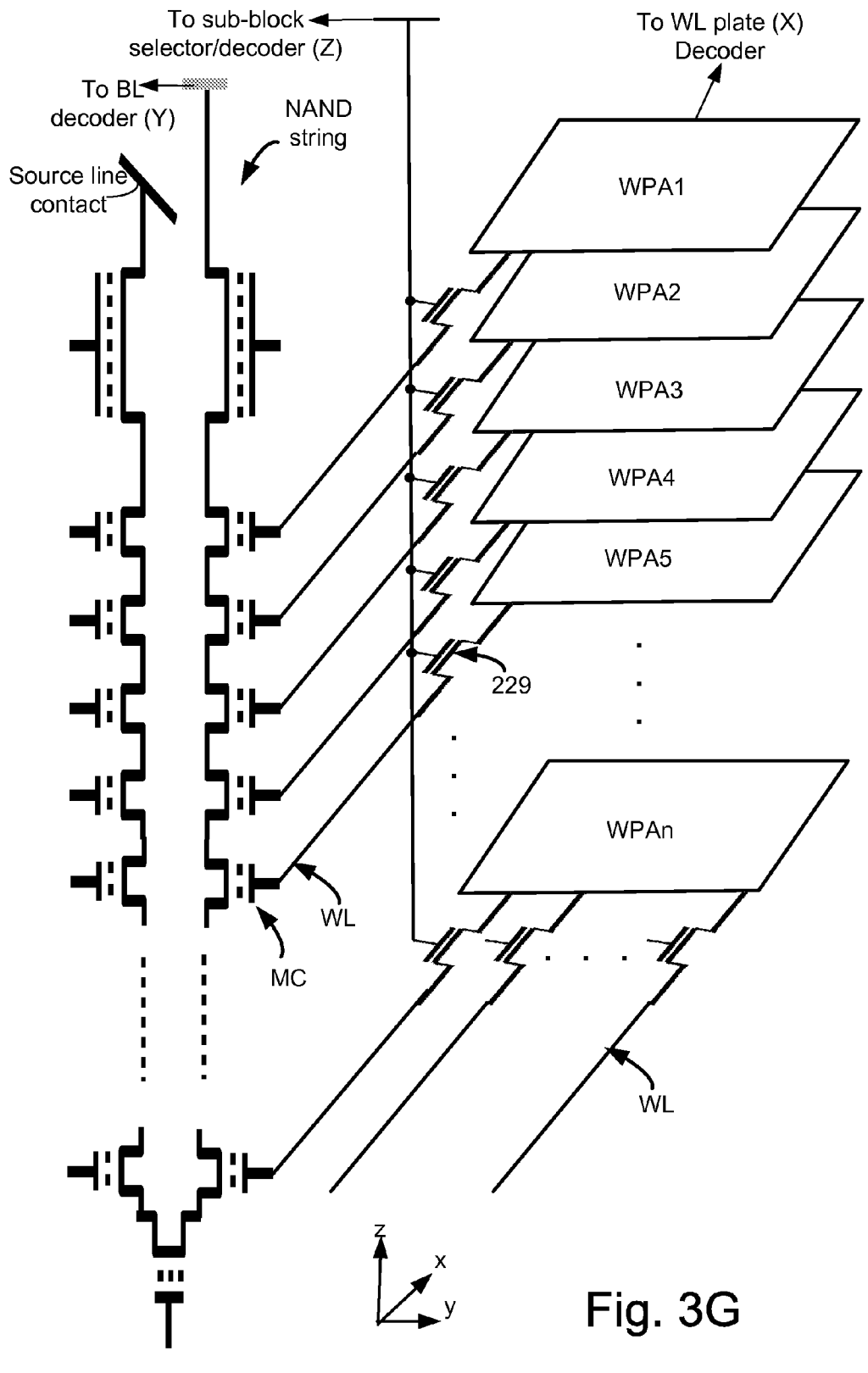
FIG. 3G is a diagram showing how WL select gates at different levels may have their gate electrodes connected.

FIG. 3E is a schematic illustration of the slice of the block of FIG. 3D. A z-decoder (not depicted in FIG. 3E) may select one of the WL select gates 229 from the upper group in order to select one word line (e.g., WL1) at this level of the memory array. Alternatively, the z-decoder may select one of the WL select gates 229 from the lower group to select one word line at this level of the memory array. Note that the z-decoder may select WL select gates that are associated with different levels of the memory array (not depicted in FIG. 3E) and that have their gate electrodes connected. In this example, each word line may be electrically isolated from others. The z-decoder may simultaneously select a set of WL select gates that are at different levels of the block. FIG. 3G depicts one example of this.

Note that a WL select gate 229 could select more than two word lines. FIG. 3F shows one level of the block similar to the example from FIG. 3A. In this example, a WL select gate 229 may select more than one word line. The upper WL select gate region 303a includes three WL select gates 229. Each of these selects four word lines. Those four word lines are each associated with plate WPA1. Each of the WL select gates 229 in region 301a has three TFT structures 231, in this example. The gates of each of the TFT structures 231 in the same WL select gate 229 can be tied together, such that they can easily be driven with the same voltage.

The lower WL select gate region 303b includes four WL select gates 229, in this example. Two of the WL select gates 229 select four word lines. The WL select gate 229 to the right selects three word lines. The WL select gate 229 to the left selects a single word line. Other configurations could be used.

FIG. 3G is a diagram showing how WL select gates 229 at different levels of a block may have their gate electrodes connected. As noted herein, a WL select gates 229 may comprise one or more TFT structures 231. Thus, in some embodiments, WL select gates 229 in FIG. 3G include a single TFT structure 231.

The diagram shows word line plates WPA1-WPAn. Each of these plates is at a different level of the 3D memory device. The depicted plates WPA1-WPAn may be in the same block. For example, referring to FIG. 2G, one plate could be at level WL6, one at level WL5, etc. Six plates are depicted for ease of illustration; there may be any number of levels. Also note that at each level there may be many plates. In one embodiment, there are two plates per block per level, such as in FIG. 3A. The other plate in this block (per level) is not depicted in FIG. 3G for ease of illustration. There may be other blocks in the 3D NAND device.

At a given level, a WL select gate 229 has one terminal (e.g., source or drain) connected to its respective word line plate (e.g., WPAn). Another terminal (e.g., drain or source) of the WL select gate 229 is connected to its respective word line (WL). As noted above, a WL select gate 229 could be associated with (e.g., could select) more than one WL. The word line connects to control gates of memory cells (MC). One U-shaped NAND string is depicted to show the connection between memory cells and WL select gates 229. However, typically there are many NAND strings per block. Thus, a word line may be associated with one memory cell on many different NAND strings. Note that each memory cell on a given NAND string connects to a different word line in one embodiment. Thus, each memory cell that is associated with a given word line is part of a different NAND string in one embodiment.

The gate electrodes of the depicted WL select gates 229 in FIG. 3G are connected together by an electrically conductive line. Thus, these WL select gates 229 form one group that may be selected in common by the z-decoder. Therefore, word lines at different levels of a block may be selected together in one embodiment. This may be referred to herein as "sub-block" decoding.

The gates of the WL select gates 229 are connected to a sub-block or z decoder, in one embodiment. One end of the NAND string is connected to a bit line (BL) or y-decoder, in one embodiment. Note that other NAND strings associated with the same bit line may be selected together with the NAND string that is depicted in FIG. 3G. Each word line plate is connected to a word line (WL) plate or x-decoder, in one embodiment. Thus, 3D decoding is possible, in one embodiment.

As was mentioned above, in some conventional 3D memory arrays all memory cells associated with that WL plate are electrically stressed. The following example will be provided to illustrate a problem with a conventional architecture that does not have the ability to select relatively small sections of the memory, such as individual word lines. Suppose we want to program one memory cell (selected cell) in a NAND string. This may include biasing the respective WL to a high positive bias (e.g. 18-25V). At the same time, for the selected NAND string to which the selected cell belongs, the source line may be biased to low potential (e.g. 0V) and the BL of that string may also be biased to low potential (e.g. 0V). At the same time SGD and SGS of the selected string may be biased to a high enough potential (higher than SGD & SGS Vt), so that SGD and SGS transistors are turned on. This transfers BL and SL potential (here 0V) to the channel (body polysilicon of the string). This creates a high potential difference between the selected WL (control gate of the selected cell) and the channel of the selected string.

Electrons tunnel from the channel to charge trapping layer of the selected cell and the cell is programmed. However in order to bias the selected WL (of the selected cell of the selected string), the whole WL plate within one block needs to be biased in some conventional systems. For others half of the WL plate needs to be biased if it is a comb structure. Therefore, all cells on the same WL plate, belonging to other UNSELECTED strings within the same block, are biased to the same potential of 18-25V. These cells are UNSELECTED cells, not intended to be programmed. For them, their WL is "unintentionally selected." Therefore, these unselected cells are subject to stress every time any cell belonging to the same WL plate is programmed. Hence, the issue of program disturb.

To prevent unselected cells in unselected strings, especially on the same BL, from being programmed during selected cell program operation, all SGD and SGS transistors in unselected strings may be biased to low potential (below SG Vt, e.g. 0V). Then, SG transistors are shut off, and the BL potential (here 0V), and source line potential (here 0V) are not transferred to the unselected string channels. In other words, by shutting SGD and SGS transistors off in unselected strings, the channels of those strings become isolated from BL and SL potential. Meanwhile there is a high potential on the selected WL. This potential will be coupled to the isolated channel leading to the channel potential boosting. Boosted channel potential can be very high, e.g. 10-15V. The potential difference between the selected WL and boosted channel potential in unselected strings becomes low, not sufficient to program/disturb unselected cells (ideally). However, the possibility of program disturb of unselected cells can be an issue. In embodiments disclosed herein, with WL select gate selecting just one WL (or a few WLs), disturbing the other cells (or majority of the cells) belonging to the same WL plate within block and sharing the same BL may be avoided.

FIG. 4A1 is a diagram of one embodiment of a WL select gate 229 in WL select gate area 303 between a memory array region 305 and a word line hookup area 301. The general region of the WL select gate 229 is circled. Memory holes (MH) in the memory array region 305 are also depicted. The word lines (WL) are formed from metal (e.g., tungsten), in one embodiment. However, another conductor, such as heavily doped polysilicon, could be used for the word lines. The diagram is consistent with FIG. 3A. There are several slits 208, which may provide electrical isolation between memory cells associated with different word lines. The memory cells may be formed in the word lines. The WL select gate 229 may select both word lines.

In this example, the WL select gate 229 comprises a single thin film transistor (TFT) 231. A portion of the TFT 231 may be formed in what is referred to herein as a Z-hole portion that may be formed in a wide band gap semiconductor (e.g., a semiconductor oxide). The wide band gap semiconductor serves as the TFT body (as well as source and drain in this embodiment). Example materials for the wide band gap semiconductor include, but are not limited to, InGaZnO, InZnO, HfInZnO, ZrInZnO, and ZnInSnO. The wide band gap semiconductor is an oxide semiconductor (e.g., metal oxide semiconductor), in one embodiment.

In one embodiment, Z-holes are similar to memory holes in that they may be columnar structures. However, the z-holes may have a different horizontal (e.g., xy plane) cross sectional shape from the memory holes. The Z-hole is of roughly rectangular shape in FIG. 4A. After lithography and etch process they can become oval shape. In one embodiment, Z-holes have a square shape in layout (same as one embodiment of memory holes). After lithography and etch process they can become circular in shape. For a circular shaped Z-hole, several TFT structures in series may be used for better TFT control, in one embodiment.

The Z-hole portion of the TFT 231 in general includes a gate dielectric layer 402, a gate electrode layer 404, and a core 406, in one embodiment. The gate dielectric layer 402 may be formed from one or more layers of a dielectric such as silicon oxide and silicon nitride. The gate electrode layer 404 may be formed from a conductor material such as highly doped polysilicon. The gate electrode layer 404 has a work function that is greater than a work function of the wide band gap semiconductor, in some embodiments. Example materials for the gate electrode layer 404 include, but are not limited to, molybdenum, copper, doped polysilicon, tungsten. Many other materials have a work function that is sufficiently high.

The core region 406 may be an insulator such as silicon dioxide. As noted, the region around the Z-holes may be a wide energy band gap semiconductor. Various portions of this region may serve as the body, drain, and source for one or more of the transistors. In FIG. 4A, the bodies are roughly labeled to on the right and left of the gate dielectric layer 402. Source and drains may be doped. Note that the body, source, and drain may all be formed from various regions of the wide band gap semiconductor. The location of the source and drain can vary. In one embodiment, the source and drains begin roughly at the edge of the gate dielectric layer 402. This is will discussed more fully below.

Note that the source and drain can be formed from the word line material in whole or in part. Note that the word line material (e.g., tungsten) may be used to form the word line hookup region 301. For example, the source and/or drain can be formed from tungsten used to form the word line and/or word line hookup region 301 that is adjacent to the wide band gap semiconductor. The source and drain can be formed from the wide band gap semiconductor in whole or in part. The source and drain of a given TFT 231 can be formed from both the wide band gap semiconductor and the word line material (e.g., tungsten). FIG. 4A2 depicts one embodiment in which the drain is formed from a portion of the metal of the word lines adjacent to the wide band gap semiconductor body and a portion of the wide band gap semiconductor. Also, the source is formed from a portion of the metal of the word line hookup region 301 adjacent to the wide band gap semiconductor body and a portion of the wide band gap semiconductor.

Another way of stating the foregoing is as follows. The wide band gap semiconductor near the metal word line may operate as the drain (or source), and the wide band gap semiconductor near the metal word line hook up 301 may operate as the source (or drain). Alternatively, the metal word line adjacent to wide band gap semiconductor may operate as the drain (or source), and the metal word line hook up 301 adjacent to the wide band gap semiconductor may operate as the source (or drain). Still another possibility is for both the wide band gap semiconductor near the metal word line and the metal word line adjacent to the wide band gap semiconductor to operate as the drain (or source), whereas both the wide band gap semiconductor near the metal word line hook up 301 and the metal word line hook up 301 adjacent to the wide band gap semiconductor may operate as the source (or drain).

In one embodiment, the TFT structure 231 may be considered to be a metal-wide band gap semiconductor-metal transistor. Note that the wide band gap semiconductor does not need to be intentionally doped. Also, the wide band gap semiconductor could be doped uniformly. Thus, non-uniform doping of the wide band gap semiconductor (e.g., N+/n/N+) is not required. Thus, in the example of FIG. 4A2, the drain and source regions in the wide band gap semiconductor could be regions of the wide band gap semiconductor that have a higher net doping concentration than the body. However, doping the wide band gap semiconductor at a higher level for the source and drain is not a requirement.

In one embodiment, a single one of the TFT structures 231 may operate as two transistors in parallel. The TFT structure 231 may, alternatively, be considered to be a dual gate/dual body device. The gate electrode layer 404 may serve as two gate electrodes that are back to back, separated by the core 406. These two gate electrodes may be electrically connected. Also, these two gate electrodes may be driven by the same signal (e.g., voltage) during operation. The gate dielectric layer 402 may serve as two separate gate dielectric layers, one for each transistor. FIG. 4D, to be discussed below, provides additional details of one embodiment.

Figure 4B:
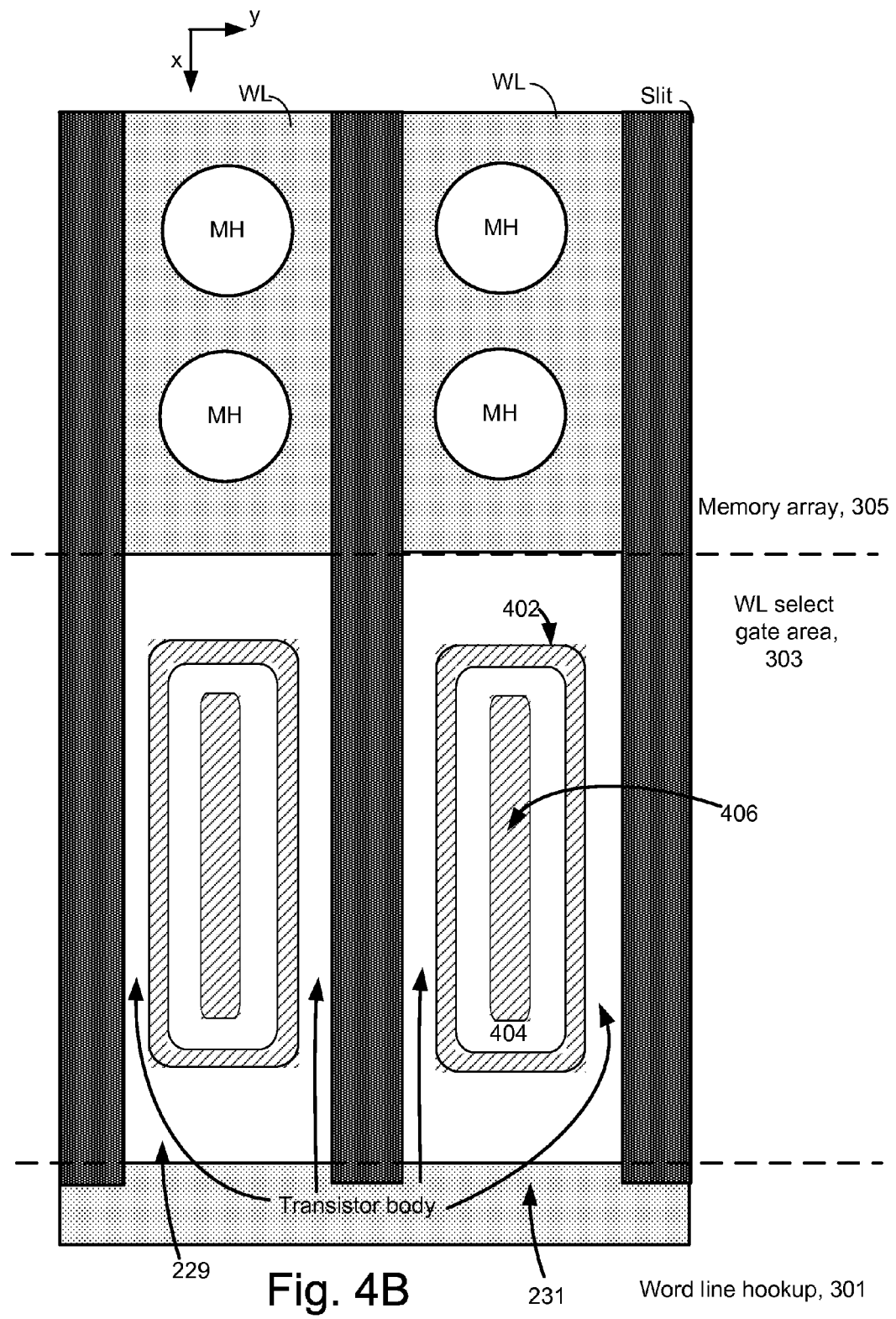
FIG. 4B is a diagram of one embodiment of WL select gates in a WL select gate region between a memory array and a word line hookup area in which each word line is selected independently.

FIG. 4B is a diagram of one embodiment of two WL select gates 229 in a WL select gate area 303 between a memory array and a word line hookup area 301 in which each word line is selected independently. In this example, each WL select gate 229 is formed from a single TFT structure 231. The TFT structure 231 is similar to the one of FIG. 4A1. In one embodiment, the word lines are metal. An example metal is tungsten. Also, the word line hookup region 301 may be formed from the same material as the word lines. Thus, the word line hookup region 301 may be metal (e.g., tungsten). The TFT 231 body is formed from a wide band gap semiconductor, as discussed in FIG. 4A1, in one embodiment. The drain and source may be formed in whole or in part from the wide band gap semiconductor. The drain and source may be formed in whole or in part from the metal of the word line and/or word line hookup that is adjacent to the wide band gap semiconductor. Thus, the drain and source are not labeled in FIG. 4B. It is possible for the source and drain regions, in this diagram, as well as others herein, to be switched.

Figure 4C:
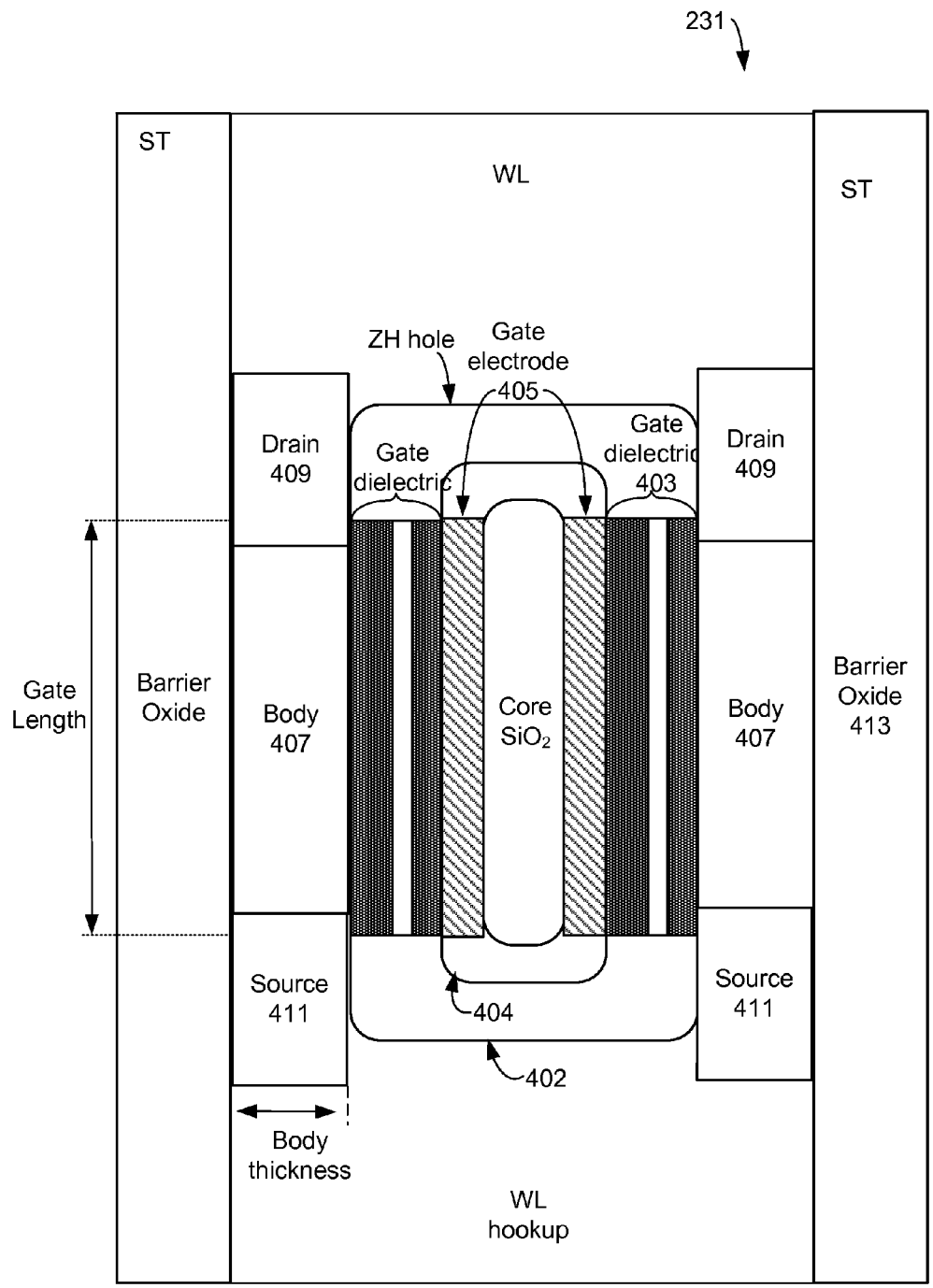
FIG. 4C is a diagram illustrating various elements of a TFT structure in accordance with one embodiment.
Figure 4D:
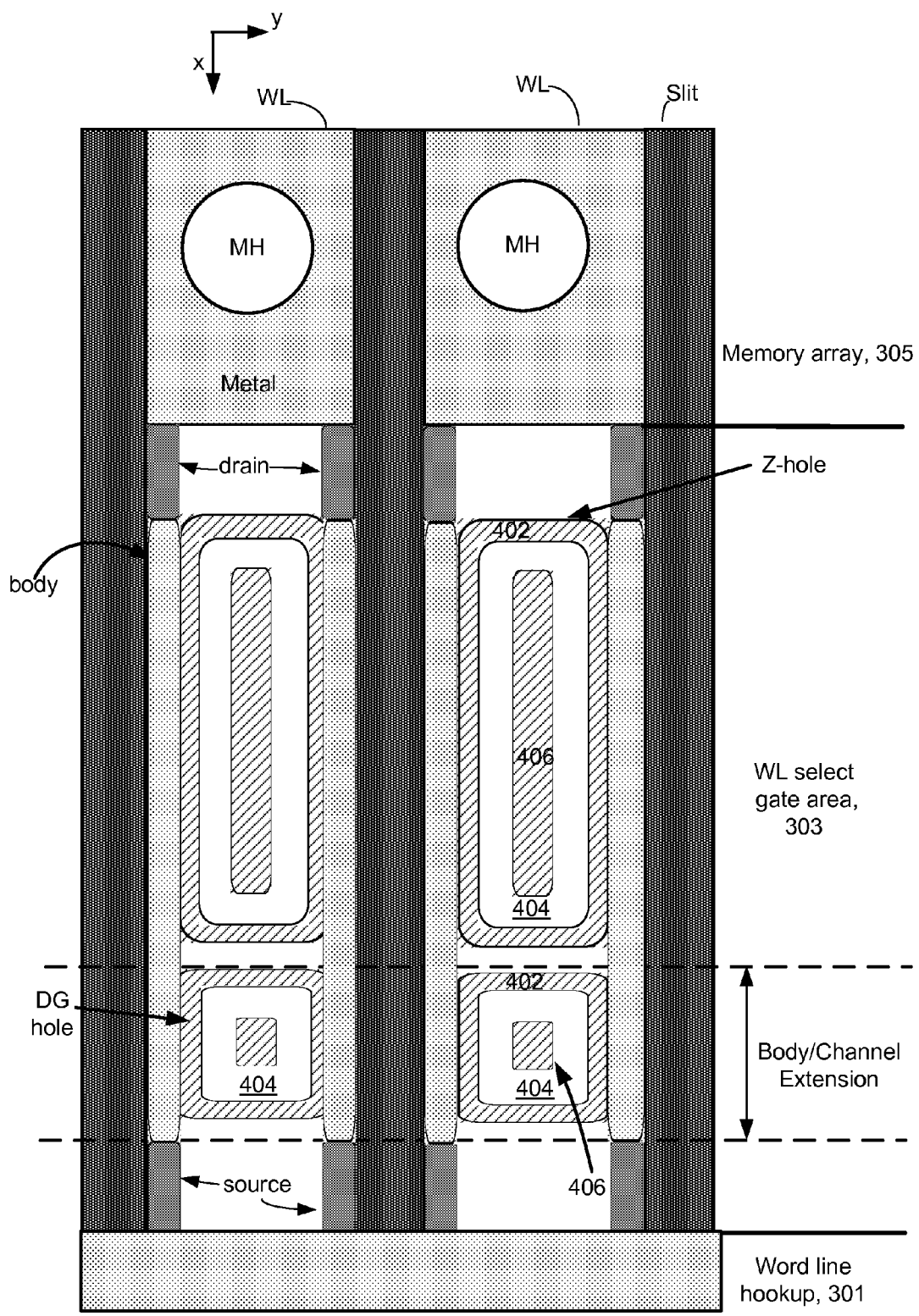
FIG. 4D depicts one embodiment of TFTs having a body/channel extension.

FIG. 4C is a diagram illustrating various elements of a TFT structure 231 in accordance with one embodiment. FIG. 4C corresponds to the TFT structure of the WL select gate 229 example of FIG. 4A. FIG. 4C depicts a transistor structure 231 that may operate as a dual gate/dual body device. Alternatively, the device could be considered to operate as two TFTs in parallel. Various elements such as a gate electrode 405, gate oxide 403 (or gate dielectric), body, source and drain are represented. Note that the device is represented as having two gate electrodes 405, two gate dielectrics 403, two bodies, etc. Starting from the center of the transistor structure and working outward, the core may be an insulator (e.g., dielectric) such as $SiO_2$.

Moving outward, a gate electrode 405 is depicted on each side of the core. Note that the gate electrodes may be formed from a portion of the gate electrode layer 404. The gate electrode layer 404 may be formed from doped polysilicon. This doped polysilicon may completely surround the core. However, for purpose of analysis a gate length is shown in FIG. 4C. Note that the length of the gate electrode 405 may be adjusted to achieve desired performance, such as leakage current.

Moving further out, there is a gate dielectric 403 between each gate electrode and the corresponding body. The gate dielectric may be formed from portions of the dielectric layer 402. In one embodiment, the gate dielectric is formed from several layers, such as silicon oxide, silicon nitride, silicon oxide (e.g., ONO).

A transistor body 407 is depicted adjacent to each gate dielectric 403. The body 407 may be formed from a wide band gap semiconductor, as discussed in connection with FIG. 4A. The body thickness is depicted in FIG. 4C. To each side of each body 407 are a drain 409 and a source 411. The positions of the drain 409 and source 411 may be switched. The drain 409 and a source 411 may also be formed from the wide band gap semiconductor. The wide band gap semiconductor may be doped in the drain 409 and source 411 regions. The drain 409 and source 411 may be formed in whole or in part from the wide band gap semiconductor. The drain 409 and source 411 may be formed in whole or in part from the metal of the word line and/or word line hookup that is adjacent to the wide band gap semiconductor.

A portion of the slit (ST) may serve as a barrier oxide 413 next to each body 407. Note that the slits (ST) in FIG. 4C may correspond to the slits in FIG. 4A. The TFT of FIG. 4C may be referred to as a symmetric configuration. In one embodiment, the TFT has an asymmetric configuration.

The body 407 may also be referred to as a channel. In the embodiment depicted in FIG. 4C, the body 407 does not extend past the gate electrode 405. However, the body 407 could extend beyond the gate electrode 405, as will be described below. The location of the source 411 and drain 409 may be different from depicted in FIG. 4C.

In one embodiment, the gate electrode 405 of the transistor is doped P+. In one embodiment, the word lines are metal, such as tungsten. However, heavily doped polysilicon (e.g., P+ or N+) word lines are possible.

In one embodiment, the transistors are thin film transistors (TFT). The transistor behaves as an NFET device, in one embodiment. However, the TFT could behave as a different type of device, such as PFET.

FIG. 4D depicts one embodiment of TFTs 231 having a body/channel extension. This may also be referred to as having an offset source or gate/source offset. Depending on the configuration, this may also be referred to as having an offset drain or gate/drain offset. In addition to the z-holes in which the gate dielectric 402 and gate electrodes 404 reside, there are two dummy gate holes ("DG-hole"). In this case, there is one dummy gate hole between each z-hole and the word line hookup region 301. An alternative is to have the two dummy gate holes between the z-holes and the memory array 305. This may be used to form an offset drain or gate/drain offset.

The extent of one of the body/channel extensions is labeled. There are four body/channel extensions in FIG. 4D. The location of four drain regions are also roughly depicted, for an embodiment in which they are formed from the wide band gap semiconductor. As can be seen, the sources are offset from the gate electrode layer 404 of the z-hole. Alternatively, the drains could be offset from the gate electrode layer 404. The body, body extension, source, and drain may all be formed from a wide band gap semiconductor, such as an oxide semiconductor. The drain and source may be formed in whole or in part from the wide band gap semiconductor. The drain and source may be formed in whole or in part from the metal of the word line and/or word line hookup (which may be metal) that is adjacent to the wide band gap semiconductor.

The dummy gate holes may be filled similar to how the z-holes are filled. Thus, there may be a gate dielectric layer 402, a gate electrode layer 404, and a core 406, in one embodiment. However, the gate electrode layer 404 does not need to be electrically connected to any signal line. In other words, the dummy gate does not need to be driven during operation. One reason for connecting the dummy gate to a separate signal line is to fine-tune transistor operation, such as for better control of drive current and leakage.

Figure 4E:
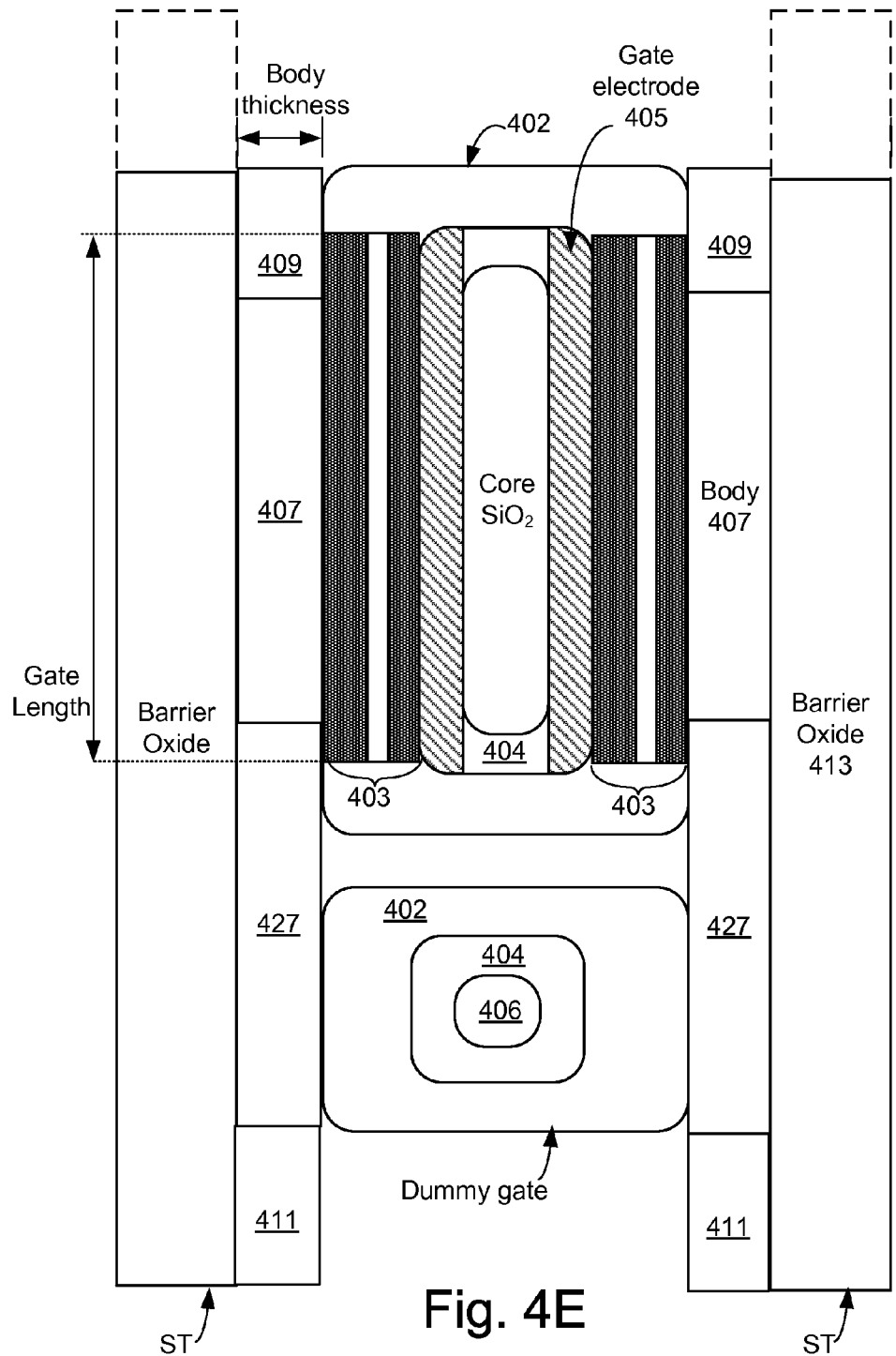
FIG. 4E is a diagram illustrating various elements of a TFT structure in accordance with one embodiment.

FIG. 4E is a diagram illustrating various elements of a TFT structure 231 in accordance with one embodiment. FIG. 4E shows a single transistor structure 231 for an embodiment with an extended channel. The single transistor structure 231 is similar to the one depicted in FIG. 4D, with differences including an extended body/channel 427, and the drain 409 being offset from the gate electrode 405. Elements of the dummy gate are also depicted.

In the embodiment depicted in FIG. 4E, the body 407 extends past the gate electrode 405, as a result of the body/channel extension 427. The location of the source 411 and drain 409 are shown on each side of the body 407. The body/channel extension 427 could also be referred to as a gate/source offset in that the source 411 is offset from the gate electrode 405. Note that the body (channel) could be extended on the drain side in addition to, or instead of, the extension on the drain side. The drain and source may be formed in whole or in part from the wide band gap semiconductor. The drain and source may be formed in whole or in part from the metal of the word line and/or word line hookup that is adjacent to the wide band gap semiconductor.

Note that the length of the gate electrode may be adjusted to achieve desired performance, such as leakage current. The channel extension 427 may reduce the on current ($I_{on}$), as a result of higher series resistance. However, $I_{on}$ can be increased by modulating the channel length. A tradeoff can be made between leakage current and $I_{on}$ by selection of the gate length and the channel extension 427.

A TFT having a channel extension may significantly reduce GIDL (Gate Induced Drain Leakage). A possible reason for this is a reduction of band to band (BTB) carrier generation. A TFT having a channel extension may allow for a higher gate to drain voltage during operation without encountering problems such as GIDL. In one embodiment, GIDL can be well controlled, even for potential difference between gate and drain 25V or more.

A TFT having a channel extension may significantly reduce source to drain breakdown. A TFT having a channel extension may have low GIDL, low leakage current, higher breakdown voltage, and additional room to optimize performance and $I_{on}$/leakage current tradeoffs.

Figure 4F:
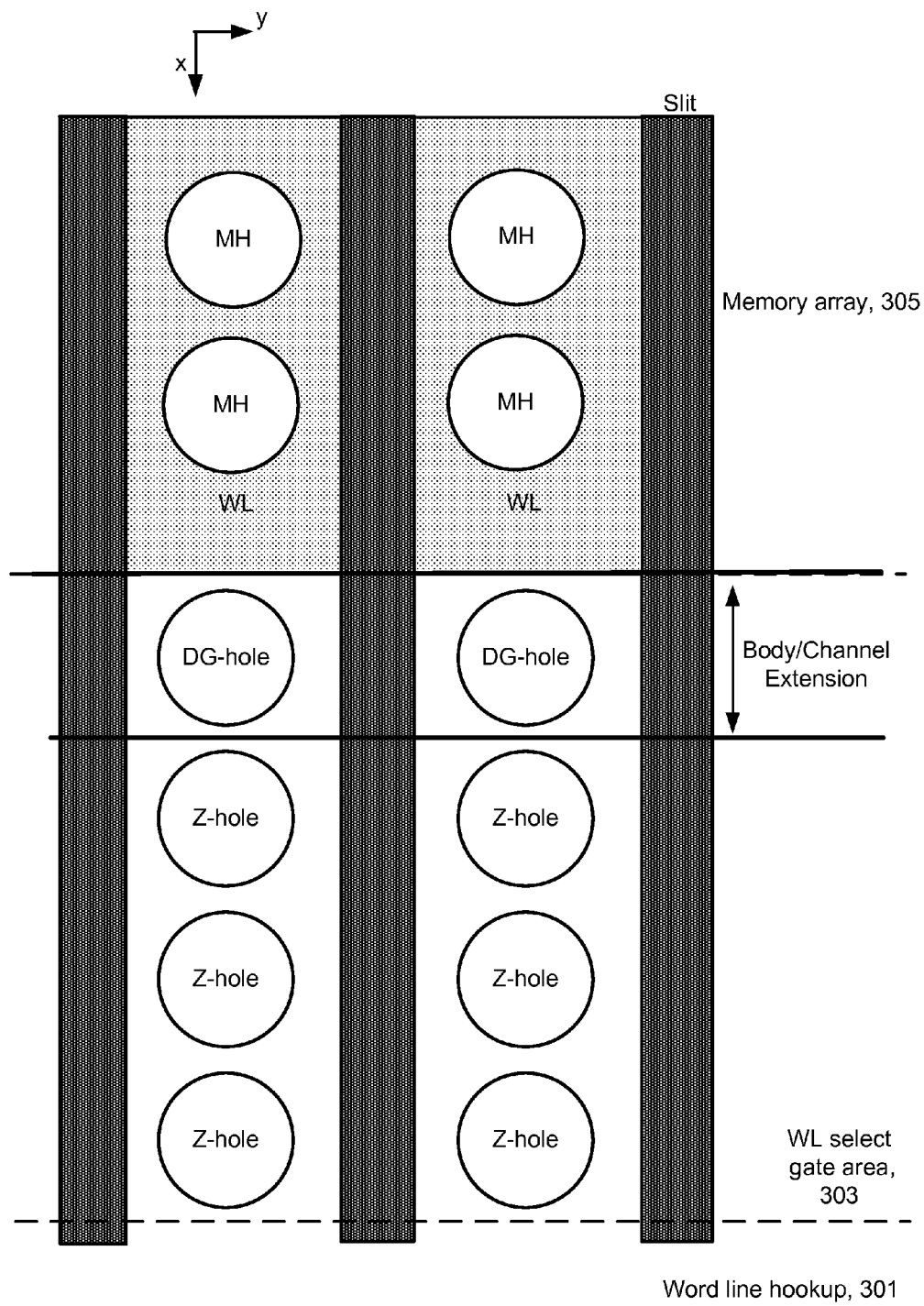
FIG. 4F is a diagram of a process layout in accordance with one embodiment.

FIG. 4F is a diagram of one possible layout for a TFT, in accordance with one embodiment. In this embodiment, there are three z-holes associated with each WL. These three z-holes may be used for forming a single TFT. Alternatively, the three z-holes may be used to form three TFTs in series (for each WL). There is a DG-hole associated with each WL for forming a dummy gate. In this example, the DG-hole is near the memory array 305, instead of the word line hookup 301. The region of the word line around the z-hole (e.g., between the z-hole and the slits) will be the body of the TFTs. The region of the word line around the DG-hole (e.g., between the DG-hole and the slits) will be the body/channel extension. The body and body/channel extension are formed from a wide band gap semiconductor, in one embodiment.

Figure 5A:
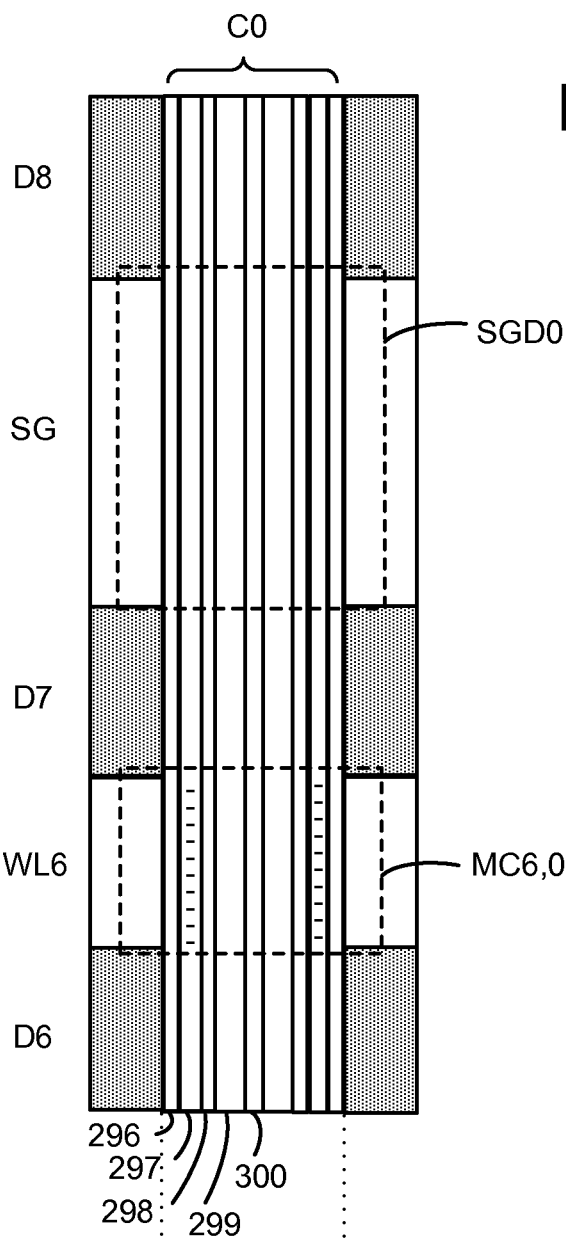
FIG. 5A depicts a close-up view of a region of the column C0 of FIG. 2G, showing a drain-side select gate SGD0 and a memory cell.
Figure 5B:
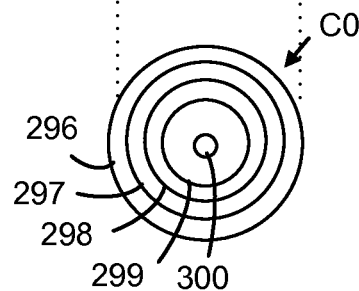
FIG. 5B depicts a cross-sectional view of the column C0 of FIG. 2F.

FIG. 5A depicts a close-up view of a region 269 of the column C0 of FIG. 2G, showing a drain-side select gate SGD0 and a memory cell. The region shows portions of the dielectric layers D6 to D8 and the conductor layers WL6 and SG. Each column includes a number of layers which are deposited along the sidewalls of the column. These layers can include oxide-nitride-oxide and polysilicon layers which are deposited, e.g., using atomic layer deposition or CVD. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300. Additional memory cells are similarly formed throughout the columns. FIG. 5B depicts a cross-sectional view of the column C0 of FIG. 2F. Each layer is ring-shaped in one possible approach, except the core filler which is cylindrical.

When a memory cell is programmed, electrons are stored in a portion of the charge trapping layer which is associated with the memory cell. For example, electrons are represented by "−" symbols in the charge trapping layer 297 for MC6,0. These electrons are drawn into the charge trapping layer from the polysilicon body, and through the tunnel oxide. The threshold voltage of a memory cell is increased depending on the amount of stored charge. During an erase operation, a voltage in the polysilicon body may be raised due to GIDL, while a voltage of one or more selected word line layers floats. GIDL may occur due to high potential difference between bit line bias and drain side select gate bias (SGD), and similarly, between source line bias and source side select gate bias (SGS). The voltage of the one or more selected word line layers is then driven down sharply to a low level such as 0 V to create an electric field across the tunnel oxide which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel oxide is relatively small, and no, or very little, hole tunneling will occur. If word lines are floated, they will be electrically coupled to the channel. As a result their potential will rise resulting in low potential difference between channel and respective word lines. Memory cells of the unselected word lines will experience little or no Vth downshift, and as a result, they will not be erased. Other techniques may be used to erase.

Figure 5C:
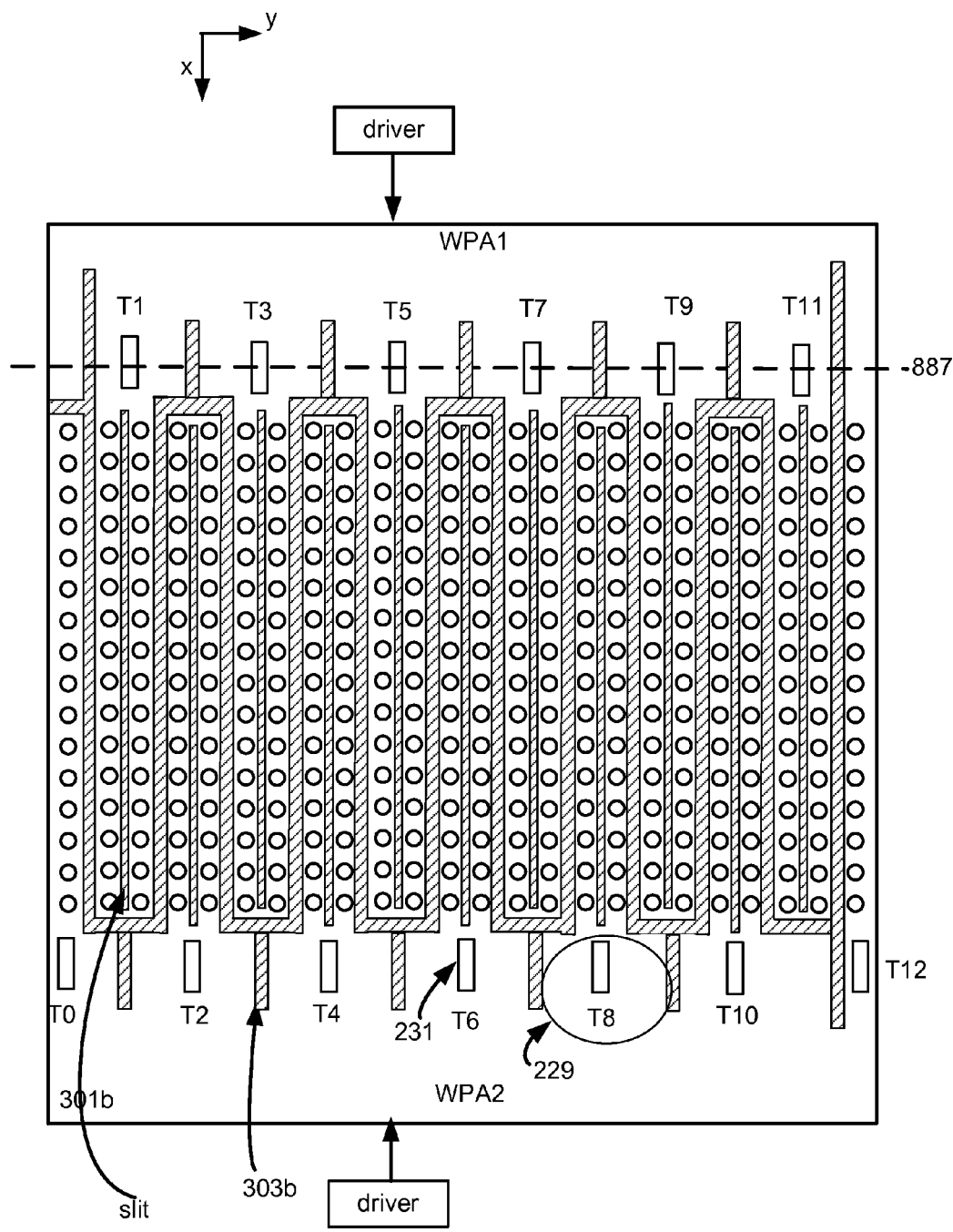
FIG. 5C is a diagram of one embodiment of a block of a 3D stacked memory array.

FIG. 5C is a diagram of one embodiment of a horizontal (e.g., xy plane) slice of a block of a 3D stacked memory array. In this embodiment, there is one WL select gate 229 per each two word lines. Each WL select gate 229 has a single TFT 231 in this example. At the bottom are WL select gates T2, T4, T6, T8, T10, and T12. Odd numbered WL select gates are at the top.

Figure 5D:
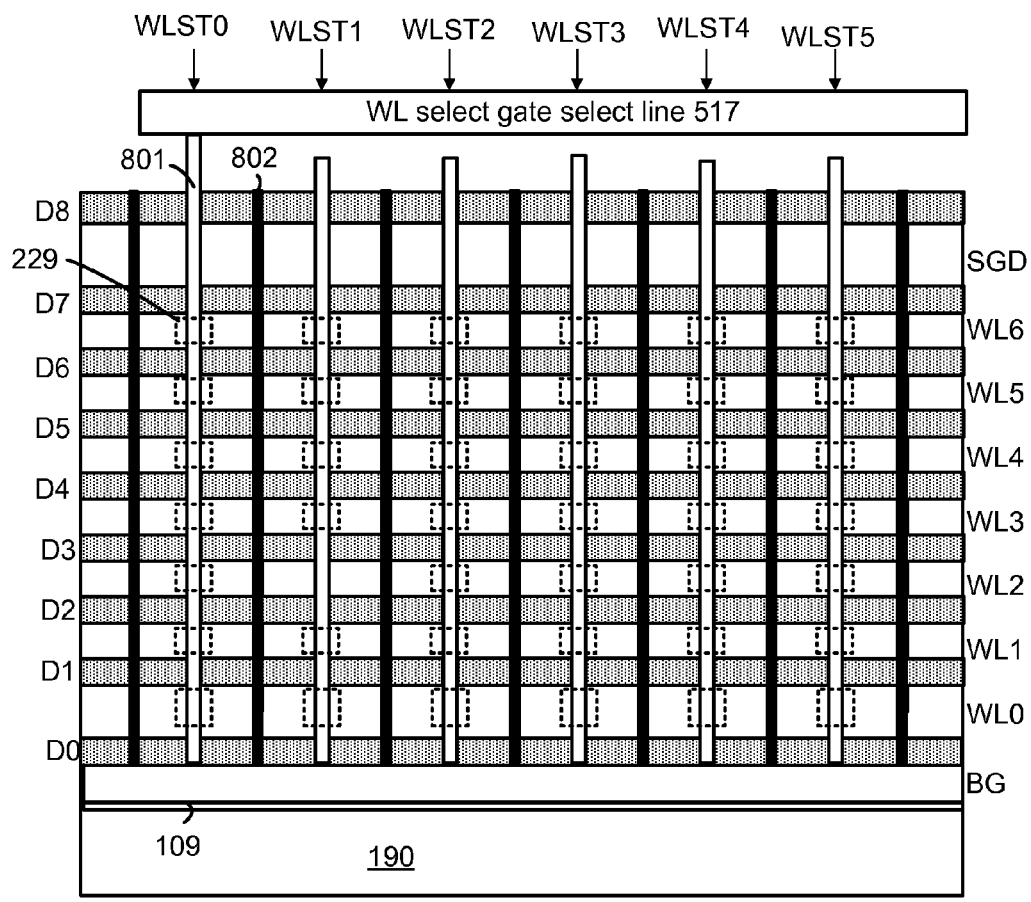
FIG. 5D shows a cross-sectional view of the block of a 3D non-volatile memory device along line 887 in a WL select gate region of FIG. 5C.

FIG. 5D shows a cross-sectional view of the block of a 3D non-volatile memory device along line 887 in a WL select gate region of FIG. 5C. The diagram is similar in perspective to the one of FIG. 2G that depicts a cross section showing NAND strings in a memory array. Columns of WL select gates are depicted in the multi-layer stack. One column 801 is labeled. The stack includes a substrate 190, an insulating film 109 on the substrate. In one embodiment, the substrate 190 is crystalline silicon. The slit 802 from FIG. 5C is also depicted with other slits. A portion of one WL select gate select line 517 that connects to column 801 is also depicted. Other WL select gate select lines (not depicted in FIG. 5D) connect to other WL select gate columns. A WL select gate select line 517 may connect to a decoder to allow selection of the WL select gates in a column. Dashed lines on the WL select gate columns depict WL select gates 229, as discussed further below. WL0-WL6 represent word line layers or word line layer portions which are at levels L0-L6, respectively.

Figure 5E:
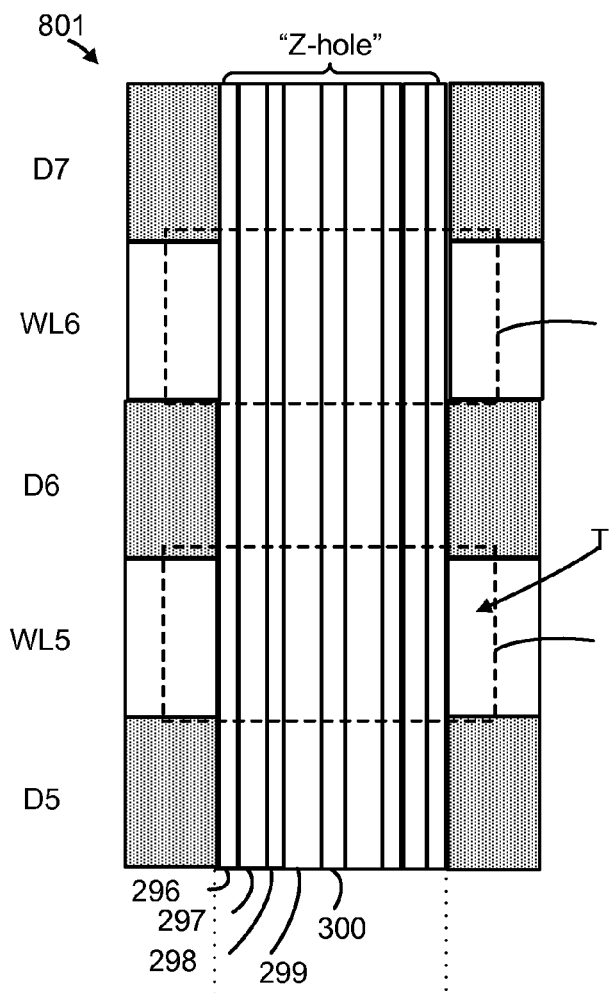
FIG. 5E is a side section view that shows further details of a column of WL select gates.
Figure 5F:
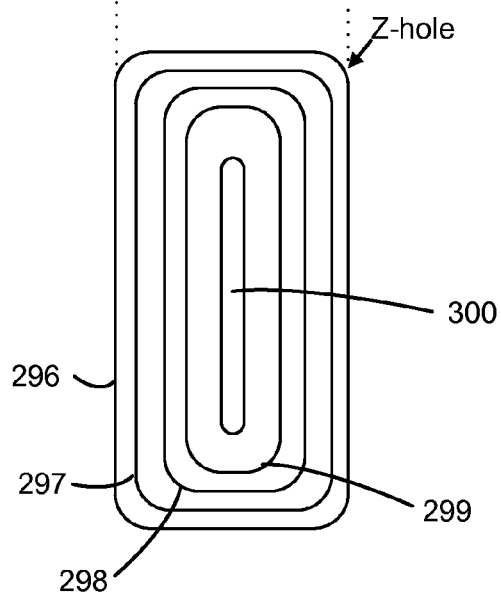
FIG. 5F depicts a cross-sectional view of the column of FIG. 5E.
Figure 5G:
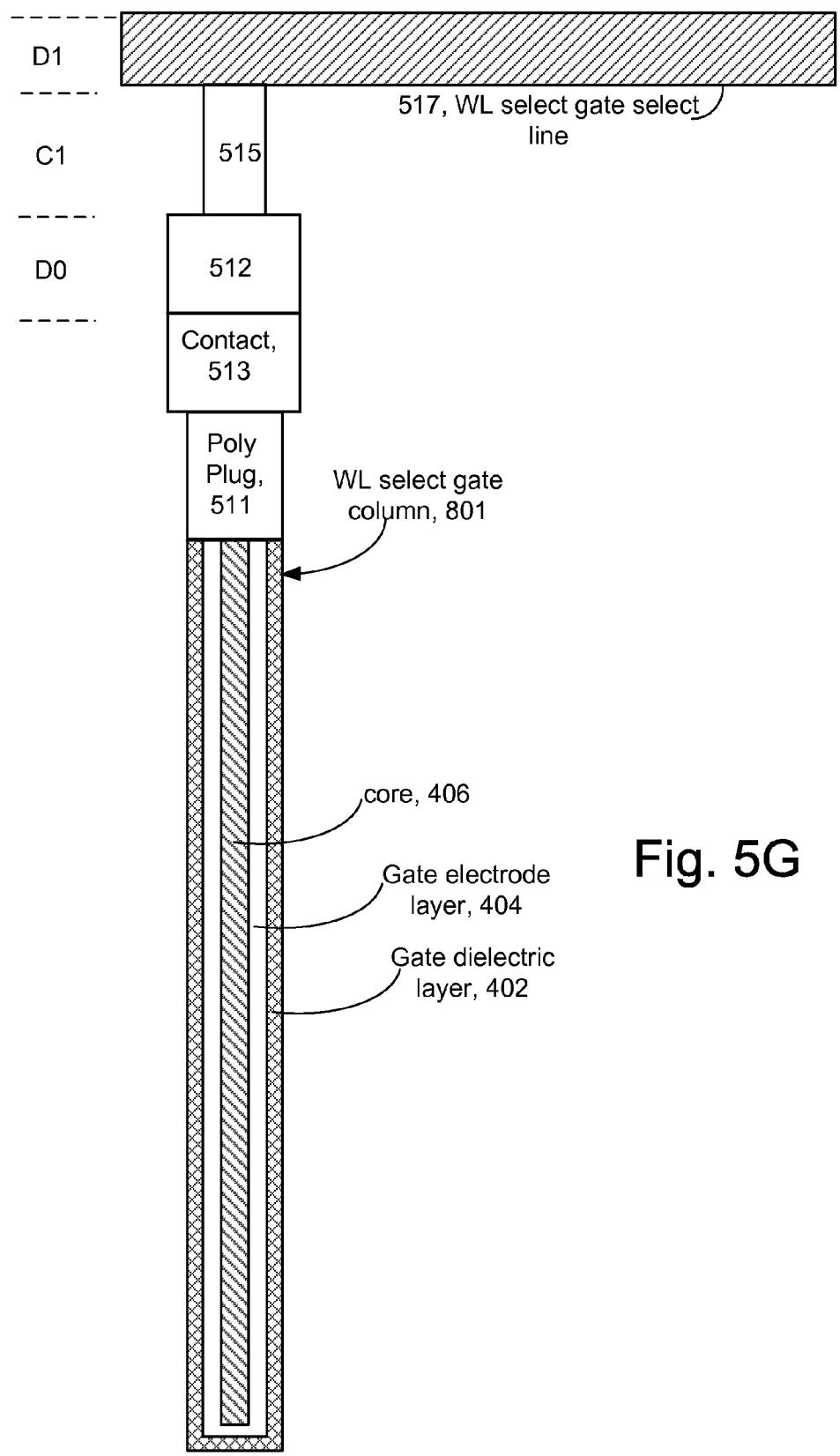
FIG. 5G is a diagram that shows further details of making a contact to a column of WL select gates.
Figure 5J:
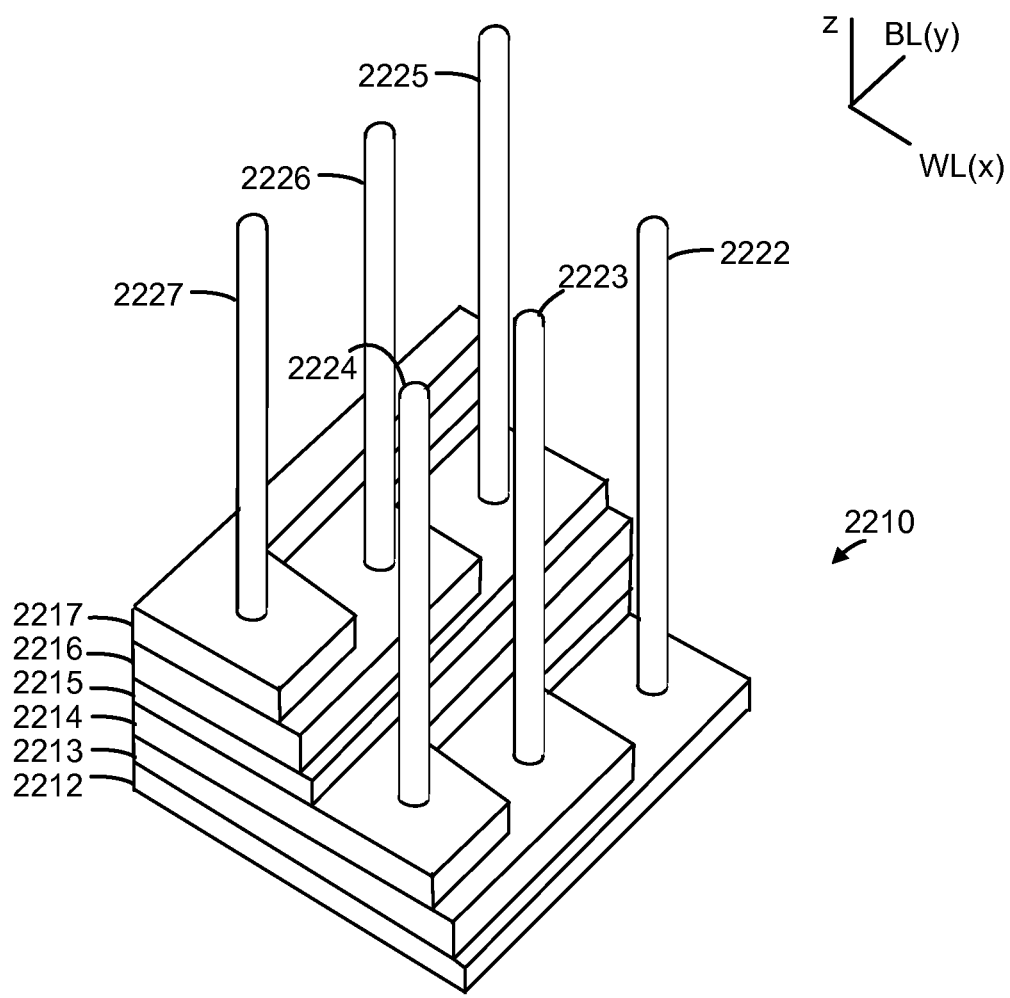
FIG. 5J depicts an example alternative terraced portion of a cell area with contact structures.

FIG. 5E is a side section view that shows further details of a column 801 of WL select gates. Layers D5, WL5, D6, WL6, and D7 from column 801 of FIG. 5D are depicted. Each column includes a number of layers which are deposited along the sidewalls of the column. FIG. 5F depicts a cross-sectional view of the column of FIG. 5E. Each layer is ring-shaped in one possible approach, except the core filler which is cylindrical. Note that the ring-shape is not limited to a circular shape, as the ring may be elongated.

In one embodiment, these layers are the same as those of a memory cell. However, this is not a requirement. These layers can include oxide-nitride-oxide and polysilicon layers which are deposited, e.g., using atomic layer deposition. For example, an oxide can be deposited as layer 296, a nitride such as SiN can be deposited as layer 297, an oxide can be deposited as layer 298, a polysilicon gate can be deposited as layer 299, and a core filler dielectric can be deposited as region 300. Additional TFT structures 231 may be similarly formed throughout the columns. The body of the TFT structure 231 is outside of the "z-hole" region. The body of the TFT structure 231 may be formed from a wide band gap semiconductor, as previously discussed. In one embodiment, body of the TFT structure 231 is formed from an oxide semiconductor, such as a metal oxide semiconductor.

5G is a diagram that shows further details of making a contact to a column 801 of WL select gates. The column 801 includes a core 406, gate electrode layer 404, and gate dielectric layer 402, as previously discussed. At the top of the column there is a polysilicon plug 511. Above that is a contact 513, which may be metal, such as tungsten. Above the contact 513 there may be a pad 512, which is at a layer that may be referred to as D0. In one embodiment, D0 is the first metal layer above the memory array. The pad 512 may be a metal piece that could have a variety of shapes. The pad 512 may be patterned and made from D0 metal. The pad 512 could be a line, polygon, etc. Above that is a contact or via 515 that is referred to as C1. Above that is a WL select gate select line 517. This may be at the level referred to as D1. In one embodiment, D1 is the second metal layer above the memory array. The WL select gate select line 517 may be patterned and made from D1 metal. In one embodiment, D0 and D1 metals are tungsten. However, other metals can be used. The pad 512 at layer D0 may, in general, be orthogonal to the WL select gate line 517. Note that neither the pad 512 nor the WL select gate line 517 are required to be a straight line. The WL select gate select line 517 may connect to many WL select gate columns. For example, a single WL select gate select line 517 may connect to WL select gate columns in different blocks. Also note that the gate electrode layer 404 may extend the length of the column 801. Note that the gate electrode layer 404 may serve as the gate electrode for transistors at different levels of the 3D memory array. The gate electrode layer 404 may serve to form an electrical connection between the gate electrodes of transistors at different levels in the column 801.

FIG. 5H1 shows further details of one embodiment of contacts from WL select gate select lines 517 to WL select gates 229. FIG. 5H1 is a top view that shows a WL select gate region 303, neighbored by a portion of the memory array 305 and word line plate hookup region 301. Running vertically in this view are a number of WL select gate select lines 517. The WL select gate select lines 517 may be at the same level as the bit lines. However, the bit lines are not depicted. The bit lines run parallel to the WL select gate select lines 517 in one embodiment. Contacts or vias 515 are staggered in one embodiment. Some of the pads 512 may be made longer than others, as shown. The polysilicon plug 511 may be roughly the same size and shape as the z-hole, but that is not required. The polysilicon plug 511 should make good electrical contact to the gate electrode portion at the top of the WL select gate column; however, it should be electrically isolated from the body. There may be a contact 513 between the polysilicon plug 511 and pad 512, but this is not depicted in FIG. 5H1. Note that each WL select gate select line 517 may extend further such that it runs over many blocks. In one embodiment, a given WL select gate select line 517 has a contact down to one WL select gate column in a given block. As noted, the WL select gate line 517 may have separate contacts to WL select gate columns in other blocks (one per block).

FIG. 5H2 shows further details of one embodiment of contacts from WL select gate select lines 517 to WL select gates 229 having asymmetrical TFTs. In this embodiment, dummy gates (DG) are depicted adjacent to the memory array 305. Alternatively, dummy gates (DG) may be adjacent to the word line hookup 301. The dummy gates (DG) do not require any electrical contact to a signal source. Therefore, no contacts are made to the DG in one embodiment. However, one alternative is to provide an electrical contact to the dummy gates. The gate electrode portion of the dummy gate could be electrically connected to the gate electrode of its TFT. As another alternative, the dummy gates (DG) could be driven by a different voltage than the gate electrode of its TFT.

In one embodiment, the 3D stacked memory array has a terraced structure to allow contact to word line plates. FIG. 5I depicts contact structures of the terraced portion 2252. Contact structures 2254, 2256, 2258, 2260, 2262, 2264 and 2266 extend upward from L1, L3, L5, L7, L9, L11 and L13, respectively, to portions 2274, 2276, 2278, 2280, 2282, 2284 and 2286, respectively, of an upper metal layer D0. The contact structures and upper portions are one example of contacts 227 to word line plates. Therefore, individual word line plates may be selected. D1 and D2 are example additional upper metal layers above D0. A substrate region 190 having two metal layers M0 and M1 is depicted.

In one embodiment, contacts from the z-decoder to the WL select gate select lines 517 are made in a similar manner as the contacts to the word line plates.

FIG. 5J depicts an example alternative terraced portion 2210 of a cell area with contact structures. In one embodiment, contacts to word line plates are formed this way. This terraced portion includes a terrace or stair steps which are etched in both the x and y directions. The terraced portion thus extends in two perpendicular directions. As an example, each conductor layer 2212 to 2217 (such as a metal silicide word line layer) can be connected to a respective portion of an upper metal layer (not shown) via a respective contact pillar 2222 to 2227, respectively. The dielectric layers are between the conductor layers but are not depicted for simplicity. Moreover, the terraced portion may be used for one block, while an adjacent block has a similar but mirror image terraced portion. The blocks can be separated by an insulation-filled slit, as mentioned. This type of terrace configuration can similarly be provided in any of the other examples.

Figure 5K:
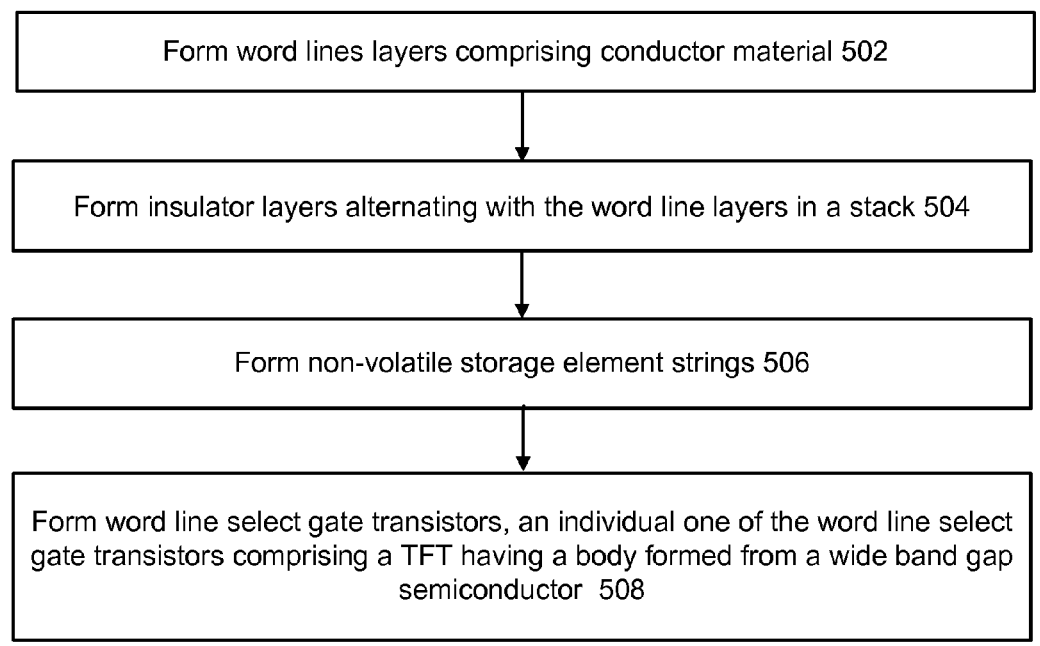
FIG. 5K is a flowchart of one embodiment of a process of forming a 3D stacked non-volatile storage device.

FIG. 5K is a flowchart of one embodiment of a process of forming a 3D stacked non-volatile storage device. The process may be used to form devices having word line select gates coupled between word line plates and word lines.

Step 502 includes forming word lines layers comprising conductor material. The conductor material could be a metal. In one embodiment, the metal is tungsten. However, a different metal could be used for the word line layers. In one embodiment, the word line layers a heavily doped polysilicon. In one embodiment, it is P+ polysilicon. In one embodiment, it is N+ polysilicon. Each word line layer may comprise a word line plate and word lines. For example, the word lines may be formed from the same metal as the word line plate. Each of the word line plates may be associated with multiple ones of the word lines. The word line plates and word lines could be similar to those depicted in FIG. 3A, 3B, 3D, 3F, 5C, as some examples. Many other possibilities exist.

Step 504 includes forming insulator layers alternating with the word line layers in a stack. The alternating conductor and insulator layers could be layers such as layers L0-L16 depicted in FIG. 2G, or layers WL0-WL6 and D0-D8 depicted in FIG. 5D. Many other possibilities exist. The insulator is a dielectric in one embodiment.

Figure 17:
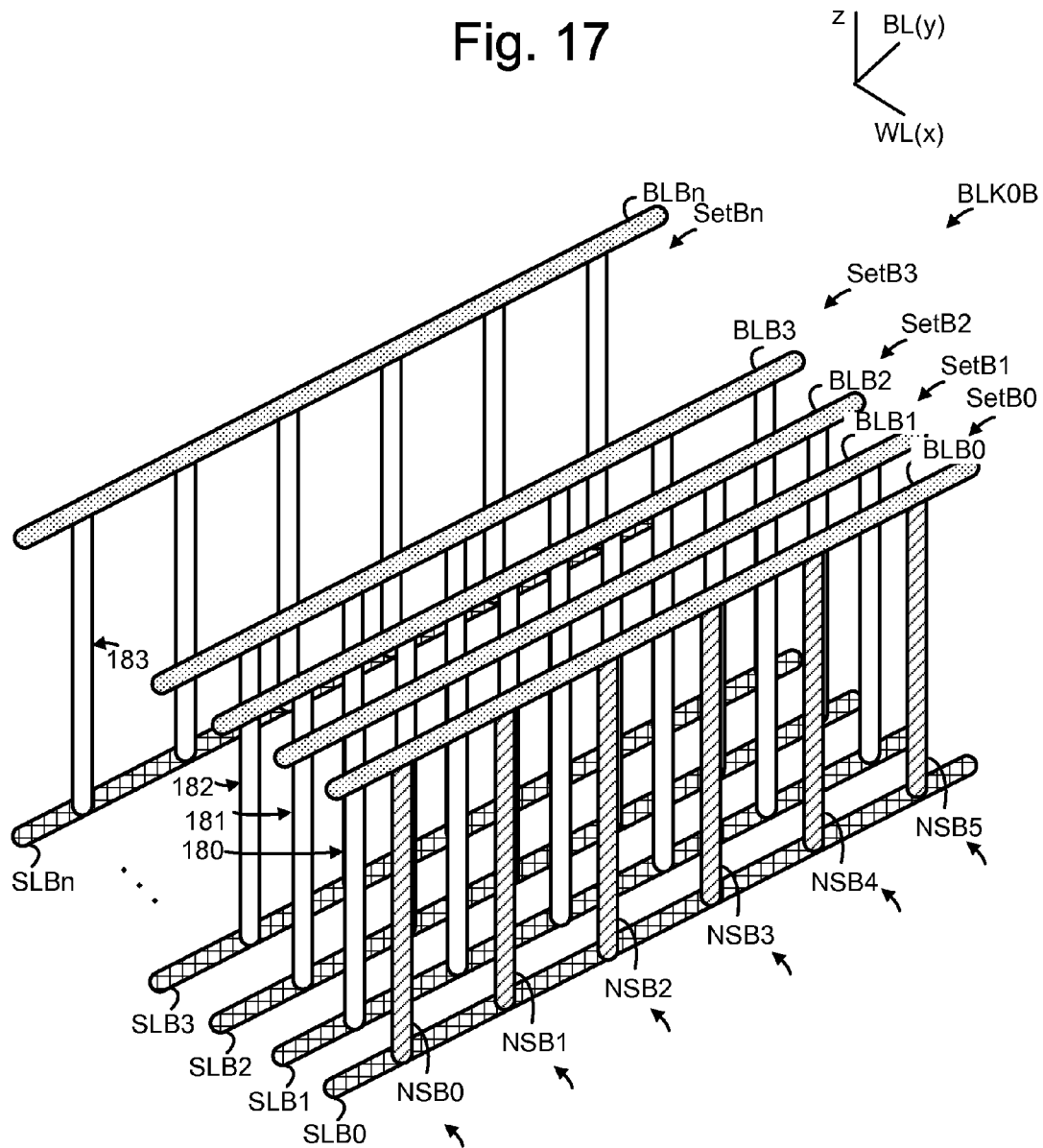
FIG. 17 depicts an embodiment of a block which includes straight NAND strings.

Step 506 includes forming non-volatile storage element strings. In one embodiment, these are NAND strings. These may be U-shaped NAND strings, straight NAND strings, or possibly some other configuration. Each non-volatile storage element string comprises non-volatile storage elements. Each of the non-volatile storage elements is associated with one of the word lines. In one embodiment, U-shaped strings such as those depicted in FIG. 2G are formed. In one embodiment, straight strings such as those depicted in FIG. 17 are formed.

Step 508 includes forming word line select gate transistors 231 that have bodies formed from a wide band gap semiconductor. These transistors 231 are used in word line select gates 229, in one embodiment. An individual one of the word line select gate transistors 231 may be connected between one of the word line plates and a first of the word lines to allow selection of the first word line. Step 508 may form structures such as the one depicted in FIG. 4A1, 4A2, or 4B, as examples. In one embodiment, the structure operates as a single TFT having dual gates/bodies. In one embodiment, the structure operates as two TFTs in parallel. As noted herein, a single WL select gate 229 may include multiple TFTs 231. These TFT structures 231 may be in series, parallel, or both. In one embodiment, the word line word line select gate transistors 231 are physically formed in the word line layers. In one embodiment, a given word line word line select gate transistor 231 is physically between one of the word line plates and a first of the word lines to allow selection of the first word line. In one embodiment, a given word line word line select gate transistor 231 is formed between two slits that provide electrical isolation such that the word line select gate 229 can be used to select its associated word line. The two slits may define the set of memory cells to be selected, although that is not required. For example, additional slits may be used to define the set of memory cells to be selected (see FIG. 3F, for example).

Many possibilities exist for the word line word line select gate transistors 231 formed in step 508. It is understood that when one of the word line select gates 229 is coupled between one of the word line plates and a first of the word lines to allow selection of the first word line that it may select one or more word lines. FIGS. 3B, 3D, 3F and 5C show some, but not all, other possibilities.

As mentioned above, the body of the word line select gate transistor 231 may be formed from a wide band gap semiconductor. In one embodiment, forming the word line select gate transistors 231 includes removing portions of the metal in regions where bodies of word line select transistors are to be formed. Then, the removed metal is replaced with a wide band gap semiconductor in regions where the bodies of the word line select transistors are being formed.

FIG. 5L1 is a flowchart of one embodiment of a method of forming a set of thin film transistors (TFT). Step 526-536 may be used when forming word line select gate transistors 231 in step 508 of the process of FIG. 5K. However, note that the process of forming TFTs is not limited to the process of FIG. 5K.

Step 522 includes forming layers of metal to serve as word lines for a 3D memory array. The metal may also serve as word line hookup regions 301. The word lines may be metal, such as tungsten or another metal. In one embodiment, the word line layers are heavily doped polysilicon. Step 524 includes forming insulator layers alternating with the layers of metal in a stack.

Step 526 includes removing portions of the metal in regions in which bodies of the TFTs 231 are to be formed. Step 528 is replacing the removed metal with material for bodies for the TFTs 231. The may include depositing the material for bodies using ALD, CVD, etc. In one embodiment, Ar, N, or some other species, is used to modulate doping of the wide band gap semiconductor (e.g., oxide semiconductor). This can be used to control the conductivity of the TFT body.

Step 530 includes forming a gate dielectric region for the word line select transistors inside of the wide band gap semiconductor that serves as the bodies of the word line select transistors. Step 530 may include forming a z-hole in the alternating layers of body material and the insulator layers. A TFT can be formed from one or more z-holes. Then, the gate dielectric region is formed on a sidewall of the z-hole.

Step 532 includes forming a gate electrode layer 404 inside of the gate dielectric region.

Step 534 includes an optional channel treatment of bodies of the TFTs adjacent to the gate dielectric layer 402. Since the channel is a semiconductor it should be conductive, at least to some extent. However, it may be desirable to prevent too high a conductivity. Therefore, by applying a certain bias to the gate the channel can be controlled. For example, the channel can be shut off, or made to significantly enhance its conductivity (e.g., put the TFT into an "on-state"). If the channel is too conductive, it may be necessary to apply high negative bias to the gate (in case of NFET) to shut it off. Thus, optional step 534 may reduce body conductivity to prevent an overly conductive channel in the body. One technique includes an $N_2O$ plasma treatment.

On the other hand, in some cases it may be desirable to increase the conductivity of the body. Thus, optional step 534 may increase the body conductivity. One technique includes an $NH_3$ treatment, which may act as "doping," with H as a shallow donor.

Step 536 includes forming drain and source regions for the TFTs. In one embodiment, the drain and source regions are formed in the wide band gap semiconductor adjacent to the bodies. This may be in whole or in part from the wide band gap semiconductor. In one embodiment, the source and drain are doped. However, doping is not required. In one embodiment, $NH_3$ plasma is exposed on the source and drain regions. This may reduce series resistance. In one embodiment, the source and drain regions are exposed to argon (Ar).

In one embodiment, the drain and source regions are formed in whole from metal of from the word line material adjacent to the wide band gap semiconductor body. Note that this does not necessarily require any additional process steps. Thus, in one embodiment, the act of forming the TFT having the wide band gap semiconductor adjacent to the metal may, in effect, result in a source/drain in the metal.

In one embodiment, the drain and source are formed in part from the wide band gap semiconductor and in part from the metal of the word line and/or word line hookup that is adjacent to the wide band gap semiconductor. This may include a step of doping the wide band gap semiconductor adjacent to the metal, but doping is not required.

In some processes, thermal anneal steps will be applied after formation of the TFT body made of a wide band gap semiconductor. As a result, the electrical contact between the wide band gap semiconductor and metal (of WL and/or WL hookup) will be formed with lower resistance. The thermal anneal step(s) may be applied specifically for the purpose of reducing the TFT body-to-S/D series resistance. Or the thermal anneal step(s) may be applied at subsequent process steps for other purposes. For example, a thermal anneal could be performed after depositing a MONOS stack into the memory holes (e.g., "MONOS anneal"). The MONOS anneal may also serve to improve body to S/D series resistance. A thermal anneal step may be considered to be part of forming the S/D at least in part from the metal word line material.

Note that depending on the specific wide band gap semiconductor and specific WL metal material, the temperature and duration of the deposition of the wide band gap semiconductor will be sufficient to form good electrical contact with WL metal. Thus, a separate thermal anneal step is not a requirement.

FIG. 5L2 is a flowchart of one embodiment of a method of forming a channel extension for TFTs. This process may be used in combination with the process of FIG. 5L1. The process of FIG. 5L2 may be used when forming word line select transistors 531 in step 508 of the process of FIG. 5K. However, note that the process of forming TFTs is not limited to the process of FIG. 5K. The process of FIG. 5L2 could be used to form TFTs in a device other than a memory device.

For the sake of discussion it will be assumed that steps 522 and 524 of FIG. 5L1 have been performed to form a stack of alternating metal and insulator layers.

Step 546 of FIG. 5L2 includes removing portions of the metal layers in regions in which the channel extension is to be formed. This may be performed when performing step 526. In one embodiment, a dummy gate hole ("DG-hole") is used to facilitate this metal removal. Step 546 may include removing the conductive material (e.g., metal) used for the word line layers in regions around the DG-holes.

Step 548 is replacement of the removed metal with the body material of the TFT. This may be performed when performing step 528. The wide band gap semiconductor that was used for the bodies in step 528 (FIG. 5L1) may be used to replace the metal. The replacement step for the channel extension can be performed at the same time that the bodies are formed. When performing the process of FIG. 5L2, the sources and/or drains may be formed at some distance away from the gate electrodes.

Figure 5M:
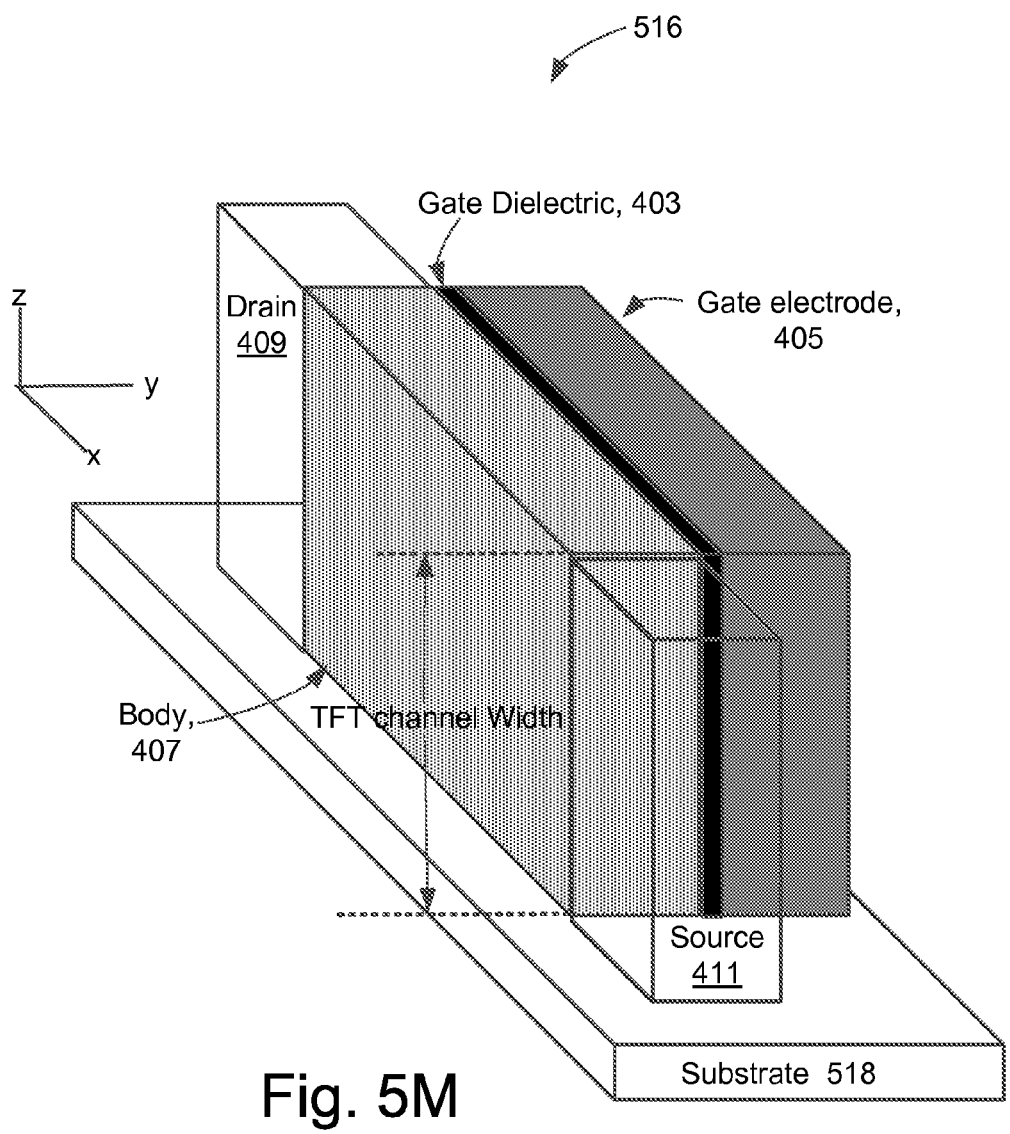
FIG. 5M is a diagram of one embodiment of a TFT.

FIG. 5M is a diagram of one embodiment of a TFT 516 over a substrate 518. The TFT 516 may be formed using the process of FIG. 5L1, or another process. The TFT 516 includes a gate electrode 405, gate dielectric 403, body 407, drain 409, and source 411. The TFT 516 may be formed within a layer of metal (not depicted in FIG. 5M) that has a major surface (or major plane) in the xy plane. For example, the TFT may be formed in a word line layer. The body 407, source 411, and drain 409 are formed from a wide energy band gap semiconductor, which may include an oxide semiconductor, in one embodiment. However, the source 411 and drain 409 are not required to be formed from the wide band gap semiconductor. In one embodiment, the source 411 and drain 409 comprise metal, such as tungsten. In one embodiment, the source 411 and drain 409 comprise both the wide energy band gap semiconductor used to form the body and metal that is adjacent to the wide energy band gap semiconductor.

The TFT may be formed over a substrate layer. The substrate layer 518 may be any material, such as insulator layer in the example in which the TFT is formed in a 3D memory array. The substrate layer 518 may have a major surface (or major plane) in the xy plane. The TFT channel width may be defined by the thickness of the horizontal layer of polysilicon. The channel runs in the x-direction in FIG. 5M. In one embodiment, the TFT is formed in a 3D memory array. In this case, the channel length may run in the same direction as the word lines (x-direction). However, the TFT could be used in applications other than 3D memory arrays. Note that the process of FIG. 5L1 or 5L2 may form what may be referred to as a "vertical gate/width TFT." The example of FIG. 5M will be used to illustrate. In one embodiment, a major surface (or major plane) of the gate electrode 405 extends vertically with respect to the horizontal conductor layers. In one embodiment, a major surface of the gate electrode 405 is in the xz plane. For example, the interface between the gate dielectric 403 and gate electrode 405 runs perpendicular to an xy plane of the layer of conductor material. In one embodiment, the interface between the gate dielectric 403 and body 407 runs perpendicular to an xy plane of on the layer of conductor material. In the example of the 3D memory, the layers of conductor material may be horizontal. For example, they may be horizontal with respect to a substrate (such as, but not limited to, a crystalline substrate). Thus, the major plane of the gate electrode 405 may be vertical with respect to the layers of conductor material (or with respect to the substrate). Thus, the TFT 516 may be termed a "vertical gate TFT". In one embodiment, the TFT 516 can be termed a "vertical gate/width and horizontal channel TFT", with the channel running in horizontal direction. In the example of the 3D memory, the TFT channel runs in the direction of word lines comprised of stripes of conductor material running horizontally. In one embodiment, the TFT 516 is formed directly on a substrate 518 such as an insulator layer.

In one embodiment, the width of the channel of the TFT is defined by the thickness of the wide band gap semiconductor (which may be about the thickness of word line layers). Thus, the TFT may be termed a "vertical width TFT".

The embodiment depicted in FIG. 5M may be referred to as a symmetrical TFT. However, the TFT is asymmetrical in one embodiment. As described herein, the channel may be extended in the x-direction in an asymmetrical TFT.

The TFT may also be termed a "inside gate/outer body TFT." This refers to the fact that the gate electrode may be formed from the gate layer inside of the z-hole with the body on the outside (e.g., FIGS. 4A1-4E).

Figure 6:
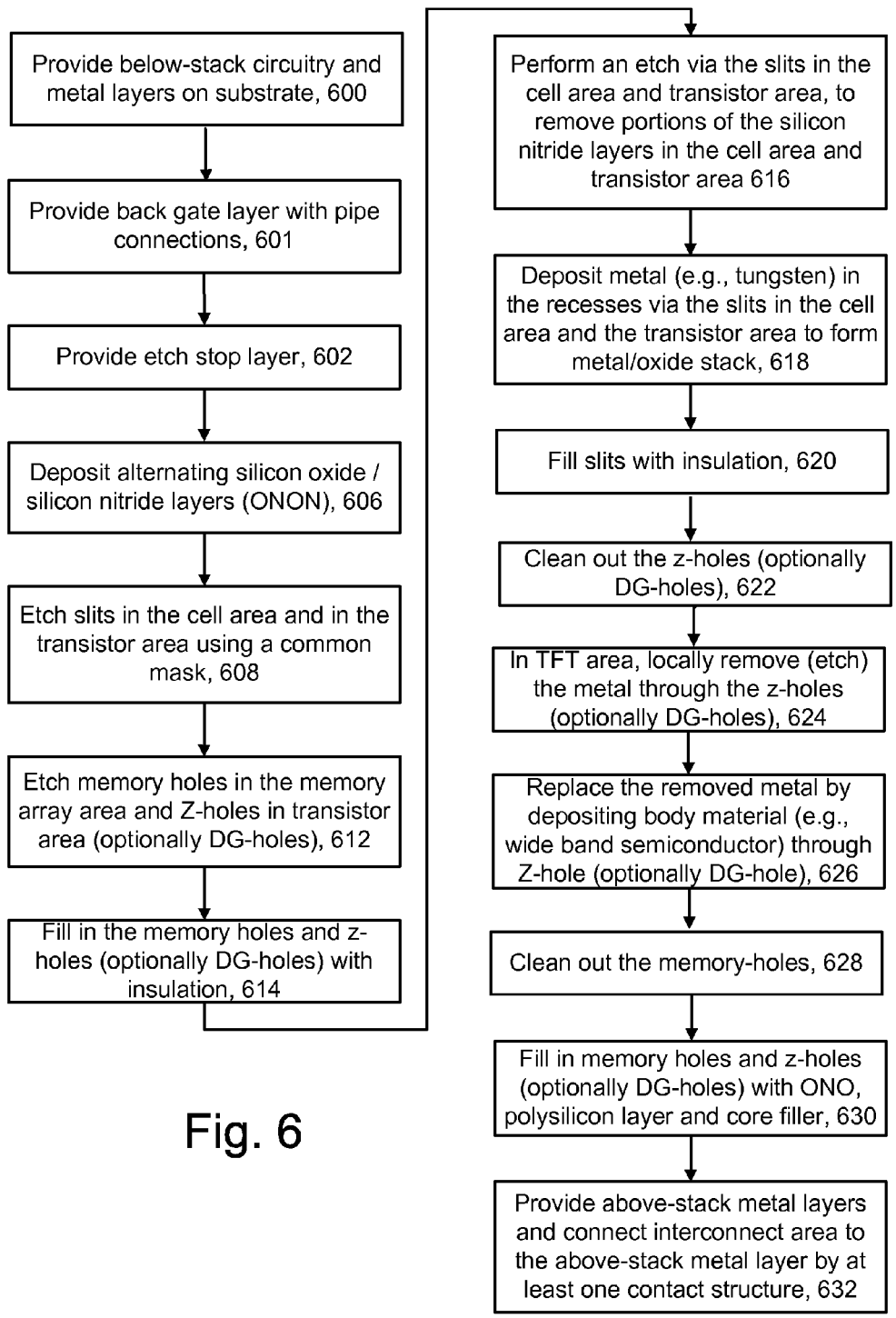
FIG. 6 is a flowchart of one embodiment of a process of forming a memory array having WL select gates.
Figure 7:
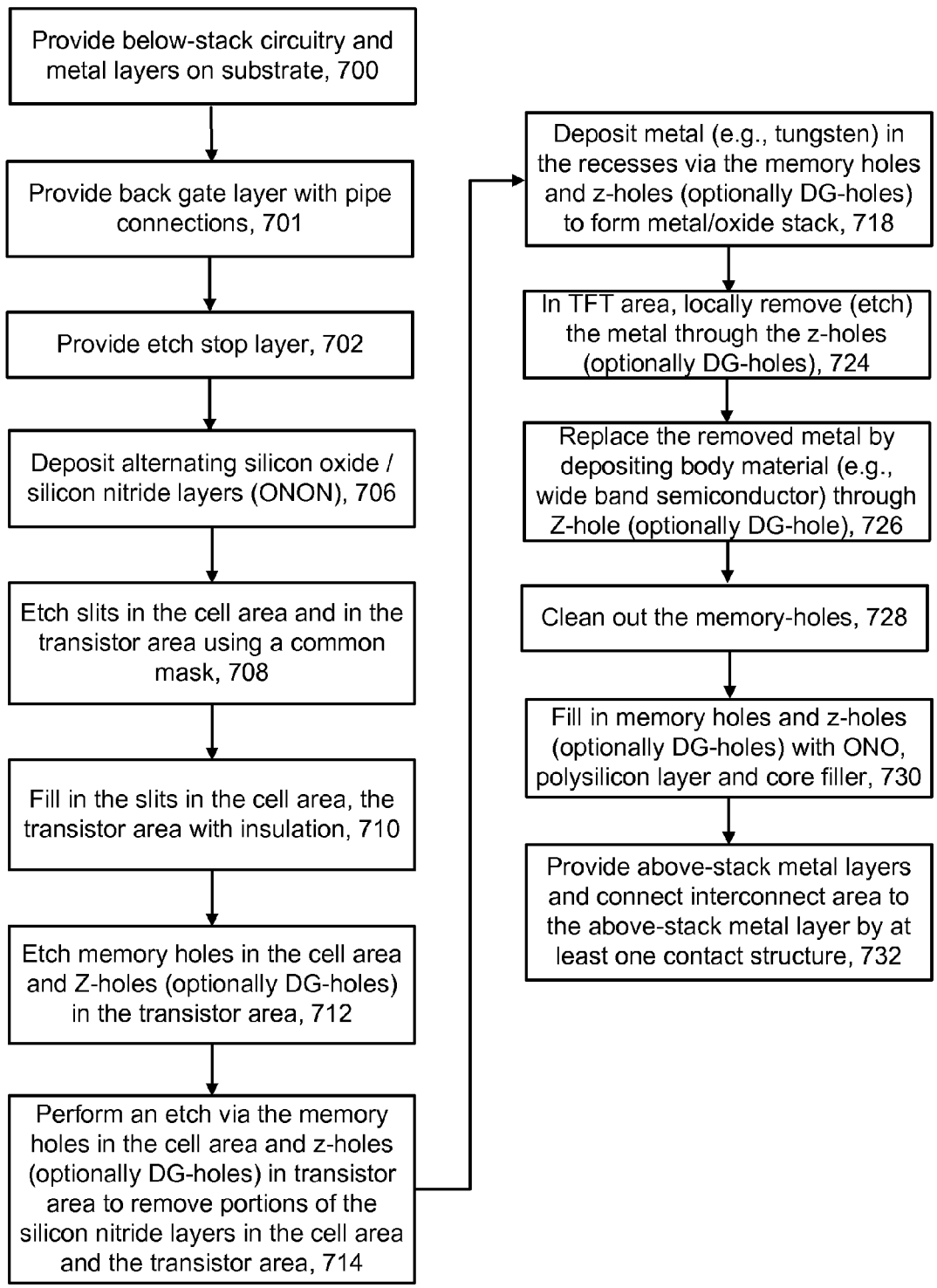
FIG. 7 depicts a method for fabricating a 3D stacked non-volatile memory device.

FIG. 6 is a flowchart of one embodiment of a process of forming a memory array having WL select gates 229 having TFT structures 231 with bodies formed from a wide band gap semiconductor. In this process, Z-holes are formed and processed to form TFT structures 231. FIG. 6 depicts a method for fabricating a 3D stacked non-volatile memory device according to the structures of FIGS. 8-14B, where an etch is performed via slits. In contrast, the process of FIG. 7 an etch is performed via memory holes and z-holes. In FIGS. 6 and 7, first alternating layers of silicon oxide and silicon nitride (ONON) are formed. The silicon nitride is a sacrificial layer that will be replaced with metal to form word lines. A different material could be used for the sacrificial layer. The metal is replaced with a wide band gap semiconductor to form bodies of the WL select transistors 231, in accordance with an embodiment.

Figure 8:
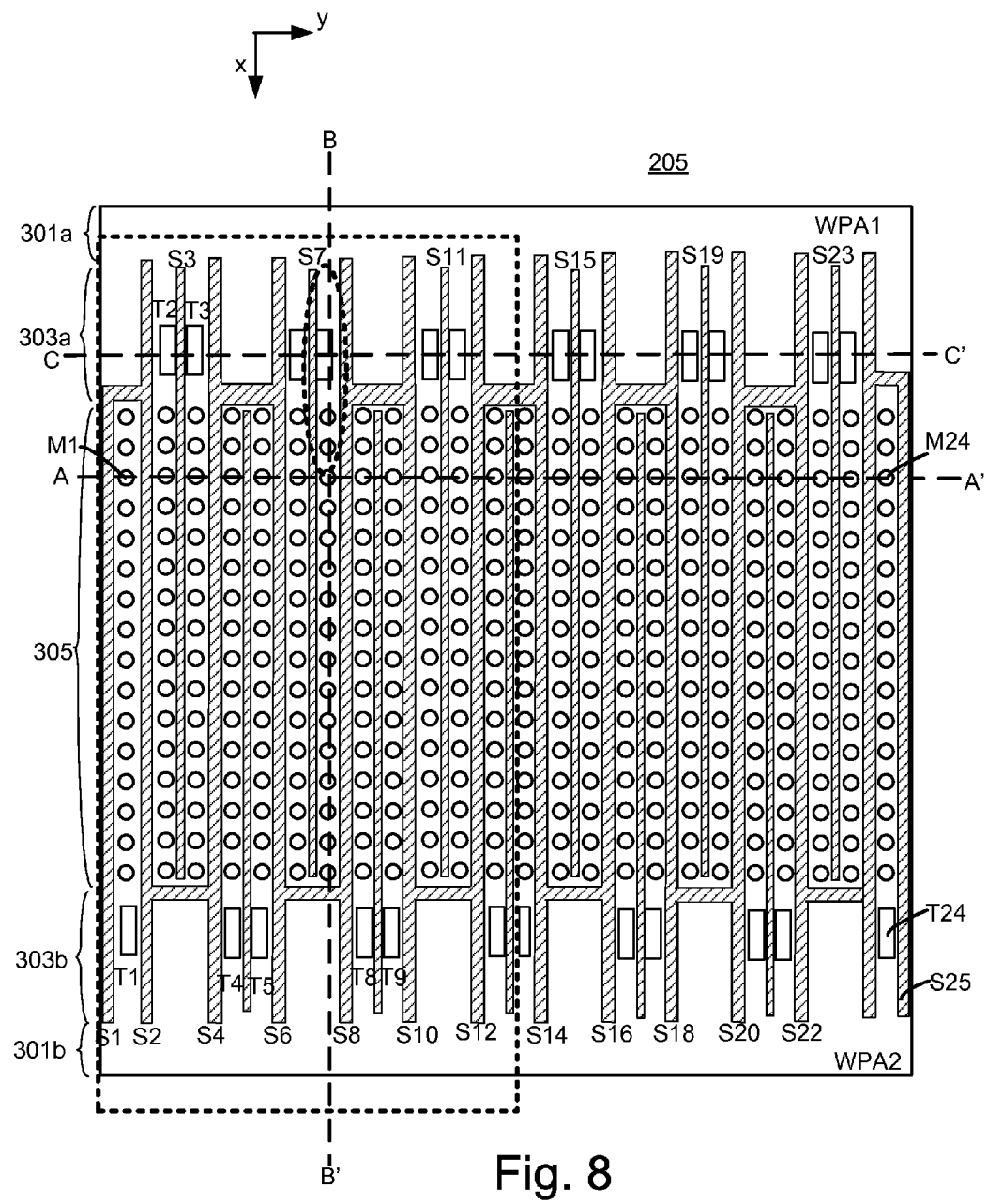
FIG. 8 is a diagram of a portion of a memory array to help illustrate the processes of FIGS. 6 and 7.

FIG. 8 is a diagram of a portion of a memory array to help illustrate the process of FIG. 6. FIG. 8 shows a top view of a block of a memory array. The block includes two WL select gate regions 303*a*, 303*b*. One WL select gate region 303*a* includes transistors T2, T3, T6, T7, T10, T11, T14, T14, T18, T19, T22, and T23 (not all are labeled in FIG. 8). The other WL select gate region 303*b* includes transistors T1, T4, T5, T8, T9, T12, T13, T16, T17, T20, T21, and T24 (not all are labeled in FIG. 8). The memory area region 305 includes rows and columns of memory cells. Memory cells M1-M24 (cells M1 and 24 labeled) are depicted along line A-A'. Formation of memory cells in a cross section along a portion of line A-A' will be discussed below. This portion corresponds to memory cells M1-M12. Note that memory holes H1-H12 correspond to these memory cells. Slits S1-S25 (not all slits labeled) are also along line A-A'. Slits S1-S13 are in the region for which fabrication is depicted in later drawings. Line B-B' runs in the WL(x) direction. A portion of this line that includes two memory cells and transistor T8 are circled, and will be discussed below. Formation of transistors in a cross section along a portion of line C-C', which runs in the BL(y) direction in one of the WL select gate regions will be discussed below. That portion of line C-C' includes transistors T2, T3, T6, T7, T11, and T12. Two word line hookup regions 301*a*, 301*b* are depicted. Note that the location of the word line hook up regions 301*a*, 301*b* and word line select gate regions 303*a*, 303*b* are roughly depicted. They may be located in another manner.

In the process of FIG. 6, steps need not necessarily be performed as discrete steps in the order indicated. For example, the etching steps can be performed concurrently, at least in part. Various modifications can be made. Moreover, other steps which are known from the art of semiconductor fabrication but are not explicitly depicted here may also be performed. Step 600 includes providing below-stack circuitry and metal layers on substrate. Step 601 includes forming a back gate layer 856. The back gate layer 856 may include pipe connections and back gates. One embodiment of forming back gate layer 856 includes depositing doped polysilicon for the back gate (BG) layer 856. This polysilicon may be a plate that is common to one block. Then, portions of the polysilicon may be etched out. This may form strips and shallow trenches where the pipe connections for each of the U-shaped NAND strings are to be formed. They are etched out only to the portion of BG thickness, in one embodiment. Then these "pipe connections" may be filled in with undoped polysilicon, and possibly other materials. The back gate layer 856 doped polysilicon is still underneath pipe connections and will become the BG electrode. When memory holes are etched and then cleaned out, undoped polysilicon in pipe connections will be also removed. Then, when memory hole intrinsic layers are later deposited (e.g., in step 630 MONOS dielectric may be deposited) these layers may also be deposited into the pipe connections. Thus, pipe connections may become natural continuations of memory hole columns of the U-shaped strings, and may connect all layers within memory holes with the respective layers in pipe connections. Note that a pipe connection may thus comprise ONO dielectric, undoped polysilicon, and a core of $SiO_2$, in one embodiment. The pipe connection and BG (made of BG polysilicon plate) form a BG transistor. Contact to the BG poly plate may be provided in the same terrace used for WL and SG contacts (discussed above). The BG plate may common for each block. Therefore, a single contact for BG is used per one block, in one embodiment. The BG transistor may be used to control and ensure conductivity of pipe connections by appropriate bias of the BG transistor.

Step 602 includes providing an etch stop layer over the back gate layer 856. One purpose of the etch stop layer is not to allow shallow trenches to cut the pipe connection or cut the BG plate. The exception is only at block edges, in one embodiment, where the back gate should be cut to insulate the BG from one block to the next.

Step 606 includes depositing alternating silicon oxide ($SiO_2$)/silicon nitride (SiN) layers. The silicon nitride is a sacrificial layer, which will be replaced by metal to form word lines. The silicon oxide will be used for the insulating layers between the metal word lines. Other insulators could be used instead of silicon oxide. Other sacrificial materials could be used instead of silicon nitride.

Step 608 includes etching slits in a memory cell region 305 and in a WL select gate region 303 using a common mask. Step 612 includes etching memory holes in the memory cell region 305 and z-holes in the transistor area. In one embodiment, step 612 includes etching DG-holes, which can be used to facilitate formation of a channel extension for the TFT 231. In one embodiment, step 612 includes performing a reactive ion etch in the memory cell region 305 using a memory hole mask which protects the interconnect area. A reactive ion etch (RIE) may also be performed in the transistor region using a z-hole mask (and optionally DG-hole mask). FIGS. 8A-8C depict results after one embodiment of step 612.

FIG. 8A depicts a layered oxide/nitride structure 800 which is consistent with a cross-sectional view of the memory area region 305 of the 3D stacked non-volatile memory device of FIG. 8 along the line A-A', showing slits S1 to S13 and memory holes H1 to H12 in the cell area. A slit can be a trench which may have various widths. Note that there is another mask that can define wider trenches than those used for the slits in the array. These (the mask and trench itself) are used, e.g., to separate the peripheral and array regions. Both narrow and wide trenches can be used as applicable.

FIG. 8B shows a view of layered oxide/nitride structure 800 along the word line (x) direction. Specially, this is the view along the circled portion of line B-B', which includes the WL select gate region and a small portion of the memory array. This line only shows formation of two memory cells and the adjacent WL select transistor. The z-hole is Z8 for transistor T8 being formed. The holes are labeled Ha and Hb for reference.

FIG. 8C depicts a layered oxide/nitride structure 800 which is consistent with a cross-sectional view of the WL select gate region of the 3D stacked non-volatile memory device of FIG. 8. Since this WL select gate region corresponds to the upper half (e.g., near WPA1), only half of the transistors are being formed. The z-holes will be used to form WL select gates. The z-holes are Z2, Z3, Z6, Z7, Z10, and Z11.

In one embodiment, the memory holes (H1-H12) are etched at the same time that the z-holes for the WL select transistors are etched. Although FIG. 8C only shows holes Z2, Z3, Z6, Z7, Z10, and Z11, note that other z-holes (not depicted in FIG. 8C) may be etched at the same time.

Referring to FIG. 8A, the substrate region 190 includes a semiconductor substrate such as a silicon wafer and a BG layer 856. Various circuits may be formed in the substrate 190, but are not depicted so as to not obscure the diagram. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, Aluminum can be used for the top metal layer, while the other layers are Tungsten. Potentially, Cu can be used instead of Al for upper layer, using a corresponding integration scheme. For silicidation, Ni, Ti, Co or W can be used, for instance.

Connecting portions 263 are provided in the BG layer 856, for instance, to join vertical columns of memory cells in a U-shaped NAND configuration. The connecting portions may include connection pipes and back gates. In particular, trenches are provided in portions of the layer 856 below pairs of columns of memory cells of a U-shaped NAND string. Layers of materials which are provided in the columns to form the memory cells are also provided in the trenches, and the remaining space in the trenches is filled with a semiconductor material to provide the pipe connections as conductive regions which connect the columns. The pipe connection thus connects the two columns of each U-shaped NAND string. Each NAND string has its own back gate which serves to control conductivity of the string. Note that the back gate may be common for each block of NAND strings. A contact to the back gate may be provided in a word line hook up area, where the back gate is the lowest contact, since the back gate poly is below the word line poly stack.

The slits generally do not extend down to touch the pipe connections. Also, the slits are placed not only between memory holes of the same NAND string, e.g., slits S2, S4, S6, S8, S10 and S12, but may also between memory holes of adjacent NAND strings, e.g., slits S3, S5, S7, S9, S11 and S13. Note that slits are not required between adjacent NAND strings. Sometimes slits are used to improve mechanical strength of stacked structure. For example, when ST is filled in with, e.g., $SiO_2$, it serves as structure anchors, especially when memory holes are opened and used for silicon nitride removal, as in step 714 of FIG. 7. An etch step layer (not depicted in FIG. 8A) may be provided over the BG layer 856. This etch stop layer may prevent slits from cutting the pipe connections and/or back gates. The etch stop layer is patterned to isolate the blocks.

Alternating layers of silicon oxide and silicon nitride, for example, are provided as layers L0 to L16. This example results in vertical columns of six memory cells, where the silicon nitride layers are provided at L3, L5, L7, L9, L11 and L13 as control gates, at L1 as a lower select gate and at L15 as an upper select gate. This is an example, as fewer or more layers can be used. L1 is a bottom layer of silicon nitride. L15 is taller (thicker) than the other silicon nitride layers in this example; therefore, the upper select gates will be taller than the memory cell control gates. L1 might also be made thicker so that the lower control gate can be thicker. L1, L3, L5, L7, L9, L11, L13 and L15 are the silicon nitride layers, and L0, L2, L4, L6, L8, L10, L12, L14 and L16 are the silicon oxide layers. As noted above, the silicon nitride layers will later be replaced with metal (or wide energy band gap semiconductor).

After the layers of silicon nitride and silicon oxide are deposited, the slits and memory holes are fabricated (e.g., steps 608 and 612). Reactive ion etching can be used.

Figure 9A:
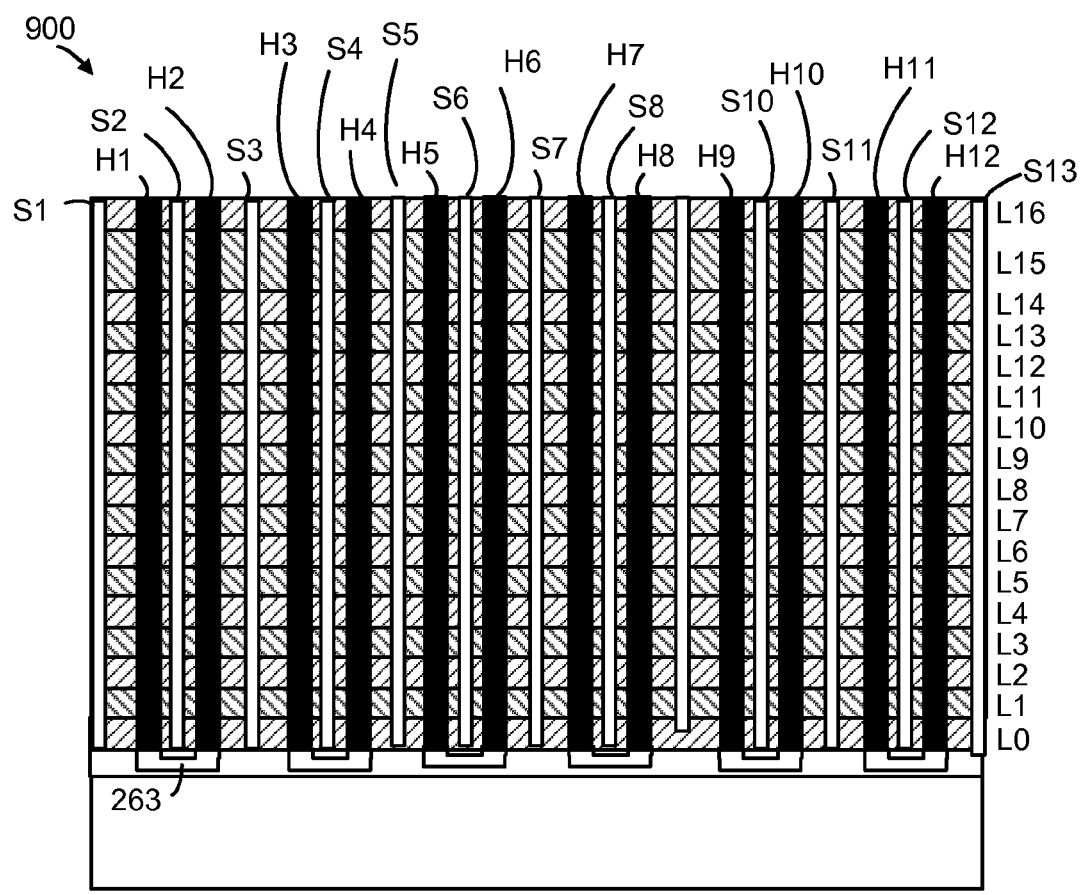
FIGS. 9A-9C depict a layered material 900 which is obtained from the layered material 800 after filling the memory holes and z-holes with insulation.
Figure 9C:
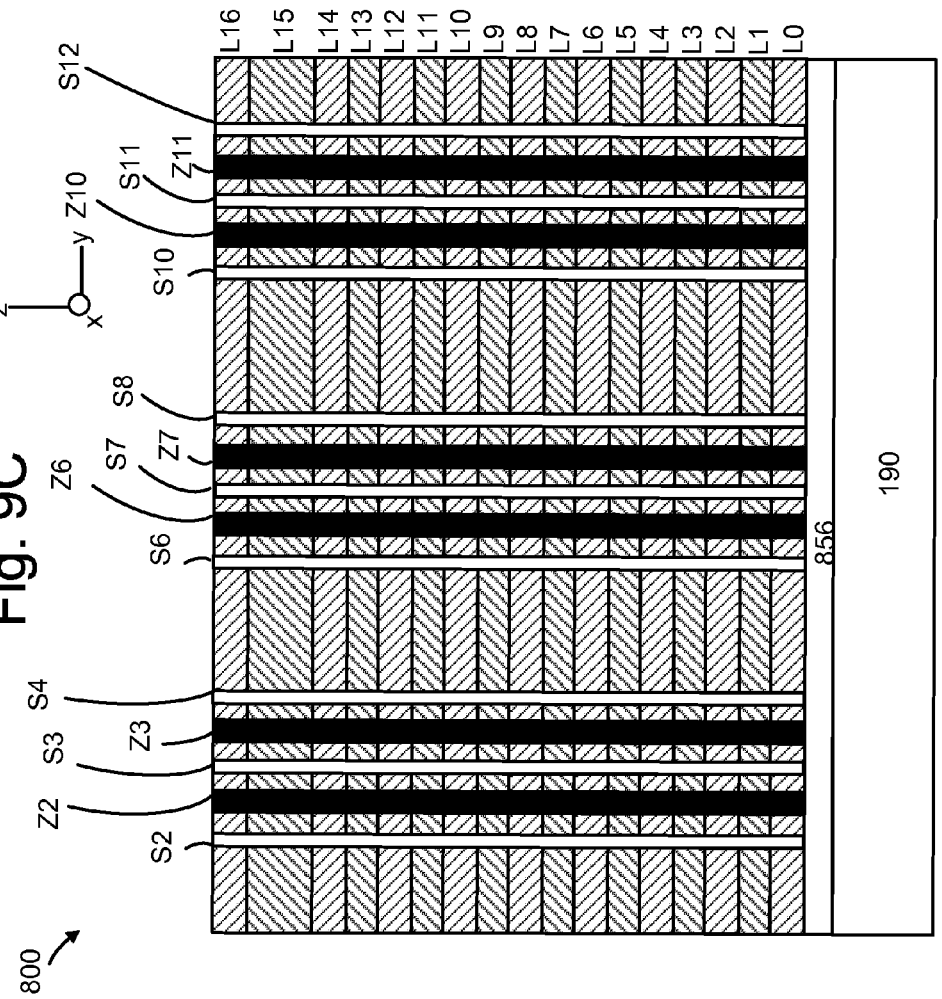
Figure 9B:
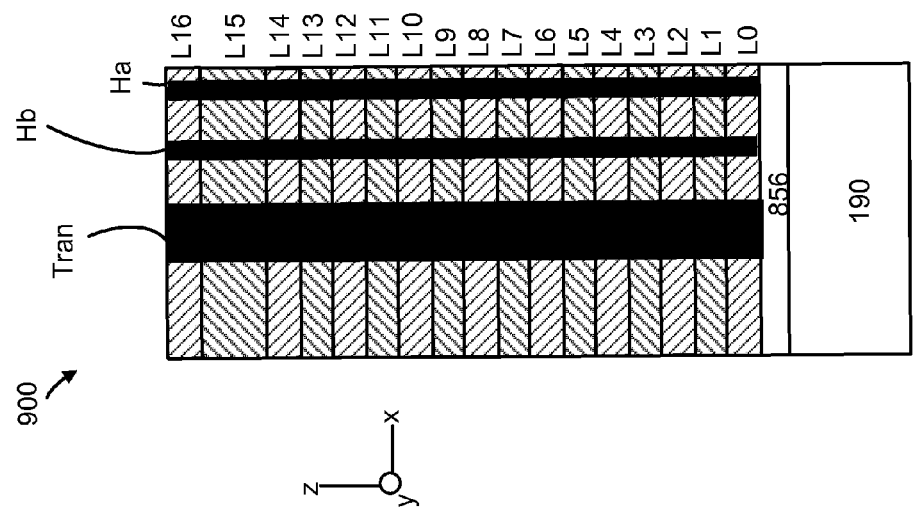

Step 614 includes filling in the memory holes and z-holes with insulation. Optionally, the DG-holes are filled if they were formed in step 612. FIGS. 9A-9C depict a layered oxide/nitride structure 900 which is obtained from the layered oxide/nitride structure 800 after filling the memory holes and z-holes with insulation. FIG. 9A is a cross section of the memory array region in the BL (y) direction along a portion of line A-A' from FIG. 8. FIG. 9B is a cross section in the WL (x) direction along a portion of line B-B' from FIG. 8. FIG. 9C is a cross section of the WL select gate region in the BL(y) direction.

Step 616 includes performing an etch via the slits in the memory cell region 305 to remove portions of the silicon nitride layers in the cell area and WL select gate region. The etch can involve introducing an etchant via the slits of the cell area 305, which has a higher selectivity for the silicon nitride than the silicon oxide, thereby removing portions of the silicon nitride layers which are adjacent to the slits of the cell area. Selectivity indicates a ratio of etch rates. The etch may have a relatively higher selectivity (e.g., by a factor of 1000, or more generally, 100 or more) for the silicon nitride relative than for the silicon oxide.

That is, the etch is not relatively highly selective of the silicon oxide so that it is not substantially removed. The wet etch should remove essentially the entire silicon nitride layers in the cell areas, so that when the regions of the removed silicon nitride are replaced by metal, the metal will extend in substantially the entire layer in the cell area. The metal should initially also extend in substantially the entire layer in the WL select gate region. Thus, word line layers at different levels should be isolated from one another and not shorted together. This applies regardless of the etch method, e.g., whether the etchant is introduced via the slits, memory holes, other holes or voids, or combinations thereof. The insulation-filled slits serve as anchors which support the silicon oxide layers when the silicon nitride is removed by etching through memory holes or other holes or voids.

A variety of etching techniques may be used to etch the nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied.

In other embodiments, the sacrificial material in the metal WL stack may be something other than nitride. Therefore a different type of etch process and etchant may be used.

The term "hole" or "columnar hole" or the like as used herein is meant to include a memory hole, z-hole, DG-hole, replacement hole or similar vertically-extending columnar void which can be filled while still be recognizable as a hole.

Figure 10B:
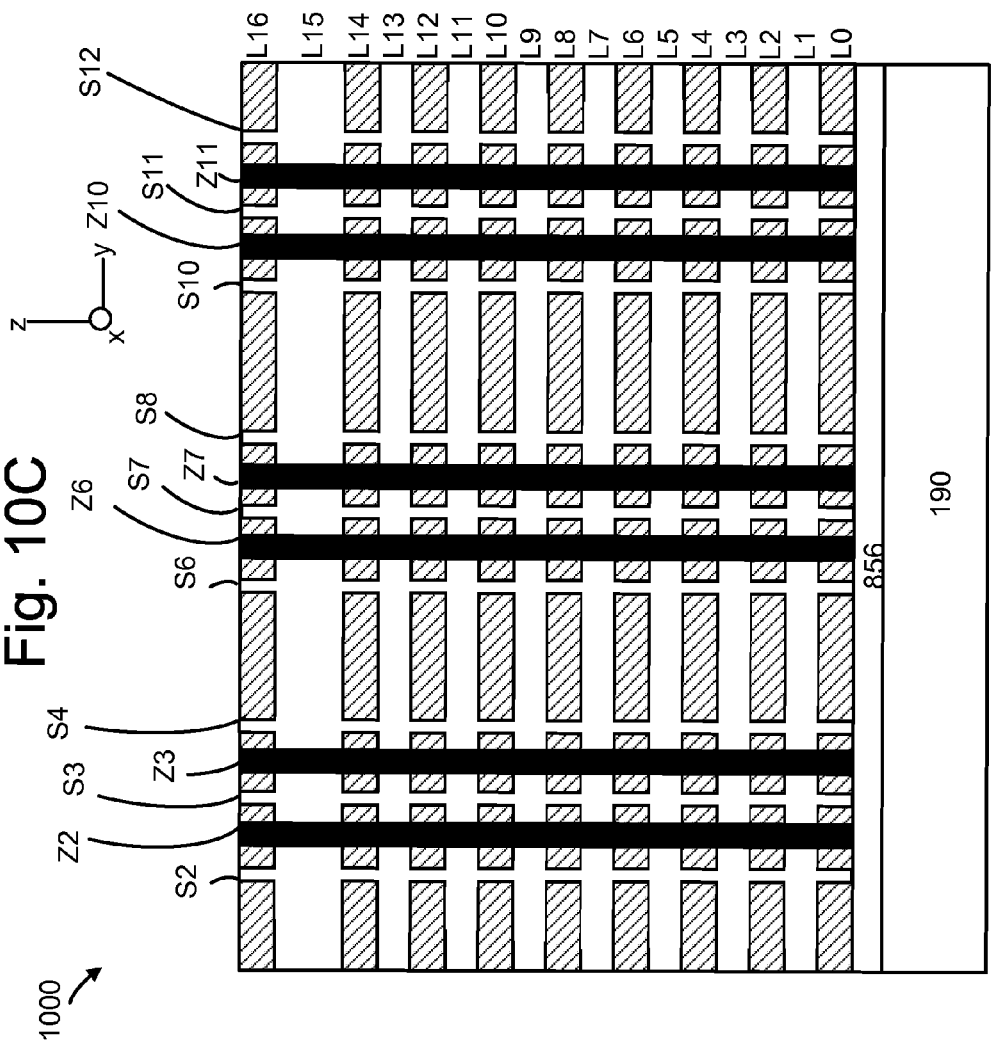
Figure 10C:
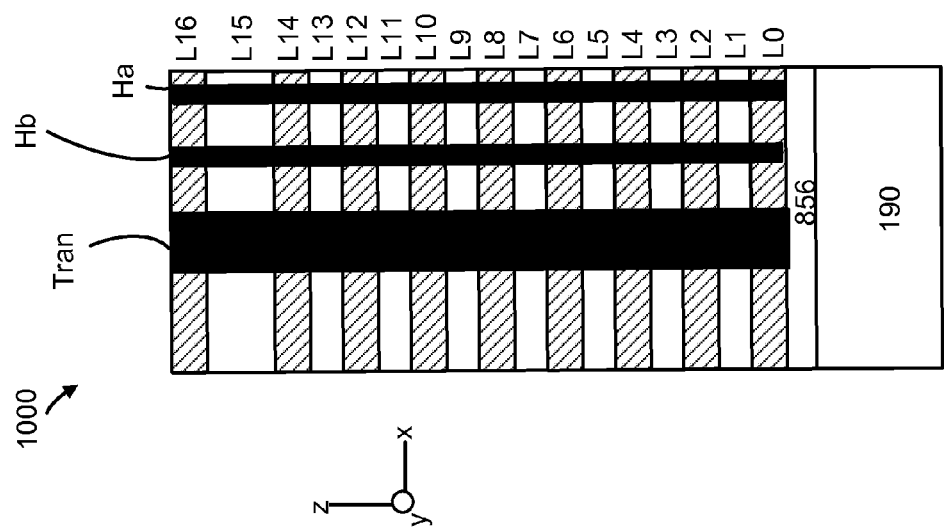

FIGS. 10A-10C depict a structure 1000 which is obtained from the layered oxide/nitride structure 900 after etching to remove silicon nitride. FIG. 10A is a cross section of the memory array region in the BL (y) direction along a portion of line A-A' from FIG. 8. FIG. 10B is a cross section in the WL (x) direction along a portion of line B-B' from FIG. 8. FIG. 10C is a cross section of the WL select gate region in the BL(y) direction.

Step 618 includes depositing metal (e.g., one or more layers) in the recesses via the slits in the cell area, as well as the transistor area. In one embodiment, the metal is tungsten. This forms a metal/oxide stack. Step 620 includes cleaning the slits and filling the slits with insulation.

Figure 11A:
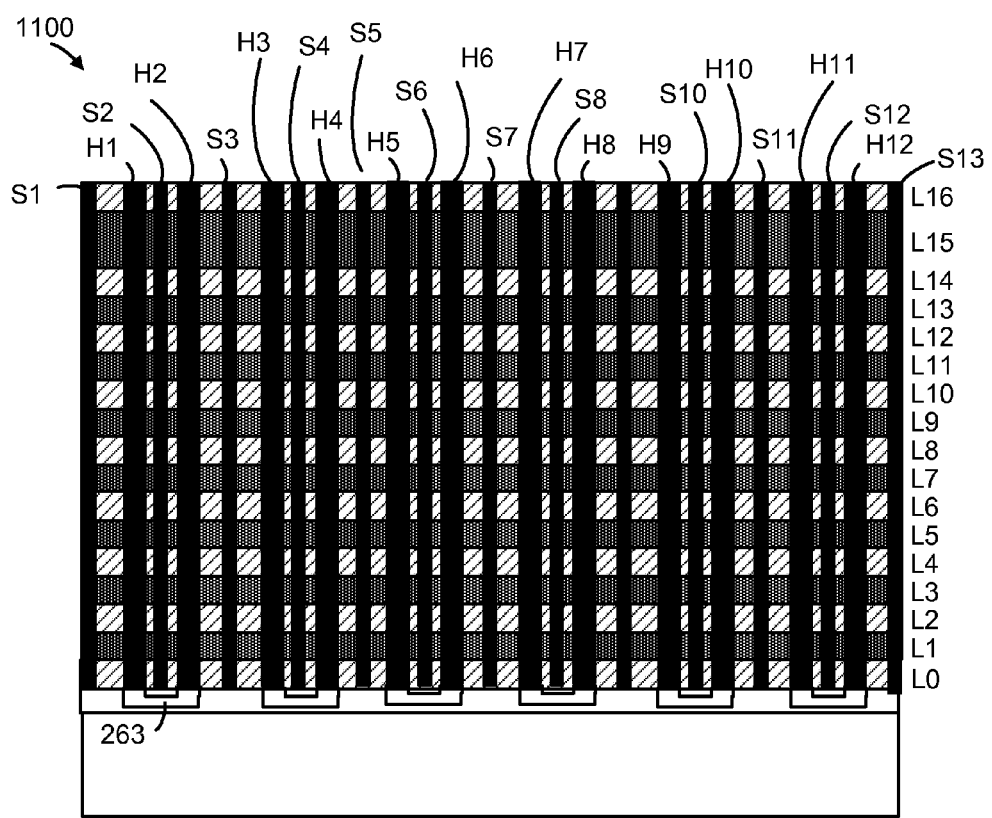

FIG. 11A-11C depicts a layered metal/oxide stack 1100 which is obtained from the layered structure 1000 after filling in voids with metal via the slits in the cell and WL select gate regions. The slits have also been filled with insulation. FIG. 11A is a cross section of the memory array region in the BL (y) direction along a portion of line A-A' from FIG. 8. FIG. 11B is a cross section in the WL (x) direction along a portion of line B-B' from FIG. 8. FIG. 11C is a cross section of the WL select gate region in the BL(y) direction. Layers L1, L3, L5, L7, L9, L11, and L15 are now metal layers. Metal is provided in the slits to fill the recesses which were created by the etch. Chemical vapor deposition (CVD) or atomic layer deposition (ALD) could be used to deposit the metal.

Step 622 includes cleaning out the z-holes. Optionally, the DG-holes are cleaned if they were formed in step 612. FIGS. 12A and 12B depict results after step 622 for the transistor region. FIG. 12A is a cross section in the WL (x) direction along a portion of line B-B' from FIG. 8. FIG. 12B is a cross section of the WL select gate region in the BL(y) direction. At this stage, the slits are filled, but the Z-holes (and DG-holes) are open.

Step 624 includes locally removing the metal in the WL select transistor region. This may include using the z-holes (optionally DG-holes) when performing an etch. In one embodiment, a time controlled etch is performed. The etch can involve introducing an etchant via the z-holes (optionally DG-holes), which has a higher selectivity for the metal than the silicon oxide, thereby removing portions of the metal layers which are adjacent to the z-holes (optionally DG-holes) of the WL select transistor region. The etch should remove essentially the entire layer of metal where the bodies of the TFTs are to be formed in the WL select transistor region. The insulation-filled slits serve as anchors which support the silicon oxide layers when the metal is removed.

Figure 13B:
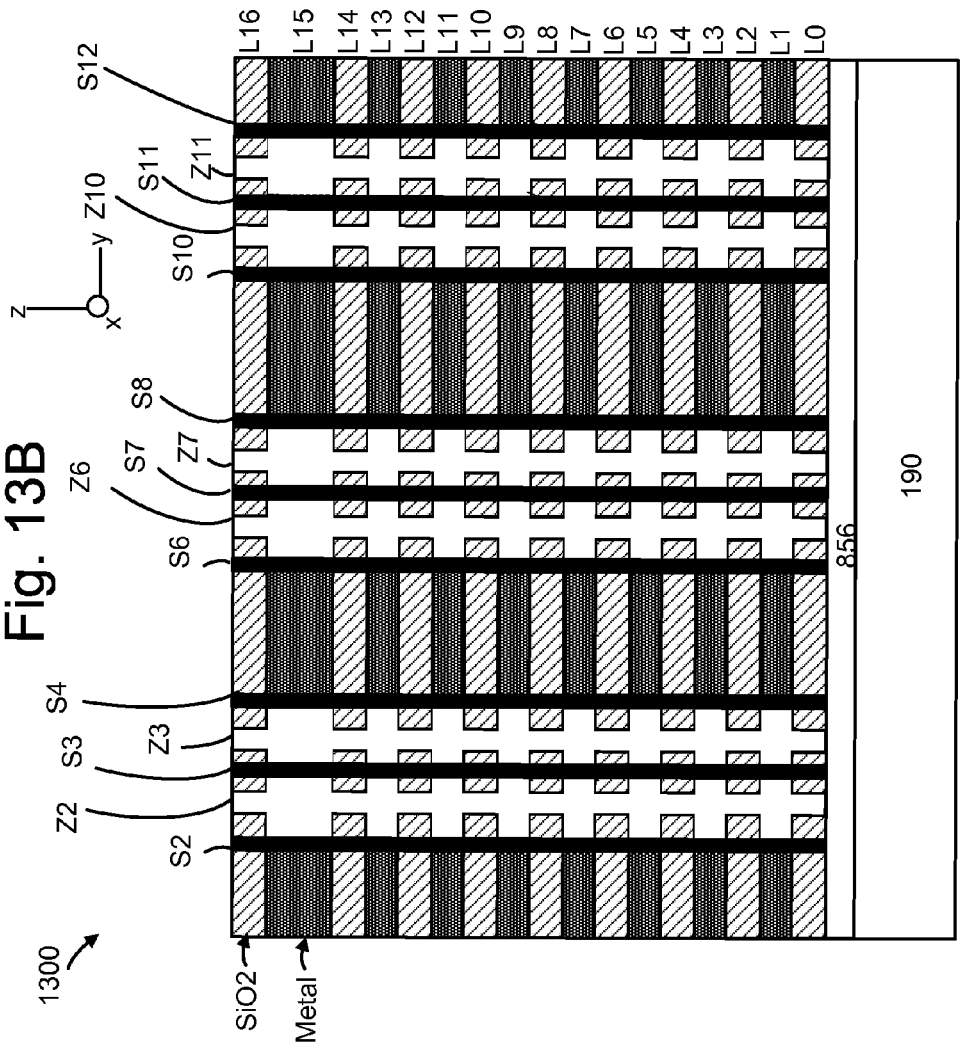
FIGS. 13A-13B depict a layered material 1300 which is obtained from the layered material 1200 after etching to remove metal locally in the WL transistor region.
Figure 13A:
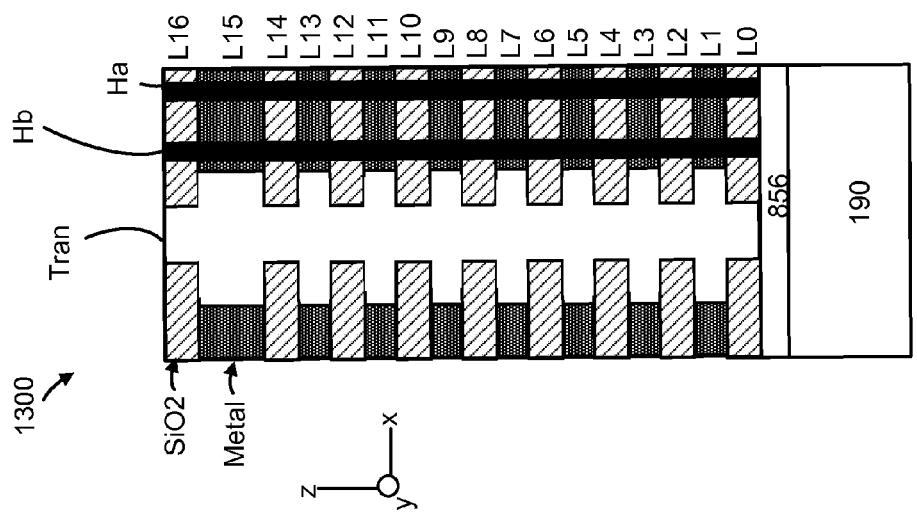

FIGS. 13A and 13B depict results after step 624 for the transistor region, showing some metal removal in the WL select region. FIG. 13A is a cross section in the WL (x) direction along a portion of line B-B' from FIG. 8. FIG. 13B is a cross section of the WL select gate region in the BL(y) direction. Portions of the metal that was at layers L1, L3, L5, L7, L9, L11, and L15 has been removed in the WL select transistor region. Specifically, portions of the metal near the z-holes (and optionally DG-holes) are removed. The metal is still present in the memory array region, as depicted by the metal near memory holes Ha and Hb. Also, some metal is still present in the word line hookup region on the other side of where the WL select transistor is being formed. This is represented by the metal in FIG. 13A on the other side of the hole marked "Tran."

Step 626 includes replacing the removed metal with material for the bodies of the WL select transistors 231. In one embodiment, a wide band gap semiconductor is deposited. In one embodiment, CVD is used. In one embodiment, PVD is used. The wide band gap semiconductor may be an oxide semiconductor, such as a metal oxide semiconductor. The wide band gap semiconductor may include, but is not limited to, InGaZnO, InZnO, HfInZnO, ZrInZnO, or ZnInSnO. An example range of deposition temperatures for InGaZnO is 150-350 Celsius. However, lower or higher temperatures might be used. Optionally, a thermal anneal could be performed.

Step 628 includes cleaning out the memory holes. The memory holes H1 to H12 in the cell area are cleaned out, e.g., by etching. Also, the z-holes are cleaned out, e.g., by etching. The slits can be protected from the etching. Additionally, the drain-side memory holes H1, H3, H5, H7, H9, and H11 are extended up to a bit line BL, the source-side memory holes H2, H4, H6, H8, H10, and H12 are extended up to one or more source select lines, in one embodiment.

Step 630 includes filling in memory holes and z-holes with oxide-nitride-oxide (ONO), polysilicon layer and core filler. Optionally, the DG-holes are filled if they were formed in step 612. The following describes details of one embodiment of filling memory holes and z-holes. In one approach, the memory holes and z-holes are filled in by depositing ONO and polysilicon layers on sidewalls of the columnar memory holes, e.g., using ALD. In one embodiment, layers such as layers 296-300 are formed in the memory holes (see FIG. 5A-5B). A block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300.

These same depositions can serve as the basis for a vertical gate/width TFT. Referring to FIGS. 5E-5F, an oxide can be deposited as layer 296, a nitride such as SiN can be deposited as layer 297, an oxide can be deposited as layer 298, a polysilicon gate can be deposited as layer 299, and a core filler dielectric can be deposited as region 300. Thus, note that the same layers may serve different purposes for the TFT. For example, layer 299 may be used for gate electrodes of the vertical gate/width TFTs, whereas layer 299 may be used for polysilicon bodies of the memory cells. The ONO layers form a dielectric stack, in one embodiment. The stack layers can be more complex, such as where at least one of these layers can be a combination of layers of oxide and nitride.

Note that it is not required that the portions of the TFT 231 that are in the z-holes (and optionally DG-holes) are formed in the same manner (and with same materials) as the memory holes. In one embodiment, the gate electrodes of the TFTs 231 are formed from a different material than is used in the analogous region of the memory holes. As one example, the gate electrodes can be formed from a material having a work function that is higher than the word function of the TFT body. The gate electrodes could be formed from a metal instead of from polysilicon.

Figure 14B:
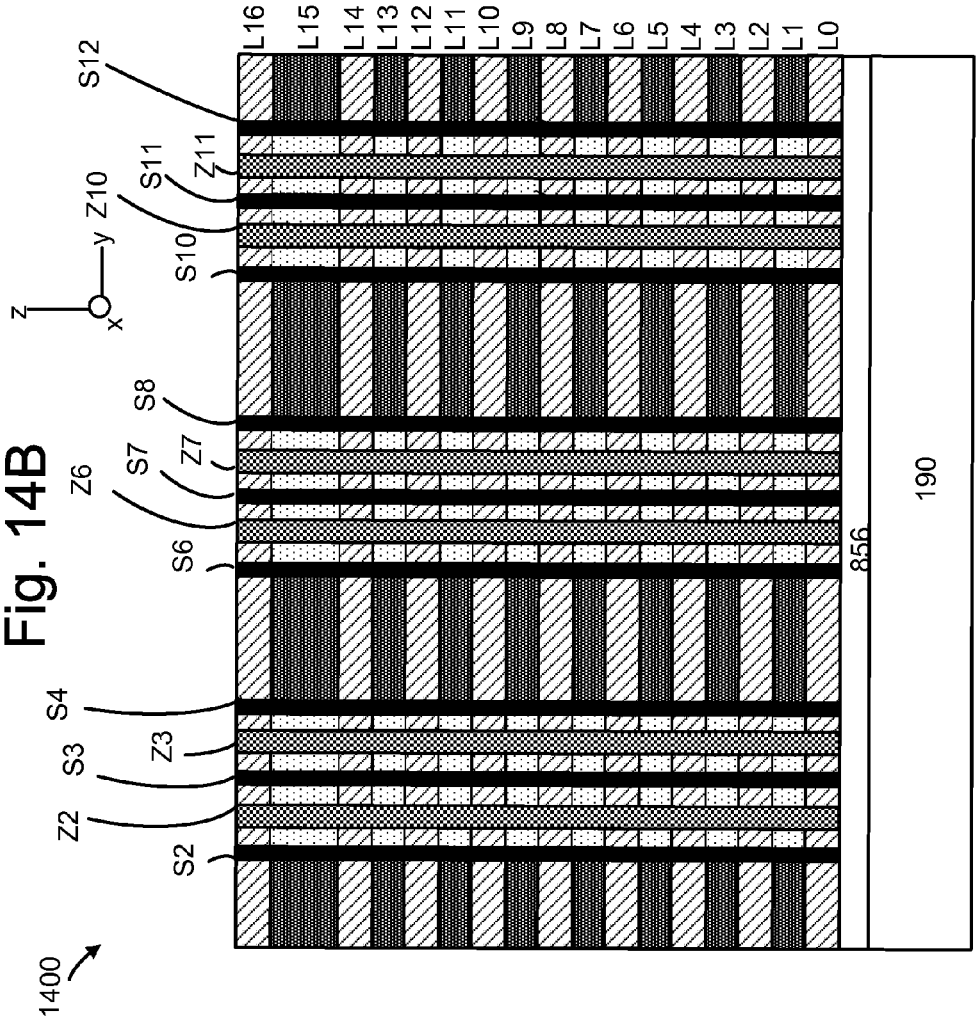
FIGS. 14A-14B depict a layered material 1400 which is obtained from the layered material 1300 after replacing the removed metal in the WL transistor region with TFT body material.
Figure 14A:
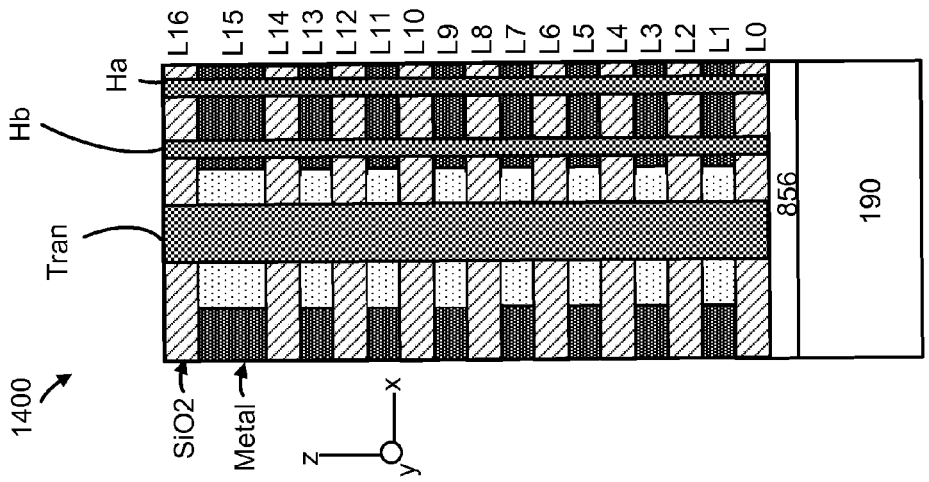

FIGS. 14A and 14B depict results after step 626 for the transistor region. FIG. 14A is a cross section in the WL (x) direction along a portion of line B-B' from FIG. 8. FIG. 14B is a cross section of the WL select gate region in the BL(y) direction. Portions of the metal that was at layers L1, L3, L5, L7, L9, L11, and L15 has been replaced with a wide band gap semiconductor. Thus, the WL select transistor region now includes alternating layers of oxide/wide band gap semiconductor. The memory array region is still alternating layers of oxide/metal. The word line hookup region may be processed in a similar manner as the memory array region, such that it includes alternating layers of oxide/metal. Note that a different insulator than $SiO_2$ could be used.

Step 632 includes providing above-stack metal layers and connecting the interconnect area to the above-stack metal layer by at least one contact structure. Step 632 may include providing connections between z-decoders and WL select gates 229.

Figure 15A:
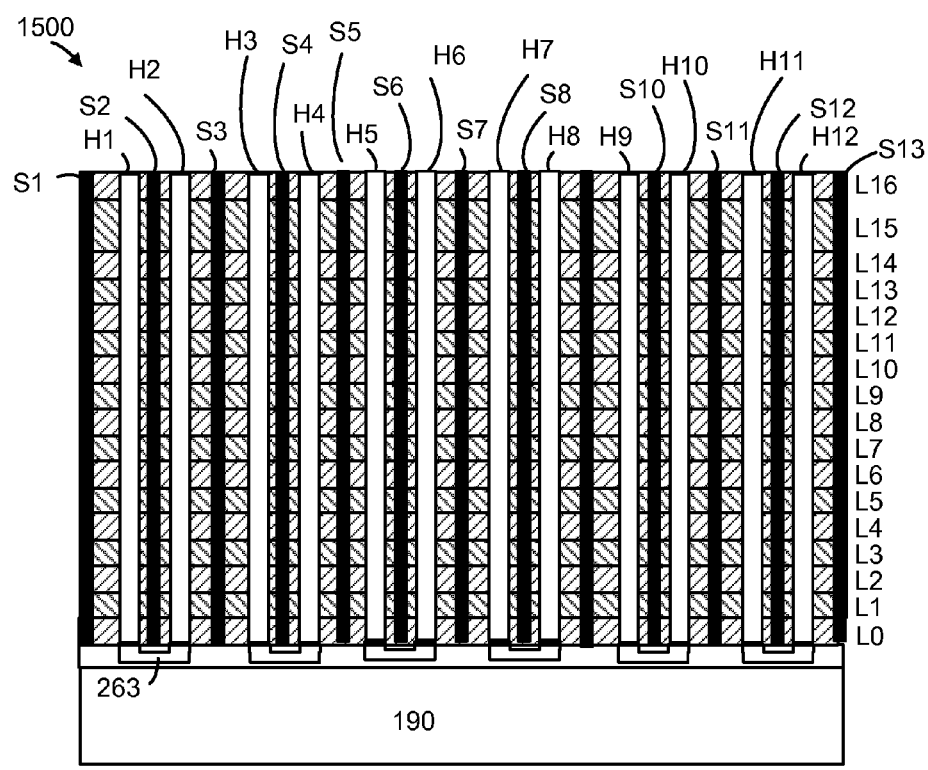
FIG. 15A depicts a layered semiconductor material 1300 which is consistent with a cross-sectional view of the line A-A' of FIG. 8 during the process of FIG. 7.

FIG. 7 depicts a method for fabricating a 3D stacked non-volatile memory device, corresponding to the structures of FIGS. 15A-16C, where a wet etch is performed via memory holes (and z-holes). FIGS. 15A and 16A are cross sections of the memory array region in the BL (y) direction along a portion of line A-A' from FIG. 8. FIGS. 15B and 16B cross sections in the WL (x) direction along a portion of line B-B' from FIG. 8. FIGS. 15C and 16C are cross sections of the WL select gate region in the BL(y) direction.

In this scheme "etch through memory holes and z-holes," slits are formed first and filled in with $SiO_2$ (in one example). Then memory holes and z-holes are etched, and then etch is performed through memory holes and z-holes (and optionally DG-holes). At that time, with silicon nitride removed in cell area and WL select gate region, slits serve as anchors to the remaining silicon oxide structure. Later slits may be etched to remove sacrificial fill material. The steps need not necessarily be performed as discrete steps in the order indicated. For example, the etching steps can be performed concurrently, at least in part. Various modifications can be made. Moreover, other steps which are known from the art of semiconductor fabrication but are not explicitly depicted here may also be performed.

Step 700 includes providing below-stack circuitry and metal layers on substrate. Step 701 includes providing a back gate layer with pipe connections. Step 702 includes providing etch stop layer. Step 706 includes depositing alternating silicon oxide ($SiO_2$)/silicon nitride (SiN) layers. The silicon nitride is a sacrificial layer, which will be replaced by metal to form word lines. The silicon oxide will be used for the insulating layers between the metal word lines. Other insulators could be used instead of silicon oxide. Other sacrificial materials could be used instead of silicon nitride.

Step 708 includes etching slits in the cell region 305 and in the WL select gate region 303 using a common mask. Step 710 includes filling in the slits in the cell area and in the at WL select gate region with insulation.

Figure 15C:
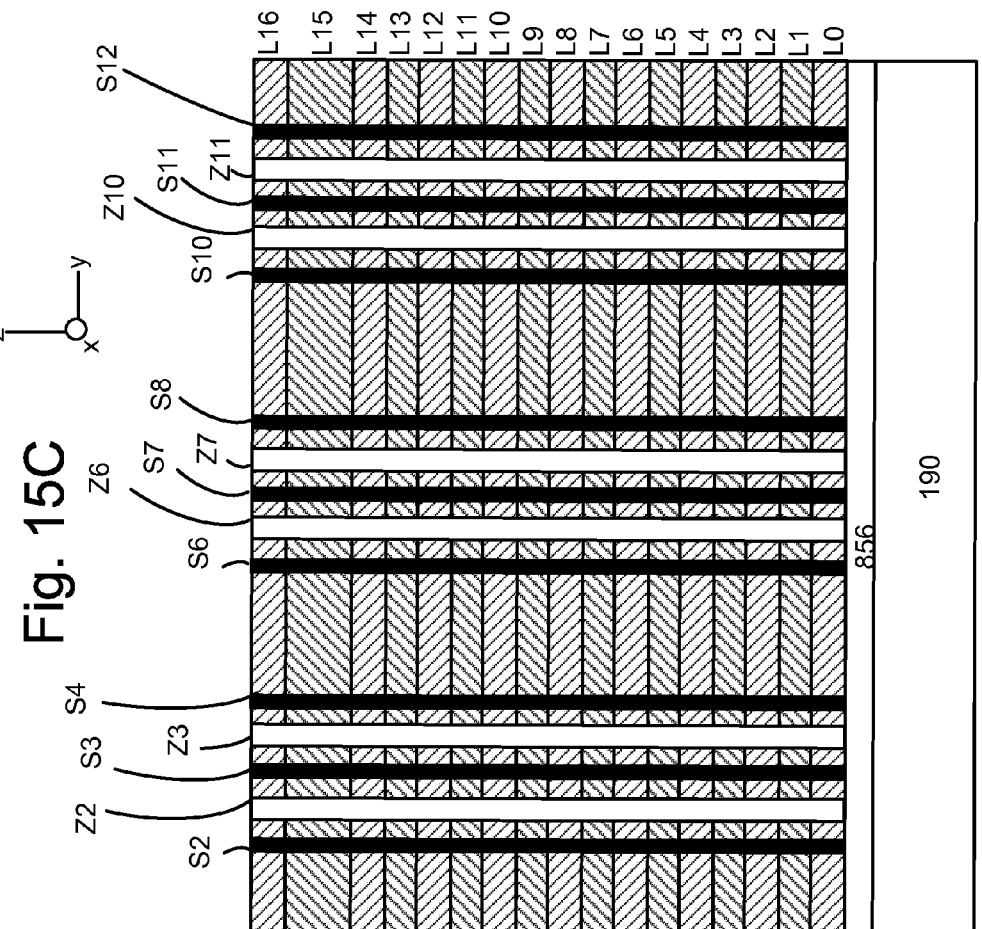
FIG. 15C depicts a cross section along a portion of line C-C' from FIG. 8 during the process of FIG. 7.
Figure 15B:
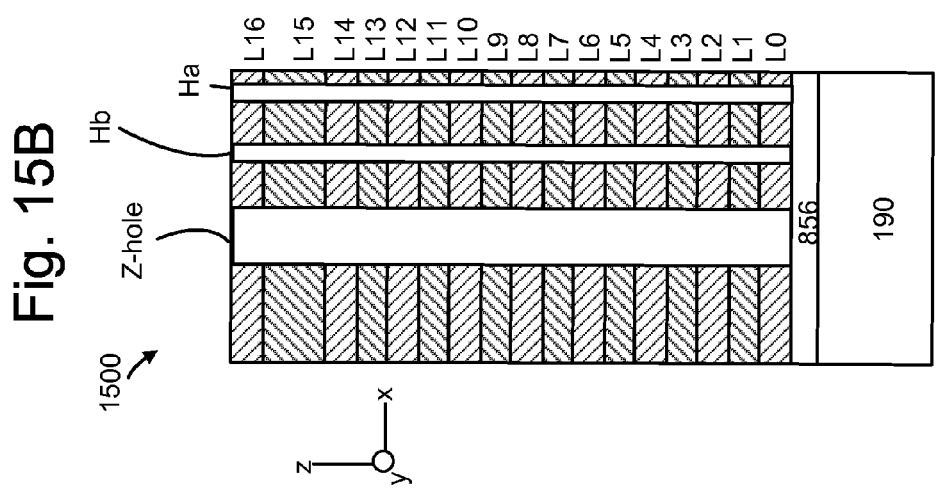
FIG. 15B depicts a cross section along the circled portion of line B-B' from FIG. 8 during the process of FIG. 7.

Step 712 includes etching memory holes in the cell area and z-holes in the WL select gate region, 712. In one embodiment, step 712 includes etching DG-holes. FIGS. 15A-15C depict results after step 712. The alternating layers of oxide/nitride are provided as before as layers L0 to L16 in FIGS. 15A-15C. After the layers of oxide/nitride are deposited (step 706), the slits (steps 708-710), memory holes (step 712) and z-holes (step 712) are fabricated. Reactive ion etching can be used.

FIG. 15A depicts an oxide/nitride stack 1500 which is consistent with a cross-sectional view of the line A-A' of FIG. 8, showing slits (S1-S13) and memory holes (H1-H12) in the cell region 305. The substrate region 190 is repeated. In this example, U-shaped NAND strings are being fabricated. However, straight NAND strings may be fabricated as an alternative. Straight NAND strings may connect to a source at the bottom of the string. No back gate (BG) is necessary since there is no pipe connection needed. With U-shaped NAND, both select gates are on the top, one connected to a bit line, one to a source line, and each made of metal, e.g., D1 and D2, for lower resistance.

FIG. 15B depicts a cross section along the circled portion of line B-B' from FIG. 8. FIG. 15B depicts formation of a z-hole in the WL select region 303 and two memory holes (Ha, Hb) in the memory region 305. In other embodiments, more than one z-hole is formed. In one embodiment, one or more DG-holes are formed.

FIG. 15C depicts a cross section along a portion of line C-C' from FIG. 8. FIG. 15C depicts the opening of z-holes Z2, Z3, Z6, Z7, Z10, and Z11. Slits S2, S3, S4, S6, S7, S8, S10, S11, and S12 are filled in.

Step 714 includes performing a etch via the memory holes in the cell area and via the z-holes the WL select gate region to remove portions of the silicon nitride layers in the cell area and WL select gate region. Optionally, the etch may be performed via the DG-holes if they were formed in step 712.

The etch can involve introducing an etchant via the memory holes of the cell area (and z-holes), which has a higher selectivity for the silicon nitride, removing the silicon nitride layers. The wet etch is not relatively highly selective of the silicon oxide so that the silicon oxide is not substantially removed. As in the case of the etch via the slits, essentially all of the silicon nitride in the cell areas is removed.

In the array area, the memory holes are placed densely. A minimum density of memory holes allows essentially all silicon nitride in the cell areas to be removed when a wet etch is performed via the memory holes. For example, the memory holes can have a width of 55-80 nm, a pitch of about 110-125 nm in the word line or x-direction, and a pitch of about 150-165 nm in the bit line or y-direction. The slits can have a width of about 30-60 nm. These are example ranges of widths and pitches, other ranges could be used. In other areas, such as the word line hook areas at opposing ends of the array, essentially all of the silicon nitride can be removed as well in a wet etch. In those areas, memory holes need not be provided. However, holes referred to as replacement (or inactive) holes may be used to remove silicon nitride. These holes can be arranged with a similar density as in the array.

FIGS. 16A-16C depict a structure 1600 which is obtained from the layered oxide/nitride structure 1500 after etching to remove silicon nitride. FIG. 16A is a cross section of the memory array region in the BL (y) direction along a portion of line A-A' from FIG. 8. FIG. 16B is a cross section in the WL (x) direction along a portion of line B-B' from FIG. 8. FIG. 16C is a cross section of the WL select gate region in the BL(y) direction.

Step 718 includes depositing metal (e.g., one or more layers) in the recesses via the memory holes in the cell area, as well as the z-holes (and optionally DG-holes) in the transistor area. In one embodiment, the metal is tungsten. This forms a metal/oxide stack.

Step 724 includes locally removing metal in the WL select transistor region. This may include using the z-holes (optionally DG-holes) when performing an etch. In one embodiment, a time controlled etch is performed. The etch can involve introducing an etchant via the z-holes (optionally DG-holes), which has a higher selectivity for the metal than the silicon oxide, thereby removing portions of the metal layers which are adjacent to the z-holes (optionally DG-holes) of the WL select transistor region. The wet etch should remove essentially the entire metal layers where the bodies of the TFTs are to be formed in the WL select transistor region. The insulation-filled slits serve as anchors which support the silicon oxide layers when the metal is removed.

Step 726 includes replacing the removed metal with material for the bodies of the WL select transistors 231. In one embodiment, a wide band gap semiconductor is deposited. In one embodiment, CVD is used. In one embodiment, PVD is used. The wide band gap semiconductor may be an oxide semiconductor, such as a metal oxide semiconductor. The wide band gap semiconductor may include, but is not limited to, InGaZnO, InZnO, HfInZnO, ZrInZnO, or ZnInSnO. An example range of deposition temperatures for InGaZnO is 150-350 Celsius. However, lower or higher temperatures might be used. Optionally, a thermal anneal could be performed.

Step 728 includes cleaning out the memory holes. The memory holes H1 to H12 in the cell area are cleaned out, e.g., by etching. Also, the z-holes are cleaned out, e.g., by etching. The slits can be protected from the etching. Additionally, the drain-side memory holes H1, H3, H5, H7, H9, and H11 are extended up to a bit line BL, the source-side memory holes H2, H4, H6, H8, H10, and H12 are extended up to one or more source select lines, in one embodiment.

Step 730 includes filling in memory holes and z-holes with oxide-nitride-oxide (ONO), polysilicon layer and core filler. Optionally, the DG-holes are filled if they were formed in step 712. The following describes details of one embodiment of filling memory holes and z-holes. In one approach, the memory holes and z-holes are filled in by depositing ONO and polysilicon layers on sidewalls of the columnar memory holes, e.g., using ALD. In one embodiment, layers such as layers 296-300 are formed in the memory holes (see FIG. 5A-5B). A block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300.

These same depositions can serve as the bases for a vertical gate/width TFT. Referring to FIGS. 5E-5F, an oxide can be deposited as layer 296, a nitride such as SiN can be deposited as layer 297, an oxide can be deposited as layer 298, a polysilicon gate can be deposited as layer 299, and a core filler dielectric can be deposited as region 300. Thus, note that the same layers may serve different purposes for the TFT. For example, layer 299 may be used for gate electrodes of the vertical gate/width TFTs, whereas layer 299 may be used for polysilicon bodies of the memory cells. The ONO layers form a dielectric stack, in one embodiment. The stack layers can be more complex, such as where at least one of these layers can be a combination of layers of oxide and nitride.

Note that it is not required that the portions of the TFT 231 that are in the z-holes (and optionally DG-holes) are formed in the same manner (and with same materials) as the memory holes. In one embodiment, the gate electrodes of the TFTs 231 are formed from a different material than is used in the analogous region of the memory holes. As one example, the gate electrodes can be formed from a material having a work function that is higher than the word function of the TFT body. The gate electrodes could be formed from a metal instead of from polysilicon.

Step 732 includes providing above-stack metal layers and connect the at least one interconnect area to the above-stack metal layer by at least one contact structure. This may include providing a contact 227 to a word line plate region.

As noted above, in FIGS. 6 and 7, alternating layers of silicon oxide and silicon nitride are first formed. Other techniques can be used involving initial formation of stack with other materials.

Example Operational Parameters

In one embodiment, a TFT select transistor 231 needs to pass programming voltage to the selected WL, e.g., Vpgm~24V. The WL plate can be biased to, for example, 25V by a WL driver, which means the TFT Vd=25V. The TFT gate voltage Vg can be biased to around 25V or higher, e.g., 25-29V. Then, the voltage passed to the selected WL will be around 24V. In this example, it is assumed that the TFT Vt is about 1V.

To pass Vpass voltage during programming (e.g. Vpass=8V) the WL driver can generate about 9V, such that the TFT Vd=9V. The TFT gate voltage can be around 9V or slightly higher (e.g., Vg=9-12V). Then, the voltage passed to the selected WL can be around 8V.

In one embodiment, blocking the programming voltage of 25V that is applied to the WL plate (e.g., TFT drain voltage of 25V) may be achieved with a TFT gate voltage of 0V, resulting in a TFT source voltage of about 0V, which is the selected WL voltage. In one embodiment, blocking the Vpass voltage of 9V that is applied to WL plate (e.g., TFT drain voltage of 9V) may be achieved with a gate voltage of 0V, resulting in a TFT source voltage of about 0V, which will be the selected WL voltage.

In one example for BiCS erase, passing a 0V bias on the source to the drain may be achieved with a gate voltage of 5V. Blocking the 0V bias that is applied to the source may be achieved by applying 0V to the gate. This may result in channel boosting (e.g., the channel may boost to about 12-18V, depending on the voltage on the selected WL to be programmed).

The above operational parameters are examples for the purpose of illustration. Other operational parameters are contemplated. Also, the operational parameters may depend on TFT parameters, as well as depend on electrical conditions of operating memory cell, in other words, memory cell operation requirements. NFET operation is one operational mode. The WL TFT select transistor 231 is not limited to NFET operation.

Embodiments described herein are not limited to U-shaped NAND strings. FIG. 17 depicts an embodiment of a block which includes straight NAND strings. The block includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 18:
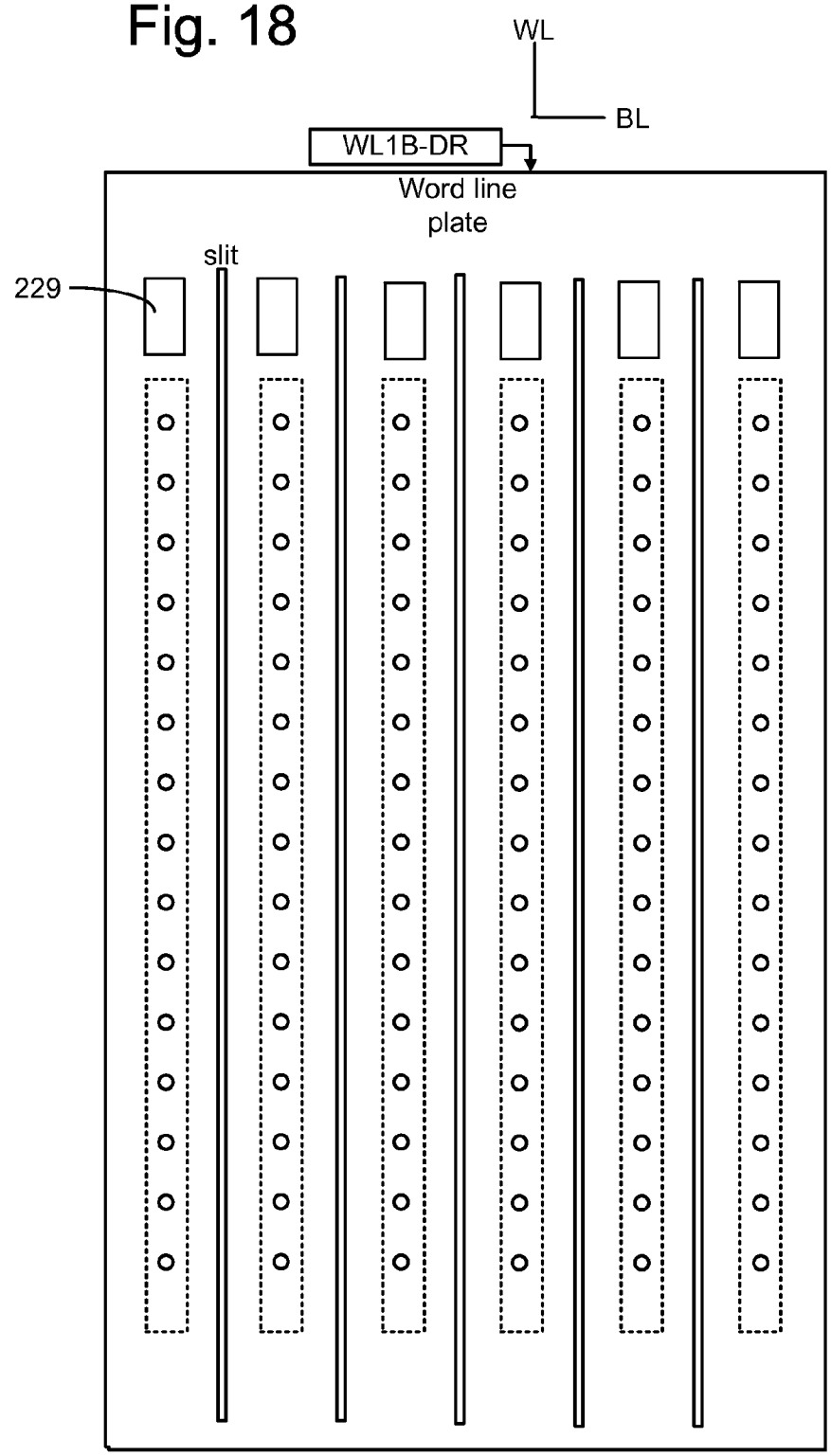
FIG. 18 is a word line plate that is consistent with an embodiment that uses straight NAND strings.

FIG. 18 is a word line plate that is consistent with an embodiment that uses straight NAND strings. Thus, the memory holes in FIG. 18 may be associated with straight NAND strings. There is a single word line driver per plate in this example. There is one set of WL select gates 229 at the end of the plate near the WL driver in one embodiment. In this example, each WL select gate 229 select one word line associated with this word line plate. There are six WL select gates 229 and six word lines in this example. Each WL select gate 229 could include one or more TFTs 231. An individual one of the word line select gate transistors comprises a thin film transistor having a body formed from a wide band gap semiconductor, in one embodiment. The wide band gap semiconductor includes an oxide semiconductor, in one embodiment. There are five slits that separate the word lines. The word lines layer may be formed from a metal, such as tungsten. This slits also provide electrical isolation between the WL select gates 229. The plate could have more or fewer word lines. Note that the capacitive load is substantially reduced because the WL plate driver only drives the selected word line, as opposed to all word lines on the plate. As an alternative, a single WL select gate 229 might select two or more word lines. Other configurations for the WL plate are possible.

Figure 19:
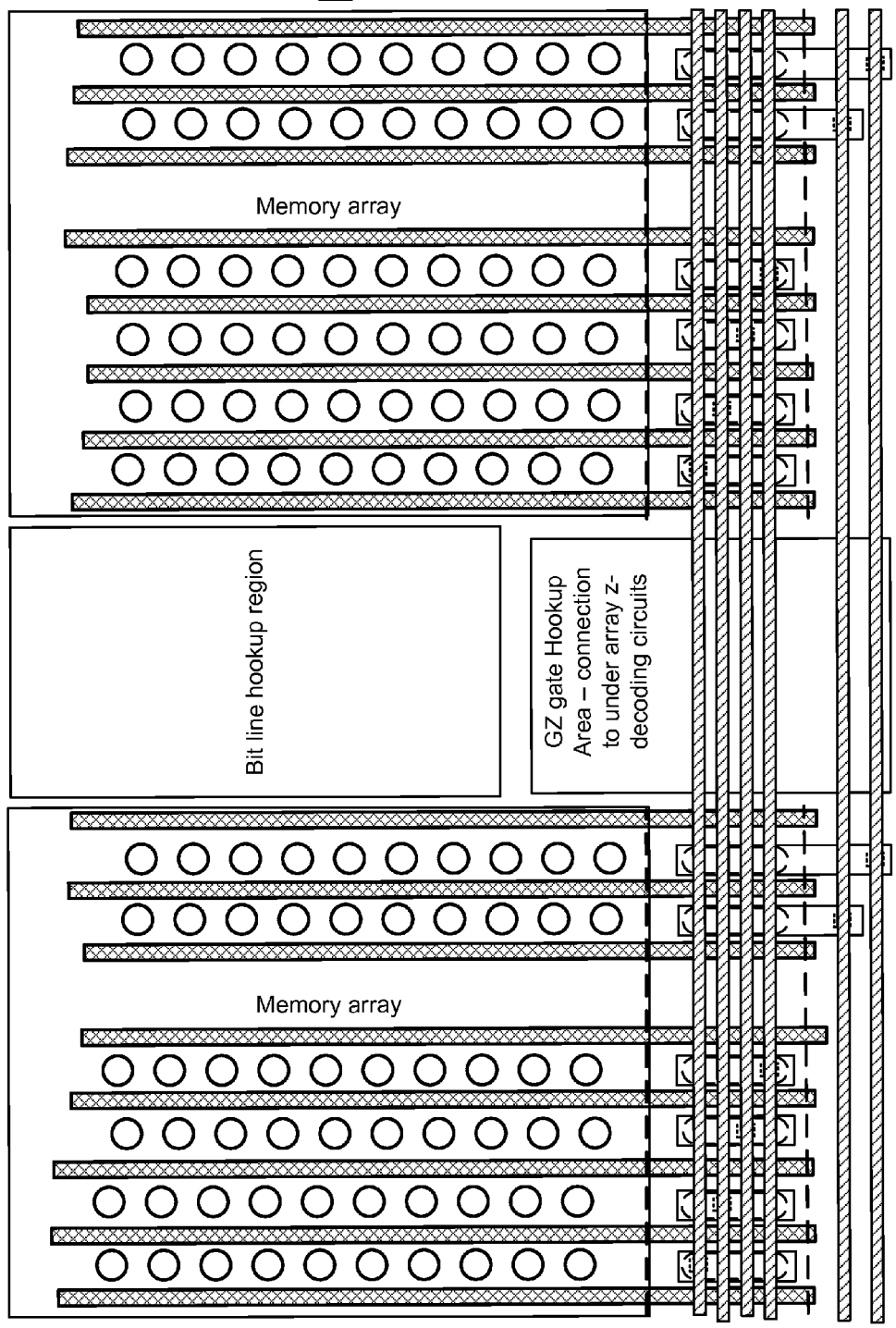
FIG. 19 shows a diagram of one embodiment of a location for connections of the WL select gates to z-decoders.

FIG. 19 shows a diagram of one embodiment of a location for connections of the GZ selection lines 517 to z-decoders. A portion of the memory array is depicted with slits and memory holes. In one embodiment, there is a bit line hookup region in the memory array. Referring back to FIG. 2E, the bit line hookup region could run the length of the memory array as in lines 115a, 115b, 117a, 117b. As noted, those regions allow connections to the S/A, in one embodiment. Note that lines 115a, 115b, 117a, 117b may be extended outside of the memory array into the WL select gate region 303. This extension is represented in FIG. 19 as the WL select gate hookup area, which allows connections of the select lines 517 to z-decoding circuits (which may be under the memory array). Note that the z-decoding circuits may thus be under the stack of alternating polysilicon and insulator layers. Note that FIG. 19 shows select lines 517, and other elements 511, 513, 515 that are depicted in and discussed with respect to FIG. 5H1. Note that this embodiment does not require blocks to be made larger to accommodate the WL select gates and associated connections. Also note that the z-decoding circuits could be placed outside of the memory array.

Note that blocks in a 3D non-volatile storage device (such as BiCS) may be quite large. For example, a 24 layer BiCS could have 9 MB per block, a 32 layer BiCS could have 16 MB per block. This has the possibility of having erase issues. However, embodiments with TFT decoding solve issues of large block size, and erase issues. In one embodiment, erase can be performed at a sub-block level. This may be a small fraction of the physical block. For example, a sub-block of 512 KB may be erased instead of 16 MB. As one example of this, for 32 layers, a sub-block erase can be half of one NAND string. In one embodiment, individual WL erase is performed. Even a smaller erase may be possible.

Figure 20:
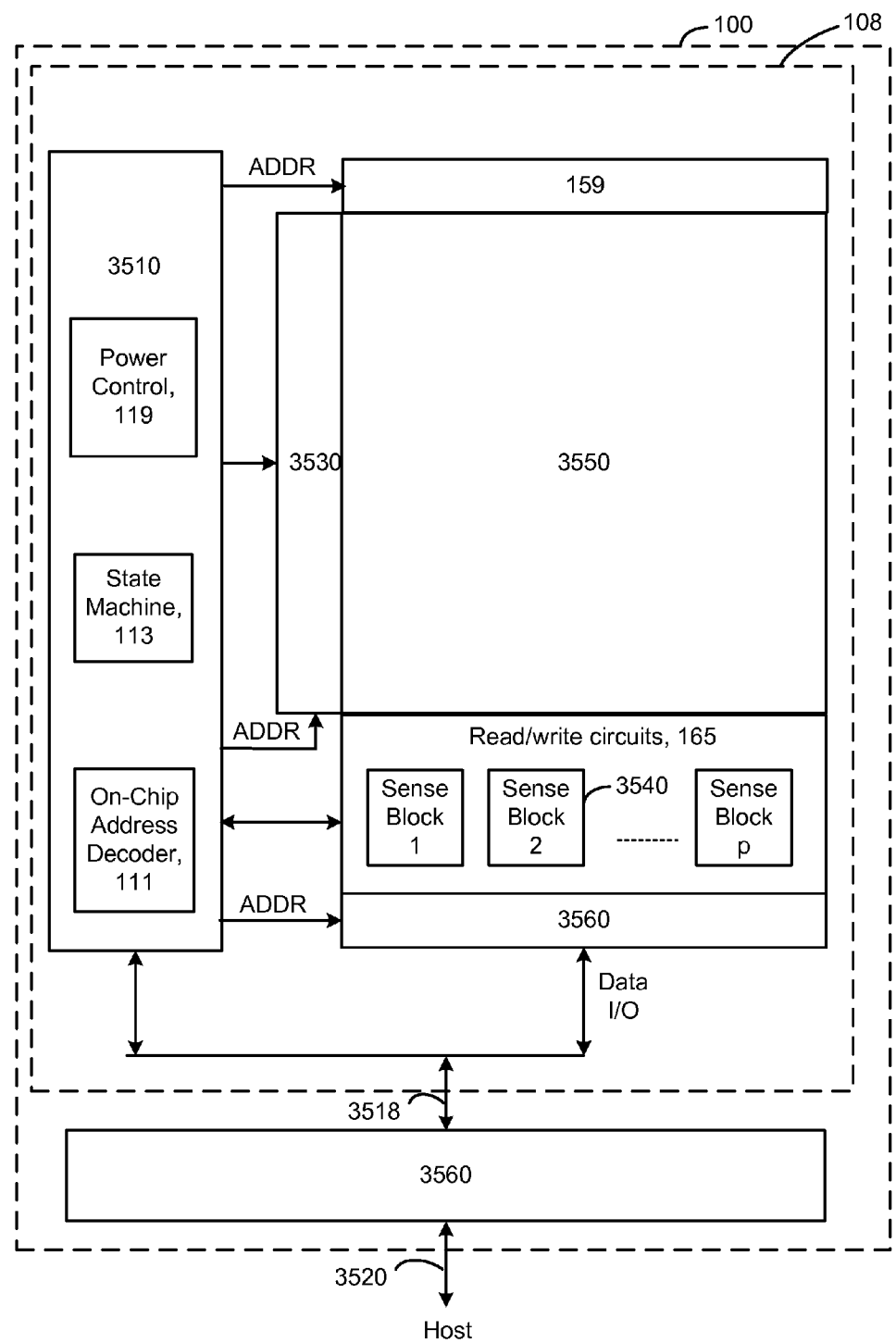
FIG. 20 is a functional block diagram of one embodiment of a 3D stacked non-volatile memory device having 3D decoding.

FIG. 20 is a functional block diagram of one embodiment of a 3D stacked non-volatile memory device having 3D decoding. The memory device 100 may include one or more memory die 108. The memory die 108 includes a 3D (three-dimensional) memory array of storage elements 3550, control circuitry 3510, and read/write circuits 165. The memory array 3550 is addressable by word line plates via a row (x) decoder 3530, by bit lines via a column (y) decoder 3560, and by sub-blocks via a WL select gate (z) decoder 159. The read/write circuits 165 include multiple sense blocks 3540 (sensing circuitry) and allow a page or other unit of storage elements to be read or programmed in parallel. Typically a controller 3560 is included in the same memory device 100 (e.g., a removable storage card) as the one or more memory die 108. Commands and data are transferred between the host and controller 3560 via lines 3520 and between the controller and the one or more memory die 108 via lines 3518.

The control circuitry 3510 cooperates with the read/write circuits 165 to perform memory operations on the memory array 3550, and includes a state machine 113, an on-chip address decoder 111, and a power control module 119. The state machine 113 provides chip-level control of memory operations. The on-chip address decoder 111 provides an address interface between that used by the host or a memory controller to the hardware address used by the decoders 3530, 3560, and 159. The power control module 119 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 140 can include bit line drivers, in one approach.

In some implementations, some of the components can be combined. In various designs, one or more of the components (alone or in combination), other than memory array 3550, can be thought of as at least one control circuit. For example, at least one control circuit may include any one of, or a combination of, control circuitry 110, state machine 113, decoders 3530/3560/159, power control 119, sense blocks 3540, read/write circuits 165, and controller 3550, and so forth.

In another embodiment, a non-volatile memory system uses dual x/y/z decoders and read/write circuits. Access to the memory array 3550 by the various peripheral circuits may be implemented in a symmetric fashion, on opposite sides of the array, so that the densities of access lines and circuitry on each side are reduced by half. Thus, the row decoder may split into two row decoders, the column decoder into two column decoders, and the sub-block decoder into two sub-block decoders. Similarly, the read/write circuits may be split into read/write circuits connecting to bit lines from the bottom and read/write circuits connecting to bit lines from the top of the array 150. In this way, the density of the read/write modules is reduced by one half. Also, more than two decoders of a given type may be used.

Note that the locations of the various decoders in FIG. 20 is not necessarily representative of actual physical locations relative to the memory array 3550.

Other types of non-volatile memory in addition to NAND flash memory can also be used with embodiments disclosed herein.

One embodiment disclosed herein includes a 3D stacked non-volatile storage device, comprising: a plurality of conductive word lines layers; a plurality of insulator layers alternating with the conductive word line layers in a stack; a plurality of non-volatile storage element strings, each non-volatile storage element string comprises a plurality of non-volatile storage elements, each of the non-volatile storage elements is associated with one of the plurality of word line layers; and a plurality of word line select gate transistors, an individual one of the word line select gate transistors comprising a thin film transistor having a body formed from a wide band gap semiconductor. The non-volatile storage element strings may be NAND strings. In one embodiment, the non-volatile storage element strings are U-shaped strings. In one embodiment, the non-volatile storage element strings are straight strings.

One embodiment disclosed herein includes a method of forming a 3D stacked non-volatile storage device. The method comprises forming a plurality of conductive word lines layers; forming a plurality of insulator layers alternating with the conductive word line layers in a stack; forming a plurality of non-volatile storage element strings, each non-volatile storage element string comprises a plurality of non-volatile storage elements, each of the non-volatile storage elements is associated with one of the plurality of word line layers; and forming a plurality of word line select gate transistors, an individual one of the word line select gate transistors comprising a thin film transistor having a body formed from a wide band gap semiconductor. The non-volatile storage element strings may be NAND strings. In one embodiment, the non-volatile storage element strings are U-shaped strings. In one embodiment, the non-volatile storage element strings are straight strings.

One embodiment disclosed herein includes a method of forming a 3D stacked non-volatile storage device. The method comprises forming a plurality of layers of metal to serve as word lines; forming a plurality of insulator layers alternating with the layers of metal in a stack; removing portions of the metal in regions where bodies of word line select transistors are to be formed; replacing the removed metal with a wide energy band gap semiconductor in regions where the bodies of the word line select transistors are being formed; forming a gate dielectric region for the word line select transistors inside of the wide energy band gap semiconductor that serves as the bodies of the word line select transistors; and forming a gate electrode region for the word line select transistors inside of the gate dielectric region.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A 3D stacked non-volatile storage device, comprising:
   a plurality of conductive word lines layers;
   a plurality of insulator layers alternating with the conductive word line layers in a stack;
   a plurality of non-volatile storage element strings, each non-volatile storage element string comprises a plurality of non-volatile storage elements, wherein each of the non-volatile storage elements is associated with one of the plurality of conductive word line layers; and
   a plurality of word line select gate transistors, wherein each of the word line select gate transistors resides in one of the conductive word lines layers, an individual one of the word line select gate transistors comprising a thin film transistor having a body formed from a wide band gap semiconductor having an energy band gap greater than 1.1 eV.

2. The 3D stacked non-volatile storage device of claim 1, wherein the wide band gap semiconductor includes an oxide semiconductor.

3. The 3D stacked non-volatile storage device of claim 1, wherein the plurality of conductive word lines layers are a metal, the metal is in contact with the wide band gap semiconductor.

4. The 3D stacked non-volatile storage device of claim 1, wherein a doping level in the wide band gap semiconductor is relatively uniform.

5. The 3D stacked non-volatile storage device of claim 1, wherein the plurality of conductive word lines layers are tungsten (W).

6. The 3D stacked non-volatile storage device of claim 1, wherein the thin film transistor comprises a drain and a source each comprising the wide band gap semiconductor.

7. The 3D stacked non-volatile storage device of claim 1, wherein the plurality of conductive word lines layers are a metal, a given thin film transistor comprises a drain and a source comprising a portion of the metal of a word line layer that is adjacent to the wide band gap semiconductor body of the given thin film transistor.

8. The 3D stacked non-volatile storage device of claim 7, wherein the drain and the source comprise both a portion of the metal of the word line layer that is adjacent to the wide band gap semiconductor body and the wide band gap semiconductor body.

9. The 3D stacked non-volatile storage device of claim 1, wherein the plurality of non-volatile storage element strings are NAND strings.

10. A method of forming a 3D stacked non-volatile storage device, the method comprising:

forming a plurality of conductive word lines layers;

forming a plurality of insulator layers alternating with the conductive word line layers in a stack;

forming a plurality of non-volatile storage element strings, each non-volatile storage element string comprises a plurality of non-volatile storage elements, wherein each of the non-volatile storage elements is associated with one of the plurality of conductive word line layers; and forming a plurality of word line select gate transistors, wherein each of the word line select gate transistors is formed in one of the conductive word lines layers, an individual one of the word line select gate transistors comprising a thin film transistor having a body formed from a wide band gap semiconductor having an energy band gap greater than 1.1 eV.

11. The method of claim 10, wherein the forming a plurality of conductive word lines layers comprises forming the plurality of conductive word lines layers from a metal.

12. The method of claim 10, wherein the forming a plurality of word line select gate transistors further comprises:
doping the wide band gap semiconductor to form a drain and a source for the thin film transistor.

13. The method of claim 12, further comprising:
performing an $N_2O$ plasma treatment of the body.

14. The method of claim 10, wherein the forming a plurality of word line select gate transistors from a wide band gap semiconductor includes forming the body from a metal oxide semiconductor.

15. The method of claim 10, wherein the forming the thin film transistor further comprises:
forming a gate electrode;
forming a gate dielectric surrounding to the gate electrode, an interface between the gate electrode and the gate dielectric extending vertically with respect to the conductive word lines layers; and
forming the wide band gap semiconductor body surrounding the gate dielectric, an interface between the gate dielectric and the wide band gap semiconductor body extending vertically with respect to the word lines layers.

16. The method of claim 15, wherein forming the gate electrode comprises forming the gate electrode from a material that has a work function that is greater than a work function of the wide band gap semiconductor.

17. The method of claim 10, wherein forming the plurality of non-volatile storage element strings includes forming NAND strings.

18. A 3D stacked non-volatile storage device, comprising:
a plurality of conductive word lines layers;
a plurality of insulator layers alternating with the conductive word line layers in a stack;
a plurality of non-volatile storage element strings, wherein each non-volatile storage element string comprises a plurality of non-volatile storage elements, each of the non-volatile storage elements is associated with one of the plurality of conductive word line layers; and
a plurality of word line select gate transistors, an individual one of the word line select gate transistors comprising a thin film transistor that comprises:
a gate electrode;
a body formed from a wide band gap semiconductor having an energy band gap greater than 1.1 eV; and
a gate dielectric surrounding the gate electrode, an interface between the gate electrode and the gate dielectric extending vertically with respect to the conductive word lines layers, the wide band gap semiconductor body surrounding to the gate dielectric, an interface between the gate dielectric and the wide band gap semiconductor body extending vertically with respect to the conductive word lines layers.

19. The 3D stacked non-volatile storage device of claim 18, wherein the gate electrode has a work function that is greater than a work function of the wide band gap semiconductor.

20. The 3D stacked non-volatile storage device of claim 18, wherein each of the word line select gate transistors resides in one of the conductive word lines layers.

21. The 3D stacked non-volatile storage device of claim 18, wherein the plurality of non-volatile storage element strings are NAND strings.

* * * * *